US012735632B2

(12) United States Patent
Suzaki et al.

(10) Patent No.: US 12,735,632 B2
(45) Date of Patent: Sep. 15, 2026

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Yuji Suzaki, Yokohama (JP); Hirokazu Kuwabara, Yokohama (JP); Keigo Hoshi, Yokohama (JP); Ryuhei Furue, Yokohama (JP); Tetsuji Hayano, Yokohama (JP); Yuuki Miyazaki, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 954 days.

(21) Appl. No.: 17/459,393

(22) Filed: Aug. 27, 2021

(65) Prior Publication Data

US 2022/0223790 A1 Jul. 14, 2022

(30) Foreign Application Priority Data

Dec. 30, 2020 (KR) ........................ 10-2020-0187695

(51) Int. Cl.
*C09K 11/06* (2006.01)
*C07F 5/02* (2006.01)
(Continued)

(52) U.S. Cl.
CPC .............. *C09K 11/06* (2013.01); *C07F 5/027* (2013.01); *H10K 85/658* (2023.02);
(Continued)

(58) Field of Classification Search
None
See application file for complete search history.

(56) References Cited

U.S. PATENT DOCUMENTS 10,374,166 B2 8/2019 Hatakeyama et al.
2009/0322211 A1* 12/2009 Takahashi .................... 313/504
(Continued)

FOREIGN PATENT DOCUMENTS

CN 109411634 12/2019
JP 6526793 6/2019
(Continued)

OTHER PUBLICATIONS

English translation of KR 2020/0043923 and the original KR 2020/0043923, Yoon,Jung Min, Apr. 28, 2020 (Year: 2020).*
(Continued)

*Primary Examiner* — Seokmin Jeon
(74) *Attorney, Agent, or Firm* — Lerner David LLP

(57) ABSTRACT

Provided is an organic electroluminescence device including a first electrode, a hole transport region disposed on the first electrode, an emission layer disposed on the hole transport region, an electron transport region disposed on the emission layer, and a second electrode disposed on the electron
(Continued)

transport region. The emission layer includes a polycyclic compound represented by Formula 1, and thus the organic electroluminescence device exhibits high luminous efficiency.

[Formula 1]

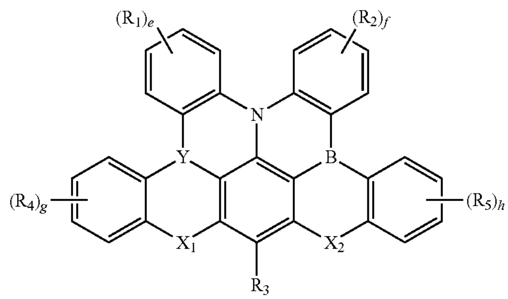

7 Claims, 6 Drawing Sheets

(51) Int. Cl.
*H10K 50/11* (2023.01)
*H10K 59/80* (2023.01)
*H10K 85/60* (2023.01)

(52) U.S. Cl.
CPC ...... *C09K 2211/1018* (2013.01); *H10K 50/11* (2023.02); *H10K 59/875* (2023.02)

(56) References Cited

U.S. PATENT DOCUMENTS

2011/0309739 A1* 12/2011 Song ............................ 313/504
2018/0301629 A1 10/2018 Hatakeyama et al.
2019/0207112 A1 7/2019 Hatakeyama et al.
2020/0058885 A1 2/2020 Hong et al.
2020/0203652 A1 6/2020 Duan et al.
2020/0207787 A1* 7/2020 Hatakeyama ............. C07F 5/02
2021/0277026 A1* 9/2021 Geum ..................... C07F 5/027
2022/0006012 A1* 1/2022 Hatakeyama ......... H01L 51/008

FOREIGN PATENT DOCUMENTS

JP 6703149 6/2020
KR 10-2053324 12/2019
KR 20200011383 A 2/2020
KR 20200081269 A 7/2020
KR 20200090158 A 7/2020
WO 2015/102118 7/2015
WO 2016/152544 9/2016
WO 2017/188111 11/2017
WO 2018/020366 2/2018
WO 2019/198698 10/2019

OTHER PUBLICATIONS

Kohei Matsui et al., "One-Shot Multiple Borylation toward BN-Doped Nanographenes", Journal of the American Chemical Society, 2018, p. 1195-1198, vol. 140.

In Seob Park et al., "High-Performance Dibenzoheteraborin-Based Thermally Activated Delayed Fluorescence Emitters: Molecular Architectonics for Concurrently Achieving Narrowband Emission and Efficient Triplet-Singlet Spin Conversion", Advanced Functional Materials, Jun. 25, 2018, pp. 1-12, vol. 28, 1802031.

Tadashi Nozaki et al., "Synthesis of Mononitro-, Monoamino- and Monohalo-p-terphenyls, and their Solubility and Specific Gravity", Nitro-, Amino- and Halo-p-terphenyls, Nov. 1962, pp. 1783-1787, vol. 35, No. 11.

Joan Simo Padial et al., "Stabilization of 2,6-Diarylanilinum Cation by Through-Space Cation-π Interactions", The Journal of Organic Chemistry, Aug. 24, 2017, pp. 9418-9424, vol. 82.

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION(S)

This application claims priority to and benefits of Korean Patent Application No. 10-2020-0187695 under 35 U.S.C. § 119, filed on Dec. 30, 2020 in the Korean Intellectual Property Office, the entire contents of which are incorporated herein by reference.

BACKGROUND

1. Technical Field

The disclosure relates to an organic electroluminescence device and to a polycyclic compound for an organic electroluminescence device.

2. Description of the Related Art

Active development continues for organic electroluminescence displays as image display apparatuses. In contrast to liquid crystal displays, etc., organic electroluminescence displays are so-called self-luminescent display apparatuses in which holes and electrons respectively injected from a first electrode and a second electrode recombine in an emission layer, so that a luminescent material including an organic compound in the emission layer emits light to implement display.

In the application of an organic electroluminescence device to an image display apparatus, there is a demand for an organic electroluminescence device having a low driving voltage, high luminous efficiency, and a long service life, and continuous development is required on materials for an organic electroluminescence device which are capable of stably achieving such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a highly efficient organic electroluminescence device and a polycyclic compound included in an emission layer of the organic electroluminescence device.

An embodiment provides a polycyclic compound which may be represented by Formula 1 below.

[Formula 1]

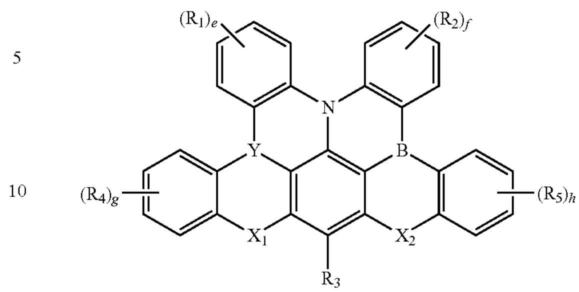

In Formula 1 above, Y may be B, N, or P, $R_1$ to $R_5$ may each independently be a hydrogen atom, a deuterium atom, a halogen atom, a nitro group, a cyano group, a substituted or unsubstituted amine group, a substituted or unsubstituted thio group, a substituted or unsubstituted silyl group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, e to h may each independently be an integer from 0 to 4, $X_1$ and $X_2$ may each independently be O, S, $C(R_7)(R_8)$, $Si(R_9)(R_{10})$, C═O, C═S, $P(R_{11})$, $N(R_{12})$, or a group represented by Formula 2 below, and $R_7$ to $R_{12}$ may each independently be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and at least one of $X_1$ and $X_2$ may be a group represented by Formula 2 below.

[Formula 2]

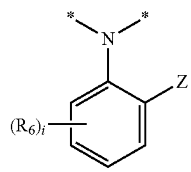

In Formula 2 above, Z may be a substituted or unsubstituted aryl group having 6 to 30 ring-forming carbon atoms, a substituted or unsubstituted heteroaryl group having 2 to 30 ring-forming carbon atoms, a substituted or unsubstituted triarylsilyl group, a substituted or unsubstituted diarylamine group, a substituted thio group, a substituted oxy group, a fluorine group, or a fluorine-substituted alkyl group having 1 to 20 carbon atoms, $R_6$ may be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, i may be an integer from 0 to 4, and ——* represents a binding site to a neighboring atom, and when Z contains fluorine, the remainder of $X_1$ and $X_2$ in Formula 1 that is not represented by Formula 2, is S.

In an embodiment, the group represented by Formula 2 above may be represented by Formula 3-1 or Formula 3-2 below.

[Formula 3-1]

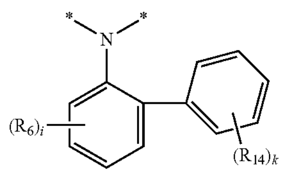

[Formula 3-2]

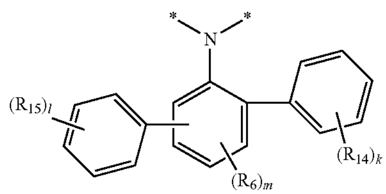

In Formulas 3-1 and 3-2 above, $R_{14}$ and $R_{15}$ may each independently be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, k and l may each independently be an integer from 0 to 5, m may be an integer from 0 to 3, and $R_6$, i, and ——* may be the same as defined in connection with Formula 2.

In an embodiment, the group represented by Formula 2 above may be represented by Formula 3-3 or Formula 3-4 below.

[Formula 3-3]

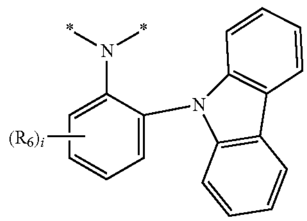

[Formula 3-4]

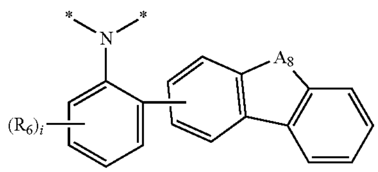

In Formulas 3-3 and 3-4 above, $A_8$ may be O, S, or $N(R_{20})$, $R_{20}$ may be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $R_6$, i, and ——* may be the same as defined in connection with Formula 2.

In an embodiment, the group represented by Formula 2 above may be represented by Formula 3-5 or Formula 3-6 below.

[Formula 3-5]

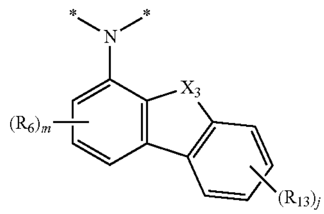

[Formula 3-6]

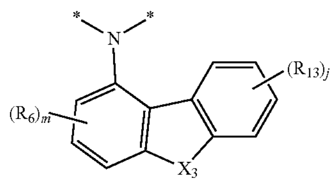

In Formulas 3-5 and 3-6 above, $X_3$ may be O, S, or $N(R_{21})$, $R_{21}$ may be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{13}$ may be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, j may be an integer from 0 to 4, m may be an integer from 0 to 3, and $R_6$ and ——* may be the same as defined in connection with Formula 2.

In an embodiment, the group represented by Formula 2 above may be represented by any one of Formulas 3-7 to 3-10 below.

[Formula 3-7]

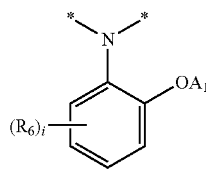

[Formula 3-8]

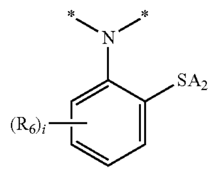

[Formula 3-9]

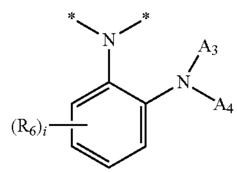

-continued

[Formula 3-10]

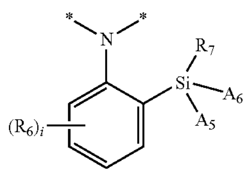

[Formula 3-11]

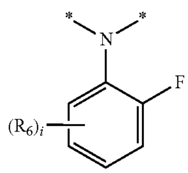

[Formula 3-12]

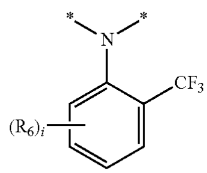

In Formulas 3-7 and 3-12 above, $A_1$ to $A_7$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $R_6$, i, and  may be the same as defined in connection with Formula 2.

In an embodiment, Formula 1 above may be represented by any one of Formulas 4 to 7 below.

[Formula 4]

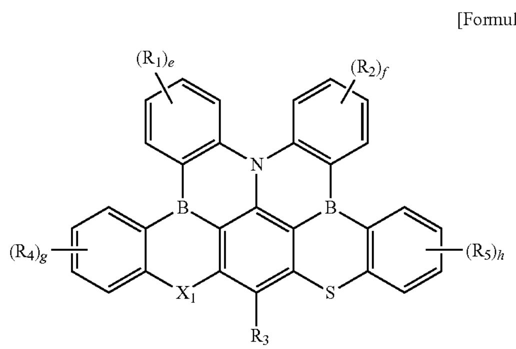

[Formula 5]

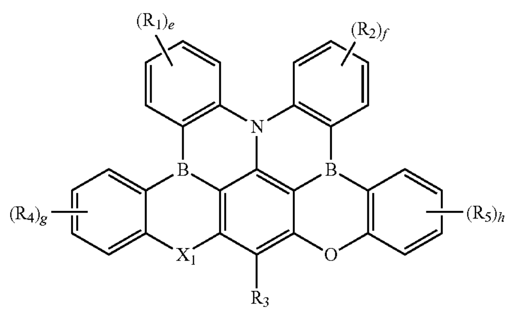

-continued

[Formula 6]

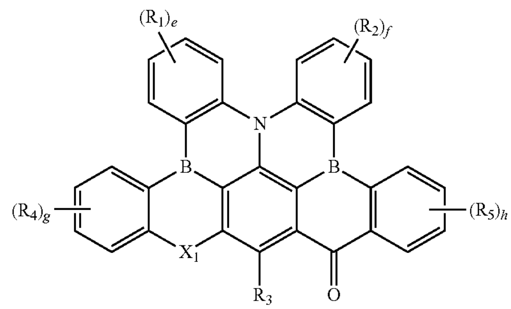

[Formula 7]

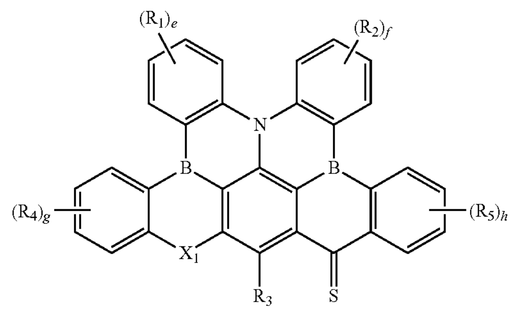

In Formulas 4 to 7 above, $X_1$ may be a group represented by Formula 2 above, and $R_1$ to $R_5$, and e to h may be the same as defined in connection with Formula 1.

In an embodiment, Formula 1 above may be represented by Formula 8 or Formula 9 below.

[Formula 8]

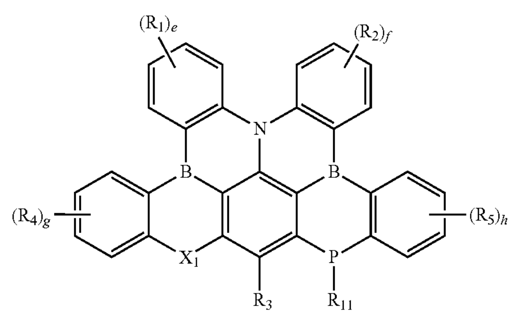

[Formula 9]

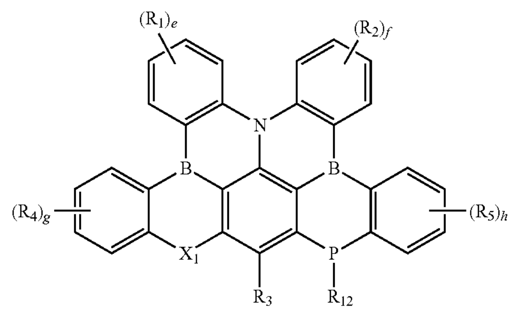

In Formulas 8 and 9 above, $X_1$ may be a group represented by Formula 2 above, $R_{11}$ and $R_{12}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $R_1$ to $R_5$, and e to h may be the same as defined in connection with Formula 1.

In an embodiment, Formula 1 above may be represented by Formula 10 or Formula 11 below.

[Formula 10]

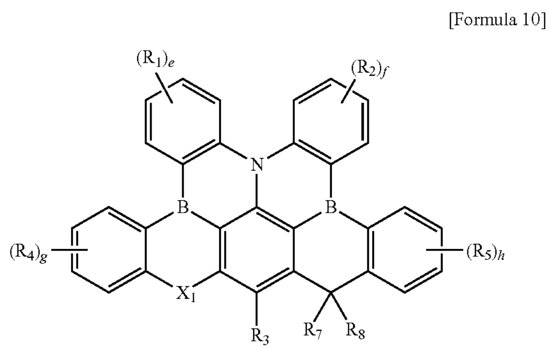

[Formula 11]

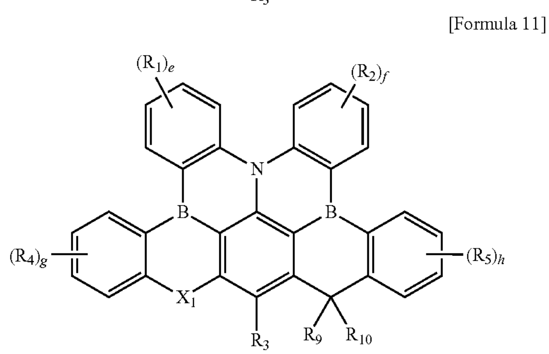

In Formulas 10 and 11 above, $X_1$ may be a group represented by Formula 2 above, $R_7$ to $R_{10}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $R_1$ to $R_5$, and e to h may be the same as defined in connection with Formula 1.

In an embodiment, Formula 1 above may be represented by Formula 12 below.

[Formula 12]

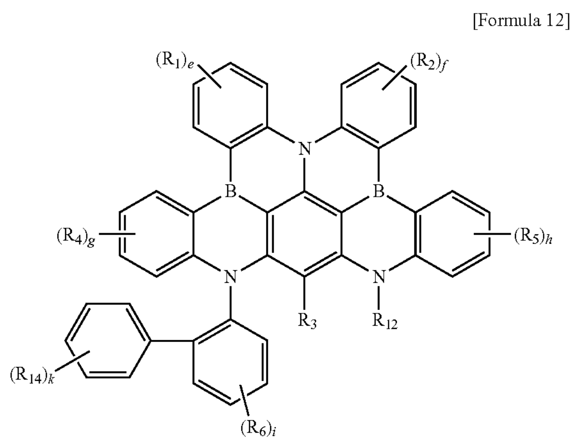

In Formula 12 above, $R_{12}$ may be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{14}$ may be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, k may be an integer from 0 to 5, and $R_1$ to $R_6$, and e to i may be the same as defined in connection with Formulas 1 and 2.

In an embodiment, the polycyclic compound represented by Formula 1 above may be at least one selected from Compound Groups 1 and 2.

In an embodiment, an organic electroluminescence device may include a first electrode, a hole transport region disposed on the first electrode, an emission layer disposed on the hole transport region, an electron transport region disposed on the emission layer, and a second electrode disposed on the electron transport region, wherein the emission layer may include a polycyclic compound represented by Formula 1.

In an embodiment, the emission layer may emit delayed fluorescence.

In an embodiment, the emission layer may be a delayed fluorescence emission layer including a first compound and a second compound, and the first compound may include a polycyclic compound according to an embodiment.

In an embodiment, the organic electroluminescence device may further include a capping layer disposed on the second electrode, wherein the capping layer may have a refractive index equal to or greater than about 1.6.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
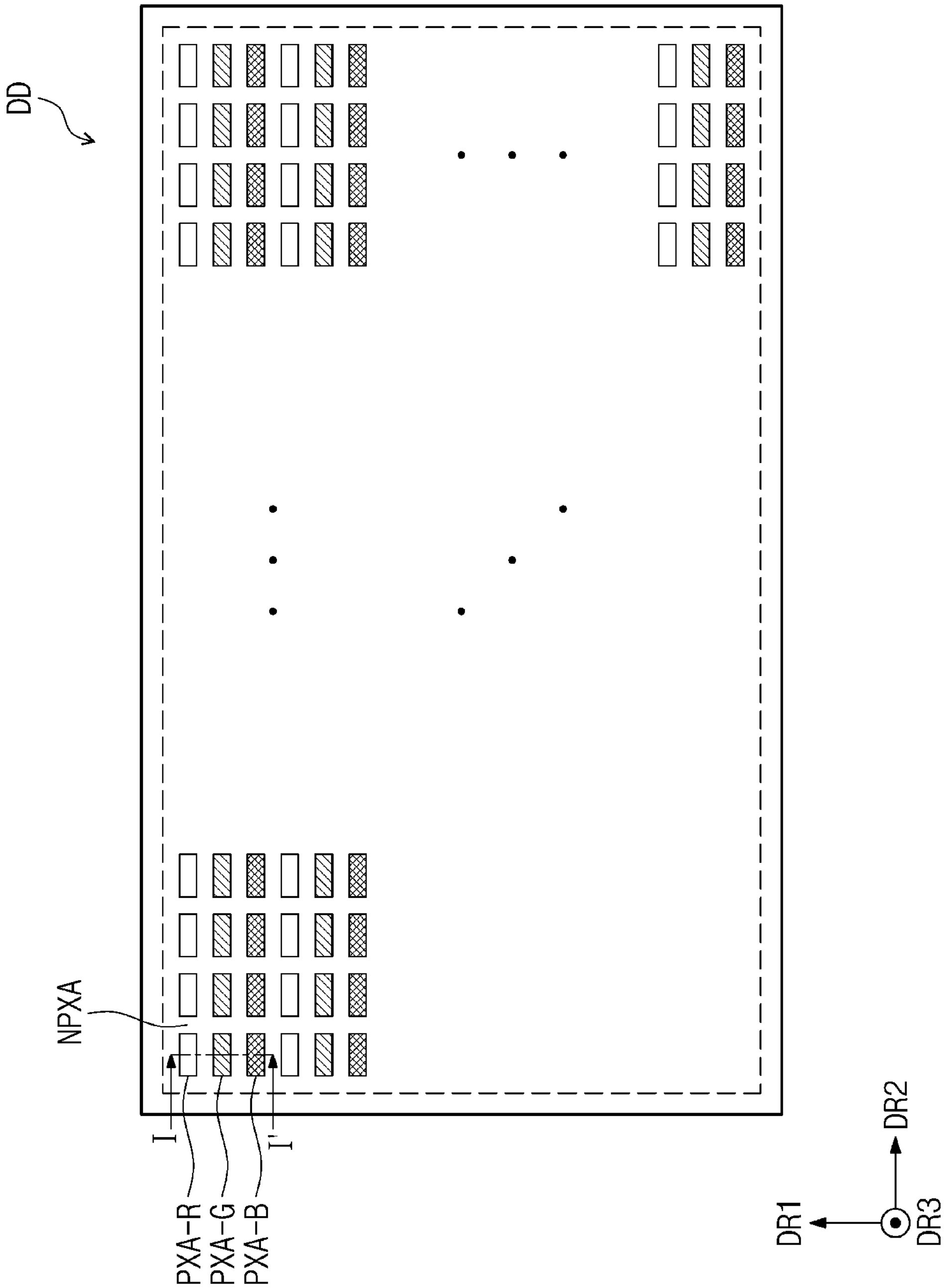
FIG. 1 is a plan view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the accompanying drawings.

Figure 2:
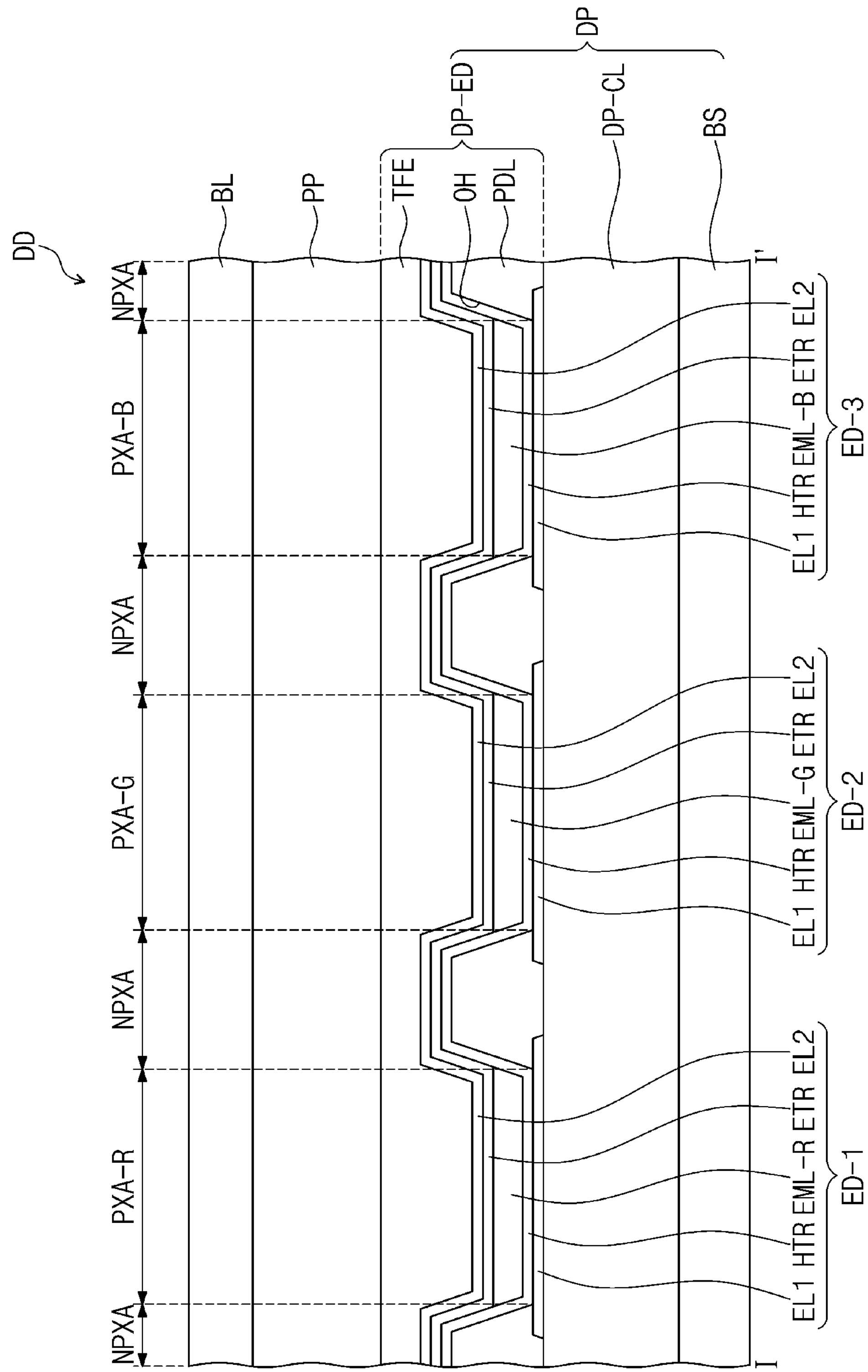
FIG. 2 is a schematic cross-sectional view of a display apparatus according to an embodiment.

FIG. 1 is a plan view of a display apparatus DD according to an embodiment. FIG. 2 is a schematic cross-sectional view of a display apparatus DD according to an embodiment. FIG. 2 is a schematic cross-sectional view showing a portion corresponding to line I-I' of FIG. 1.

The display apparatus DD may include a display panel DP and an optical layer PP disposed on the display panel DP. The display panel DP may include organic electroluminescence devices ED-1, ED-2, and ED-3. The display apparatus DD may include multiples of each of the organic electroluminescence devices ED-1, ED-2, and ED-3. The optical layer PP may be disposed on the display panel DP and may control light reflected at the display panel DP from an external light. The optical layer PP may include, for example, a polarizing layer or a color filter layer. Although not shown in the drawings, in an embodiment, the optical layer PP may be omitted from the display apparatus DD.

The display panel DP may include a base layer BS, a circuit layer DP-CL provided on the base layer BS, and a display device layer DP-ED. The display device layer DP-ED may include a pixel defining film PDL, organic electroluminescence devices ED-1, ED-2, and ED-3 disposed in the pixel defining film PDL, and an encapsulation layer TFE disposed on the organic electroluminescence devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). In an embodiment, the circuit layer DP-CL may be disposed on the base layer BS, and the circuit layer DP-CL may include transistors (not shown). The transistors (not shown) each may include a control electrode, an input electrode, and an output electrode. For example, the circuit layer DP-CL may include a switching transistor and a driving transistor for driving the organic electroluminescence devices ED-1, ED-2, and ED-3 of the display device layer DP-ED.

The organic electroluminescence devices ED-1, ED-2, and ED-3 each may have a structure of an organic electroluminescence device ED according to an embodiment of FIGS. 3 to 6, which will be described later. The organic electroluminescence devices ED-1, ED-2, and ED-3 each may include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the organic electroluminescence devices ED-1, ED-2, and ED-3 are disposed in an opening OH defined in the pixel defining film PDL, and the hole transport region HTR, the electron transport region ETR, and the second electrode EL2 are each provided as a common layer for the organic electroluminescence devices ED-1, ED-2, and ED-3. However, embodiments are not limited thereto. Although not shown in FIG. 2, in an embodiment, the hole transport region HTR and the electron transport region ETR may each be patterned and provided inside the opening OH defined in the pixel defining film PDL. For example, in an embodiment, the hole transport region HTR, the emission layers EML-R, EML-G, and EML-B, and the electron transport region ETR, etc. of the organic electroluminescence devices ED-1, ED-2, and ED-3 may each be patterned through an inkjet printing method and provided.

The encapsulation layer TFE may cover the organic electroluminescence devices ED-1, ED-2, and ED-3. The encapsulation layer TFE may seal the display device layer DP-ED. The encapsulation layer TFE may be a thin film encapsulation layer. The encapsulation layer TFE may be a single layer or a stack of multiple layers. The encapsulation layer TFE may include at least one insulating layer. The encapsulation layer TFE according to an embodiment may include at least one inorganic film (hereinafter, an encapsulation inorganic film). For example, the encapsulation layer TFE according to an embodiment may include at least one organic film (hereinafter, an encapsulation organic film) and at least one encapsulation inorganic film.

The encapsulation inorganic film may protect the display device layer DP-ED from moisture and/or oxygen, and the encapsulation organic film may protect the display device layer DP-ED from foreign substances such as dust particles. The encapsulation inorganic film may include silicon nitride, silicon oxy nitride, silicon oxide, titanium oxide, aluminum oxide, etc., but is not limited thereto. The encapsulation organic layer may include an acrylic-based compound, an epoxy-based compound, etc. The encapsulation organic layer may include a photopolymerizable organic material, without limitation.

The encapsulation layer TFE may be disposed on the second electrode EL2, and may be disposed to fill the opening OH.

Referring to FIGS. 1 and 2, the display apparatus DD may include a non-light emitting area NPXA and light emitting areas PXA-R, PXA-G, and PXA-B. The light emitting areas PXA-R, PXA-G, and PXA-B each may be an area emitting light generated from the organic electroluminescence devices ED-1, ED-2, and ED-3, respectively. The light emitting areas PXA-R, PXA-G, and PXA-B may be spaced apart from each other on a plane.

Each of the light emitting areas PXA-R, PXA-G, and PXA-B may be separated by the pixel defining film PDL. The non-light emitting areas NPXA may be an area between neighboring light emitting areas PXA-R, PXA-G, and PXA-B, and may correspond to the pixel defining film PDL. In the description, each of the light emitting areas PXA-R, PXA-G, and PXA-B may correspond to a pixel. The pixel defining film PDL may separate the organic electroluminescence devices ED-1, ED-2, and ED-3. The emission layers EML-R, EML-G, and EML-B of the organic electroluminescence devices ED-1, ED-2, and ED-3 may be separated by being disposed in the opening OH defined in the pixel defining film PDL.

The light emitting areas PXA-R, PXA-G, and PXA-B may be divided into groups according to a color of light generated from each of the organic electroluminescence devices ED-1, ED-2, and ED-3. In the display apparatus DD of an embodiment illustrated in FIGS. 1 and 2, three light emitting areas PXA-R, PXA-G, and PXA-B which respectively emit red light, green light, and blue light, are illustrated as an example. For example, the display apparatus DD of an embodiment may include a red light emitting area PXA-R, a green light emitting area PXA-G, and a blue light emitting area PXA-B, which are distinct from one another.

In the display apparatus DD according to an embodiment, the organic electroluminescence devices ED-1, ED-2, and ED-3 may each emit light having different wavelength ranges. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, the red light emitting area PXA-R, the green light emitting area PXA-G, and the blue light emitting area PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light in a same wavelength range or may emit light in at least one different wavelength range. For example, the first to third organic electroluminescence devices ED-1, ED-2, and ED-3 may all emit blue light.

The light emitting areas PXA-R, PXA-G, and PXA-B in the display apparatus DD according to an embodiment may be arranged in the form of a stripe. Referring to FIG. 1, red light emitting areas PXA-R, green light emitting areas PXA-G, and blue light emitting areas PXA-B may each be arranged along a second directional axis DR2. In an embodiment, the red light emitting area PXA-R, the green light emitting area PXA-G, and the blue light emitting area PXA-B may be alternately arranged in turn along a first directional axis DR1.

FIGS. 1 and 2 illustrate that the light emitting areas PXA-R, PXA-G, and PXA-B are all similar in size, but embodiments are not limited thereto, and the light emitting areas PXA-R, PXA-G, and PXA-B may be different in size from each other according to wavelength ranges of emitted light. The areas of the light emitting areas PXA-R, PXA-G, and PXA-B may be areas in a plan view that are defined by the first directional axis DR1 and the second directional axis DR2.

The arrangement of the light emitting areas PXA-R, PXA-G, and PXA-B is not limited to the one illustrated in FIG. 1, and the order that the red light emitting area PXA-R, the green light emitting area PXA-G, and the blue light emitting area PXA-B are arranged may be provided in various combinations according to the display quality characteristics required for the display apparatus DD. For example, the light emitting areas PXA-R, PXA-G, and PXA-B may be arranged in a PenTile® form or in a diamond form.

An area of each of the light emitting areas PXA-R, PXA-G, and PXA-B may be different in size from one another. For example, in an embodiment, the green light emitting area PXA-G may be smaller than the blue light emitting area PXA-B in size, but embodiments are not limited thereto.

Figure 3:
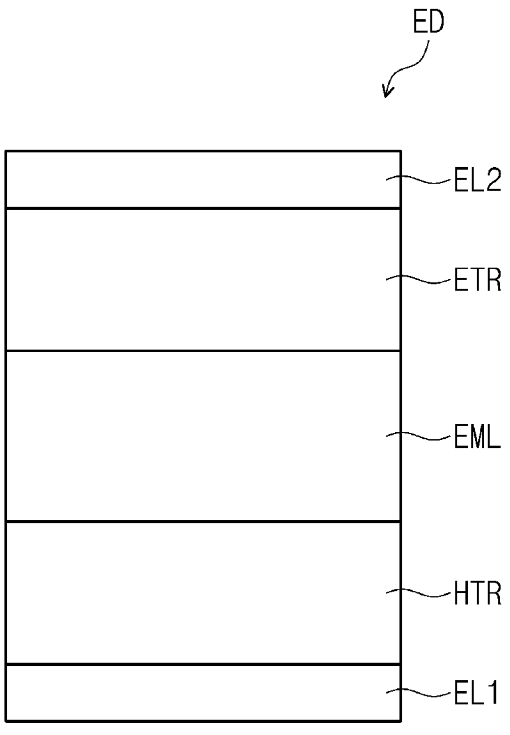
FIG. 3 is a schematic cross-sectional view illustrating an organic electroluminescence device according to an embodiment.

Hereinafter, FIGS. 3 to 6 are each a schematic cross-sectional view illustrating an organic electroluminescence device according to an embodiment. As shown in FIG. 3, the organic electroluminescence device ED according to an embodiment may include a first electrode EL1, a hole transport region HTR, an emission layer EML, an electron transport region ETR, and a second electrode EL2, which are sequentially stacked.

The organic electroluminescence device ED according to an embodiment includes a polycyclic compound of an embodiment, which will be described later, in the emission layer EML disposed between the first electrode EL1 and the second electrode EL2. However, embodiments are not limited thereto, and the organic electroluminescence device ED according to an embodiment may include a polycyclic compound according to an embodiment, which will be described later, not only in the emission layer EML but also in the hole transport region HTR or electron transport region ETR, which are functional layers disposed between the first electrode EL1 and the second electrode EL2, or in the capping layer CPL disposed on the second electrode EL2.

Figure 4:
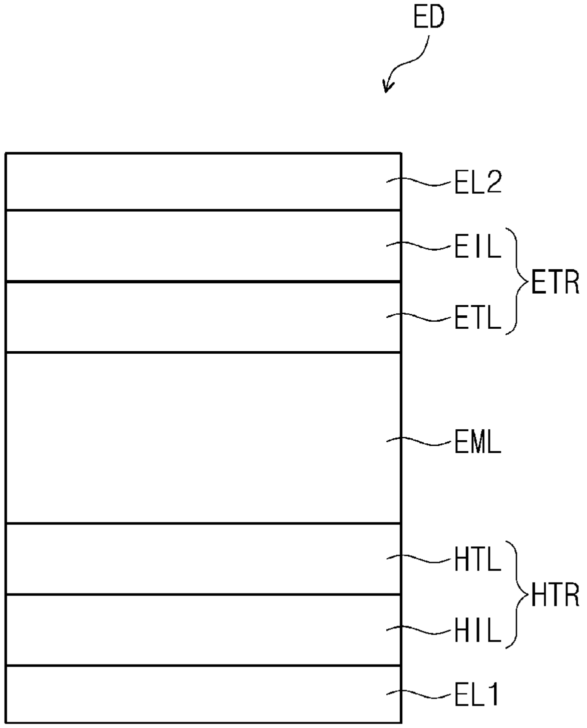
FIG. 4 is a schematic cross-sectional view illustrating an organic electroluminescence device according to an embodiment.
Figure 5:
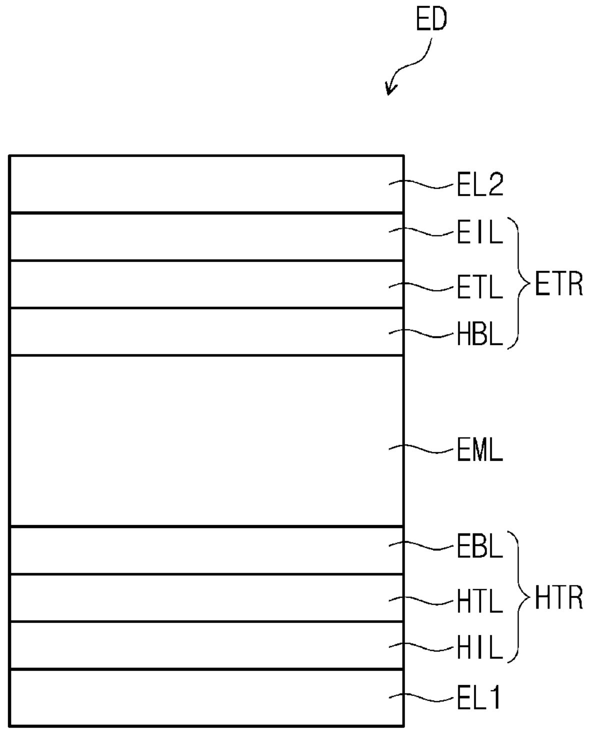
FIG. 5 is a schematic cross-sectional view illustrating an organic electroluminescence device according to an embodiment.
Figure 6:
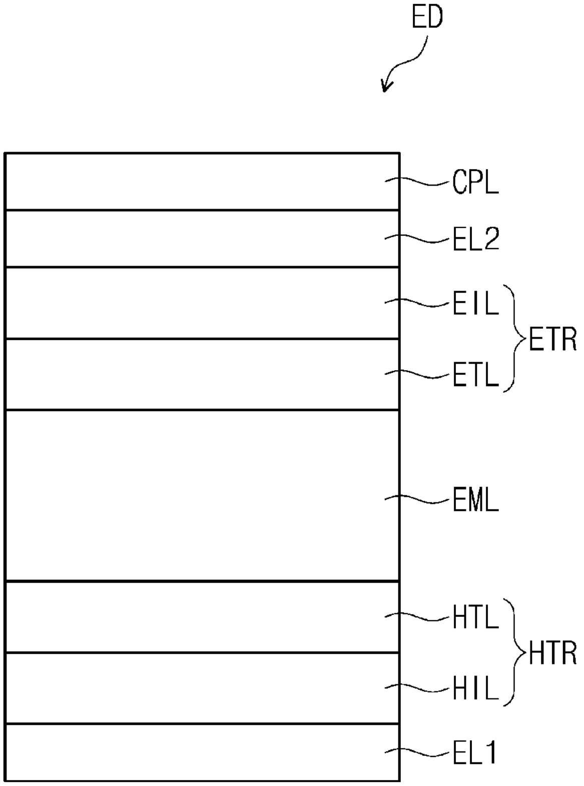
FIG. 6 is a schematic cross-sectional view illustrating an organic electroluminescence device according to an embodiment.

In comparison to FIG. 3, FIG. 4 illustrates a schematic cross-sectional view of an organic electroluminescence device ED of an embodiment in which the hole transport region HTR includes a hole injection layer HIL and a hole transport layer HTL, and the electron transport region ETR includes an electron injection layer EIL and an electron transport layer ETL. In comparison to FIG. 3, FIG. 5 illustrates a schematic cross-sectional view of an organic electroluminescence device ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. In comparison to FIG. 4, FIG. 6 illustrates a schematic cross-sectional view of an organic electroluminescence device ED of an embodiment including a capping layer CPL disposed on the second electrode EL2.

The first electrode EL1 has conductivity. The first electrode EL1 may be formed of a metal alloy or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In an embodiment, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. The first electrode EL1 may have a thickness in a range of about 700 Å to about 10,000 Å. For example, the first electrode EL1 may have a thickness in a range of about 1,000 Å to about 3,000 Å.

The hole transport region HTR is provided on the first electrode EL1. The hole transport region HTR may include at least one of a hole injection layer HIL, a hole transport layer HTL, a hole buffer layer (not shown), and an electron blocking layer EBL. The hole transport region HTR may have, for example, a thickness in a range of about 50 Å to about 15,000 Å.

The hole transport region HTR may have a layer formed of a single material, a layer formed of different materials, or a multilayer structure having layers formed of different materials.

For example, the hole transport region HTR may have a single-layer structure formed of the hole injection layer HIL or the hole transport layer HTL, or a single-layer structure formed of a hole injection material or a hole transport material. For example, the hole transport region HTR may have a single-layer structure formed of different materials, or a structure in which a hole injection layer HIL/a hole transport layer HTL, a hole injection layer HIL/a hole transport layer HTL/a hole buffer layer (not shown), a hole injection layer HIL/a hole buffer layer (not shown), a hole transport layer HTL/a hole buffer layer (not shown), or a hole injection layer HIL/a hole transport layer HTL/an electron blocking layer EBL are stacked in order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may further include a compound represented by Formula H-1 below.

[Formula H-1]

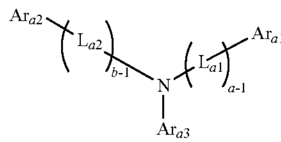

In Formula H-1 above, $L_{a1}$ and $L_{a2}$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a-1 and b-1 may each independently be an integer from 0 to 10. In Formula H-1, when a-1 or b-1 is 2 or greater, multiple $L_{a1}$ groups and multiple $L_{a2}$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_{a1}$ to $Ar_{a3}$ may each independently be a substituted or unsubstituted aryl group having 6 to 30 ring-forming carbon atoms, or a substituted or unsubstituted heteroaryl group having 2 to 30 ring-forming carbon atoms.

A compound represented by Formula H-1 above may be a monoamine compound. In another embodiment, a compound represented by Formula H-1 may be a diamine compound in which at least one of $Ar_{a1}$ to $Ar_{a3}$ includes an amine group as a substituent. For example, a compound represented by Formula H-1 above may be a carbazole-based compound including a substituted or unsubstituted carbazole group in at least one of $Ar_{a1}$ and $Ar_{a2}$ or a substituted or unsubstituted fluorene-based group in at least one of $Ar_{a1}$ and $Ar_{a2}$.

The compound represented by Formula H-1 may be any one selected from Compound Group H below. However, the compounds listed in Compound Group H below are only examples, and the compound represented by Formula H-1 is not limited to the those listed in Compound Group H below.

[Compound Group H]

H-1-1

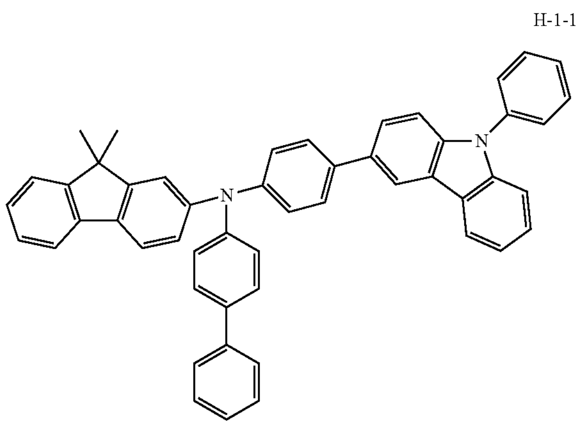

H-1-2

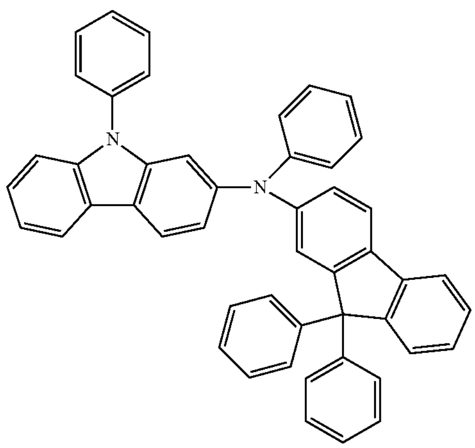

-continued

H-1-3

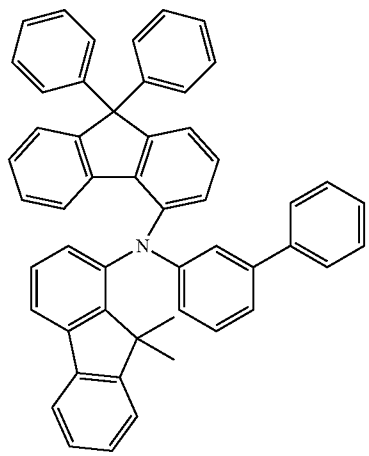

H-1-4

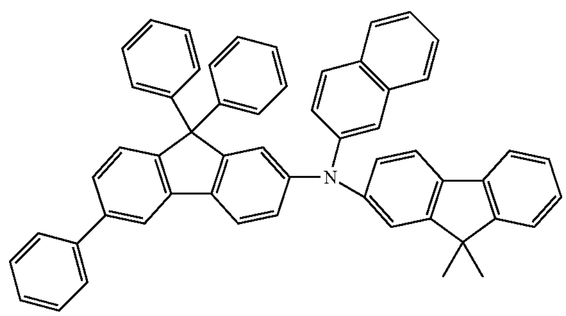

H-1-5

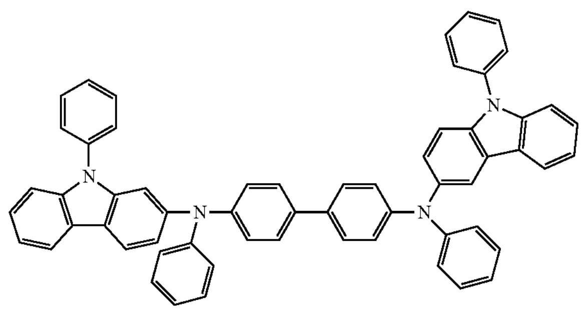

H-1-6

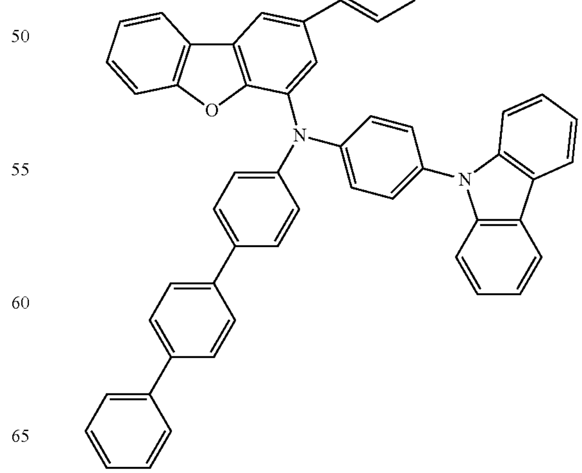

-continued
H-1-7
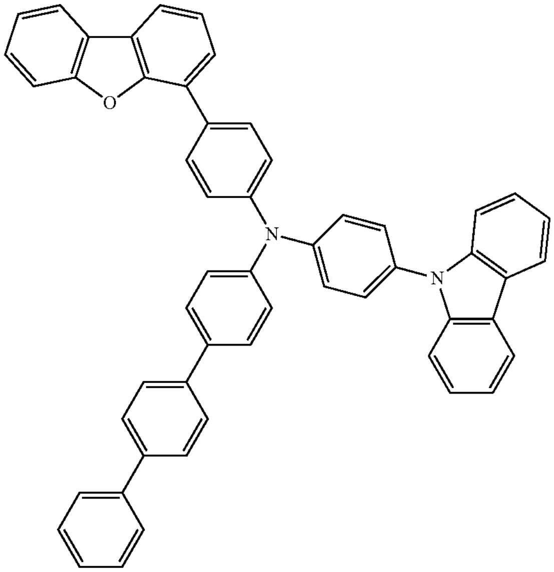
H-1-8
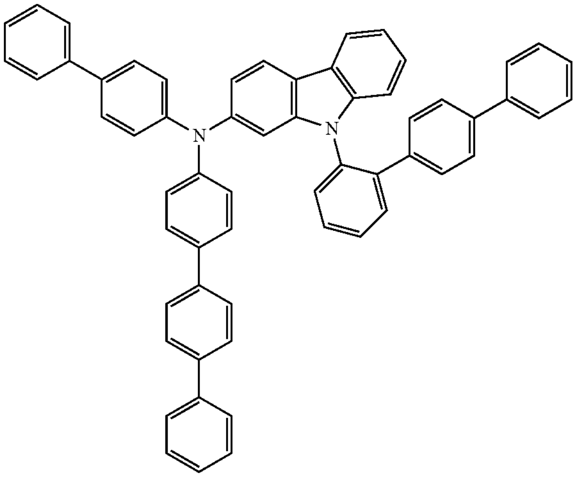
H-1-9
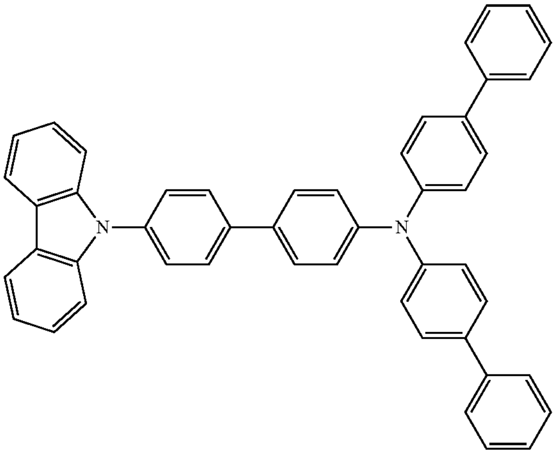
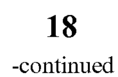
-continued
H-1-10
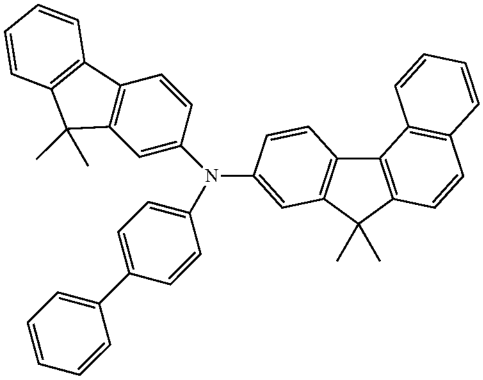
H-1-11
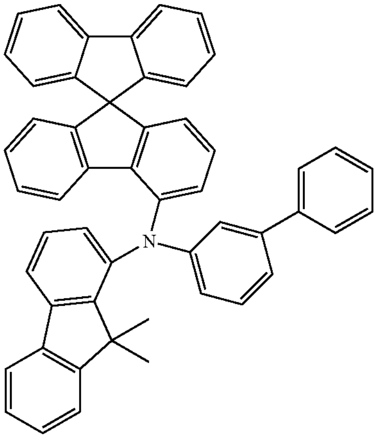
H-1-12
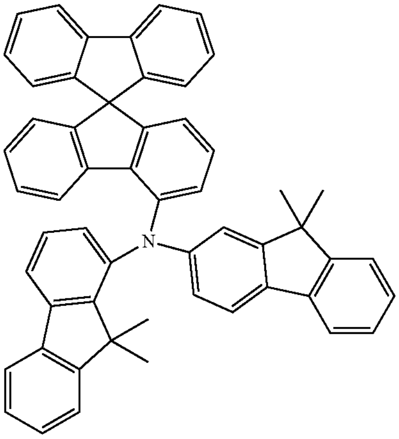
H-1-13
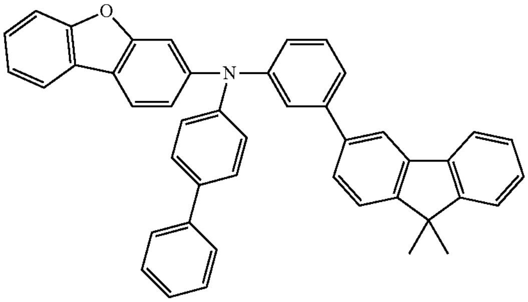

-continued
H-1-14
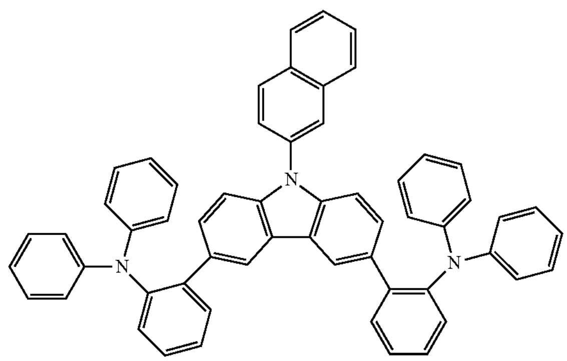
H-1-15
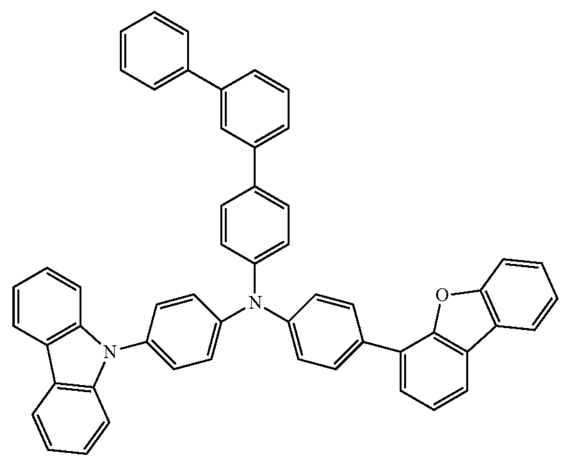
H-1-16
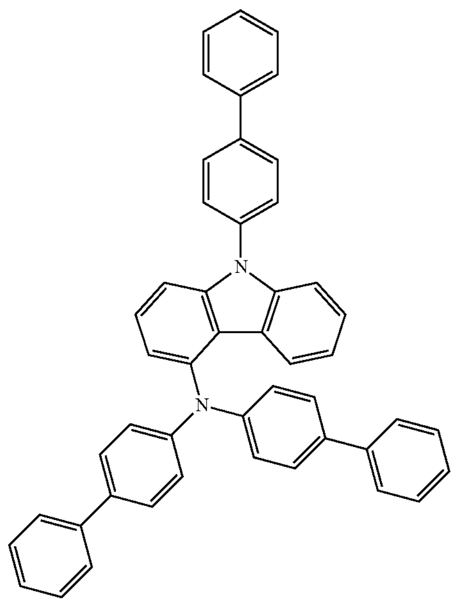
-continued
H-1-17
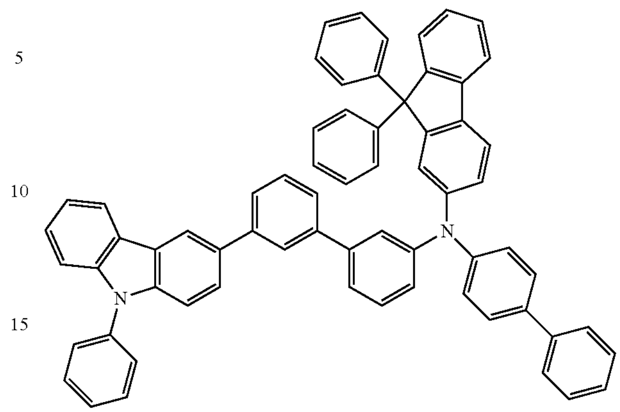
H-1-18
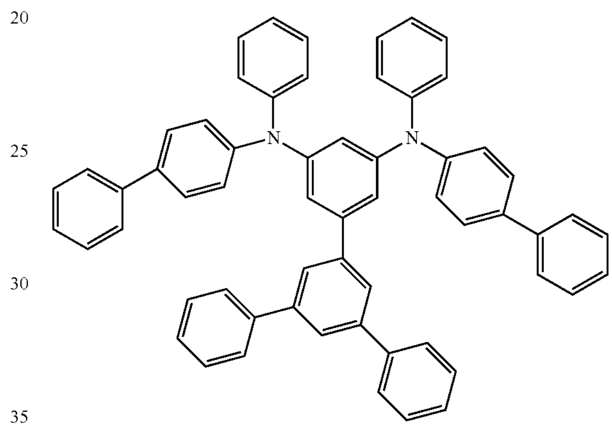
H-1-19
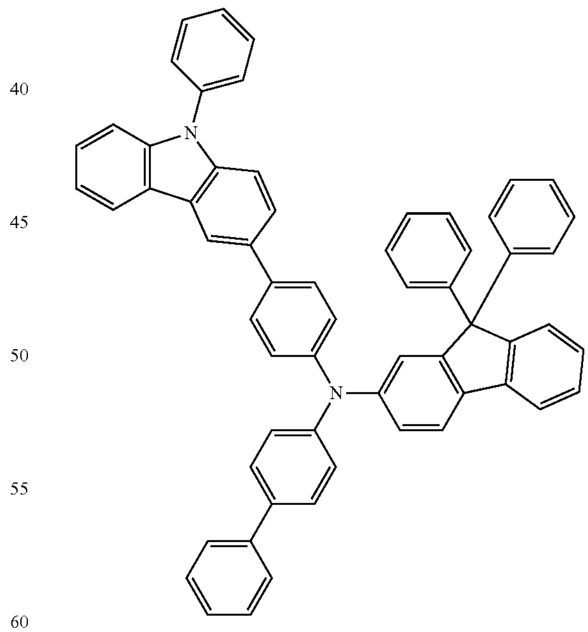
The hole transport region HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"- tris[N(1-naphthyl)-N-phenylamino]-triphenylamine (1-TNATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HATCN), etc.

The hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(1-naphtalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may further include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one of the hole injection layer HIL, the hole transport layer HTL, and the electron blocking layer EBL.

The hole transport region HTR may have a thickness in a range of about 100 Å to about 10,000 Å. For example, the hole transport region HTR may have a thickness in a range of about 100 Å to about 5,000 Å. The hole injection layer HIL, for example, may have a thickness in a range of about 30 Å to about 1,000 Å, and the hole transport layer HTL may have a thickness in a range of about 30 Å to about 1,000 Å. For example, the electron blocking layer EBL may have a thickness in a range of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of quinone derivatives, metal oxides, and cyano group-containing compounds, but is not limited thereto. Non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, etc., but are not limited thereto.

As described above, the hole transport region HTR may further include at least one of a hole buffer layer (not shown) and an electron blocking layer EBL in addition to the hole injection layer HIL and the hole transport layer HTL. The hole buffer layer (not shown) may compensate for a resonance distance according to the wavelength of light emitted from an emission layer EML, and may thus increase luminous efficiency. Materials which may be included in the hole transport region HTR may be used as materials included in the hole buffer layer (not shown). The electron blocking layer EBL may prevent electrons from being injected from the electron transport region ETR to the hole transport region HTR.

The emission layer EML is provided on the hole transport region HTR. The emission layer EML may have, for example, a thickness in a range of about 100 Å to about 1,000 Å. For example, the emission layer EML may have a thickness in a range of about 100 Å to about 300 Å. The emission layer EML may have a layer formed of a single material, a layer formed of different materials, or a multi-layer structure having layers formed of different materials.

The emission layer EML may emit one of red, green, blue, white, yellow, or cyan light. The emission layer EML may include a fluorescence emission material or a phosphorescence emission material.

In an embodiment, the emission layer EML may be a fluorescence emission layer. For example, at least some of the light emitted from the emission layer EML may result from thermally activated delayed fluorescence (TADF). For example, the emission layer EML may include a luminescent component that emits thermally activated delayed fluorescence, and in an embodiment, the emission layer EML may be an emission layer that emits thermally activated delayed fluorescence in the form of blue light.

The emission layer EML of the organic electroluminescence device ED according to an embodiment includes a polycyclic compound according to an embodiment.

In the description, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents listed above may themselves be substituted or unsubstituted. For example, a biphenyl group may be interpreted as an aryl group or as a phenyl group substituted with a phenyl group.

In the description, examples of a halogen atom may include a fluorine atom, a chlorine atom, a bromine atom, and an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, an alkenyl group may be a hydrocarbon group that includes at least one carbon double bond in the middle or end of an alkyl group having 2 or more carbon atoms. The alkenyl group may be linear or branched. The number of carbon atoms is not particularly limited, but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styryl vinyl group, etc., but are not limited thereto.

In the description, an alkynyl group may be a hydrocarbon group including at least one carbon triple bond in the middle or end of an alkyl group having 2 or more carbon atoms. The alkynyl group may be linear or branched. The number of carbon atoms is not particularly limited, but may be 2 to 30, 2 to 20, or 2 to 10. Examples of the alkynyl group may include an ethynyl group, a propynyl group, etc., but are not limited thereto.

In the description, a hydrocarbon ring group may be any functional group or substituent derived from an aliphatic hydrocarbon ring, or any functional group or substituent derived from an aromatic hydrocarbon ring. The number of ring-forming carbon atoms in the hydrocarbon ring group may be 5 to 60, 5 to 30, or 5 to 20.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the description, a heterocyclic group may be any functional group or substituent derived from a ring containing at least one of B, O, N, P, Si, and S as a heteroatom. The heterocyclic group may include an aliphatic heterocyclic group and an aromatic heterocyclic group. The aromatic heterocyclic group may be a heteroaryl group. The aliphatic heterocycle and the aromatic heterocycle may be monocyclic or polycyclic.

In the description, the heterocyclic group may contain at least one of B, O, N, P, Si, and S as a heteroatom. When the heterocyclic group contains two or more heteroatoms, the two or more heteroatoms may be the same as or different from each other. The heterocyclic group may be a monocyclic heterocyclic group or a polycyclic heterocyclic group, and the heterocyclic group may include a heteroaryl group. The number of ring-forming carbon atoms in the heterocyclic group may be 2 to 30, 2 to 20, or 2 to 10.

In the description, the aliphatic heterocyclic group may include at least one of B, O, N, P, Si, and S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto.

In the description, a heteroaryl group may include at least one of B, O, N, P, Si, and S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, the number of carbon atoms in an amine group is not particularly limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but are not limited thereto.

In the description, a silyl group may include an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., but are not limited thereto.

In the description, a thio group may include an alkyl thio group and an aryl thio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the description, an oxy group may be an oxygen atom that is bonded to an alkyl group or aryl group as defined above. The oxy group may include an alkoxy group and an aryl oxy group. The alkoxy group may be linear, branched, or cyclic. The number of carbon atoms in the alkoxy group is not particularly limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the description,  and  each represents a binding site to a neighboring atom.

A polycyclic compound according to an embodiment may be represented by Formula 1 below.

[Formula 1]

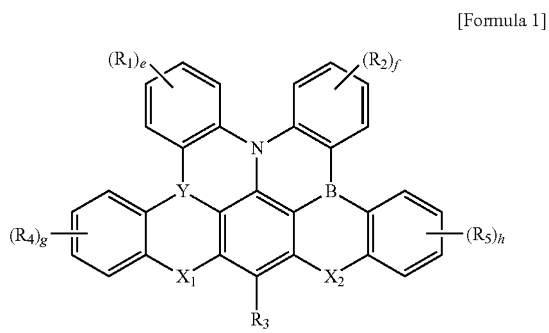

In Formula 1 above, Y may be B, N, or P.

In Formula 1, $R_1$ to $R_5$ may each independently be a hydrogen atom, a deuterium atom, a halogen atom, a nitro group, a cyano group, a substituted or unsubstituted amine group, a substituted or unsubstituted thio group, a substituted or unsubstituted silyl group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 1, e to h may each independently be an integer from 0 to 4. When e is 2 or greater, multiple $R_1$ groups may be the same as or different from each other, when f is 2 or greater, multiple $R_2$ groups may be the same as or different from each other, when g is 2 or greater, multiple $R_4$ groups may be the same as or different from each other, and when h is 2 or greater, multiple $R_5$ groups may be the same as or different from each other.

In Formula 1, $X_1$ and $X_2$ may each independently be O, S, $C(R_7)(R_8)$, $Si(R_9)(R_{10})$, C═O, C═S, $P(R_{11})$, $N(R_{12})$, or a group represented by Formula 2 below.

In Formula 1, $R_7$ to $R_{12}$ may each independently be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 1, at least one of $X_1$ and $X_2$ may be a group represented by Formula 2 below.

[Formula 2]

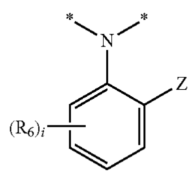

In Formula 2, Z may be a substituted or unsubstituted aryl group having 6 to 30 ring-forming carbon atoms, a substituted or unsubstituted heteroaryl group having 2 to 30 ring-forming carbon atoms, a substituted or unsubstituted triarylsilyl group, a substituted or unsubstituted diarylamine group, a substituted oxy group, a substituted thio group, a fluorine group, or a fluorine-substituted alkyl group having 1 to 20 carbon atoms.

In Formula 2, $R_6$ may be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 2, i may be an integer from 0 to 4. When i is 2 or greater, multiple $R_6$ groups may be the same as or different from each other. In Formula 2, —* represents a binding site to a neighboring atom.

In Formula 1 and Formula 2, when Z contains fluorine, the remainder of $X_1$ and $X_2$ in Formula 1 that is not represented by Formula 2, may be S.

In an embodiment, when Z contains fluorine, Z may be a fluorine group, an alkyl group having 1 to 20 carbon atoms and at least one fluorine substituent, an aryl group having 6 to 30 ring-forming carbon atoms and at least one fluorine substituent, a heteroaryl group having 2 to 30 ring-forming carbon atoms and at least one fluorine substituent, a triaryl group having at least one fluorine substituent, a diarylamine group having at least one fluorine substituent, or an oxy group having at least one fluorine substituent.

In an embodiment, the group represented by Formula 2 may be represented by Formula 3-1 or Formula 3-2 below.

[Formula 3-1]

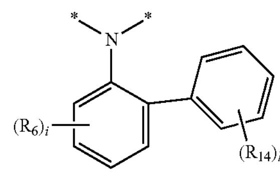

[Formula 3-2]

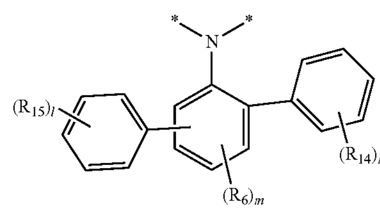

In Formulas 3-1 and 3-2, $R_{14}$ and $R_{15}$ may each independently be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formulas 3-1 and 3-2, k and 1 may each independently be an integer from 0 to 5. When k is 2 or greater, multiple $R_{14}$ groups may be the same as or different from each other, and when 1 is 2 or greater, multiple $R_{15}$ groups may be the same as or different from each other.

In Formula 3-2, m is an integer of 0 to 3. When m is 2 or greater, multiple $R_6$ groups may be the same as or different from each other.

In Formulas 3-1 and 3-2, $R_6$, i, and —* may be the same as defined in connection with Formula 2.

In an embodiment, the group represented by Formula 2 may be represented by Formula 3-3 or Formula 3-4 below.

[Formula 3-3]

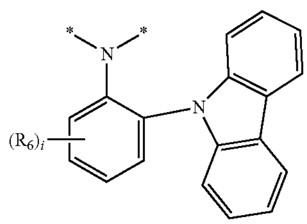

[Formula 3-4]

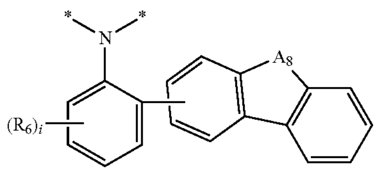

In Formula 3-4, $A_8$ may be O, S, or $N(R_{20})$.

In Formula 3-4, $R_{20}$ may be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulas 3-3 and 3-4, $R_6$, i, and —* may be the same as defined in connection with Formula 2.

In an embodiment, the group represented by Formula 2 may be represented by Formula 3-5 or Formula 3-6 below.

[Formula 3-5]

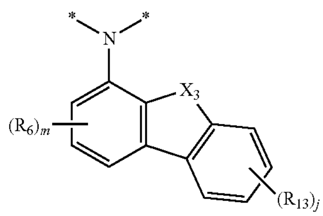

[Formula 3-6]

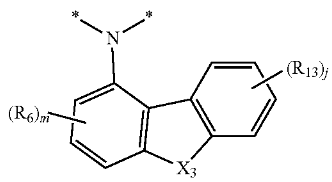

In Formulas 3-5 and 3-6, $X_3$ may be O, S, or $N(R_{21})$, and $R_{21}$ may be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulas 3-5 and 3-6, $R_{13}$ may be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formulas 3-5 and 3-6, j may be an integer from 0 to 4. When j is 2 or greater, multiple $R_{13}$ groups may be the same as or different from each other.

In Formulas 3-5 and 3-6, m may be an integer of 0 to 3. When m is 2 or greater, multiple $R_6$ groups may be the same as or different from each other.

In Formulas 3-5 and 3-6, $R_6$ and —* may be the same as defined in connection with Formula 2.

In an embodiment, the group represented by Formula 2 may be represented by any one of Formulas 3-7 to 3-10 below.

[Formula 3-7]

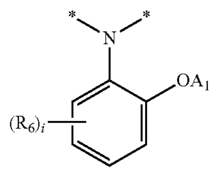

[Formula 3-8]

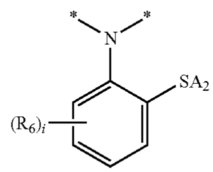

[Formula 3-9]

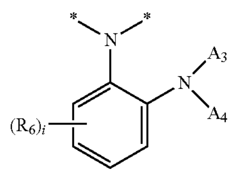

[Formula 3-10]

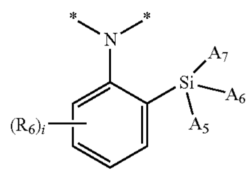

[Formula 3-11]

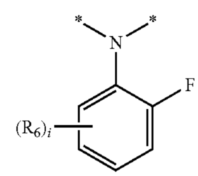

[Formula 3-12]

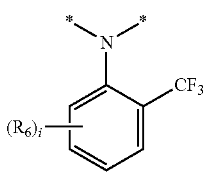

In Formulas 3-7 to 3-10, $A_1$ to $A_7$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulas 3-7 to 3-12, $R_6$, i, and —* may be the same as defined in connection with Formula 2.

In an embodiment, the polycyclic compound represented by Formula 1 may be represented by any one of Formulas 4 to 7 below.

[Formula 4]

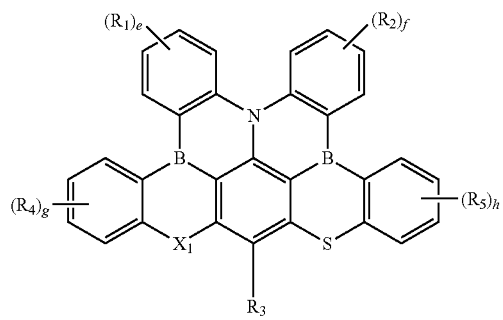

[Formula 5]

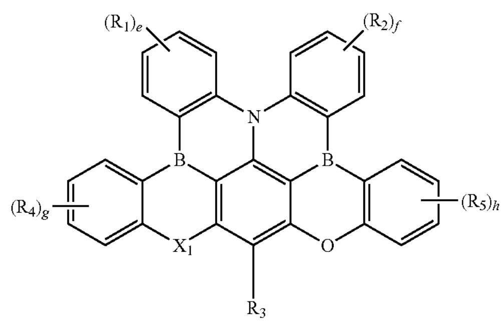

[Formula 6]

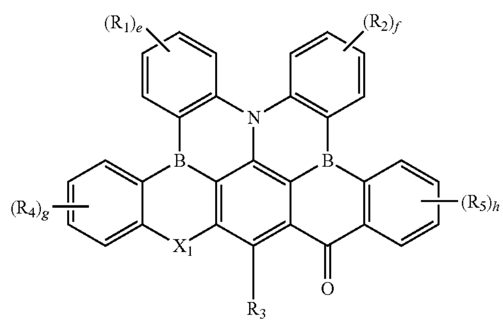

[Formula 7]

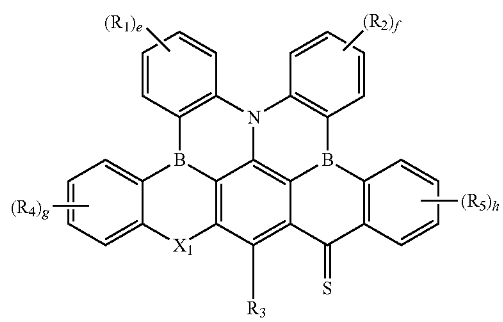

In Formulas 4 to 7, $X_1$ may be a group represented by Formula 2 above, and $R_1$ to $R_5$, and e to h may be the same as defined in connection with Formula 1.

In an embodiment, the polycyclic compound represented by Formula 1 may be represented by Formula 8 or Formula 9 below.

[Formula 8]

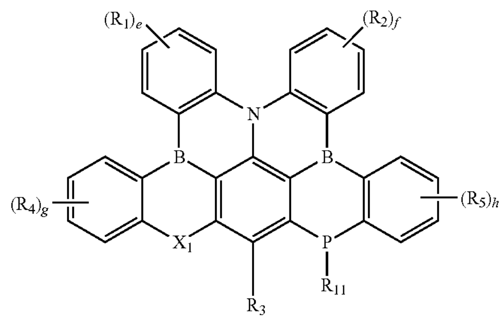

[Formula 9]

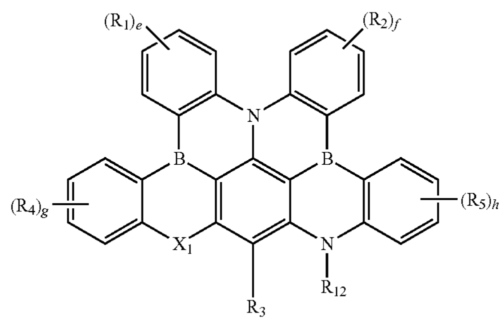

In Formulas 8 and 9, $X_1$ may be a group represented by Formula 2 above.

In Formulas 8 and 9, $R_{11}$ and $R_{12}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulas 8 and 9, $R_1$ to $R_5$, and e to h may be the same as defined in connection with Formula 1.

In an embodiment, the polycyclic compound represented by Formula 1 may be represented by Formula 10 or Formula 11 below.

[Formula 10]

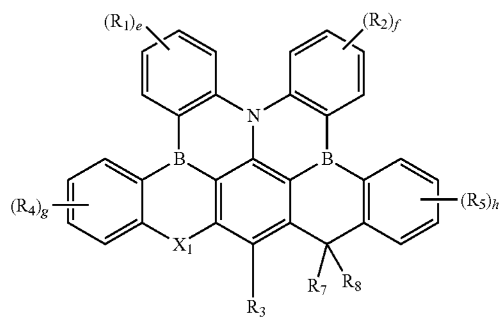

-continued

[Formula 11]

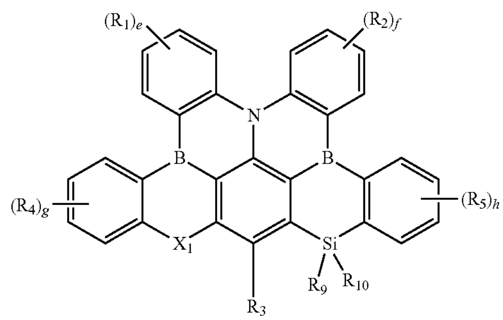

In Formulas 10 and 11, $X_1$ may be a group represented by Formula 2 above.

In Formulas 10 and 11, $R_7$ to $R_{10}$ may each independently be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formulas 10 and 11, $R_1$ to $R_5$, and e to h may be the same as defined in connection with Formula 1.

In an embodiment, the polycyclic compound represented by Formula 1 may be represented by Formula 12 below.

[Formula 12]

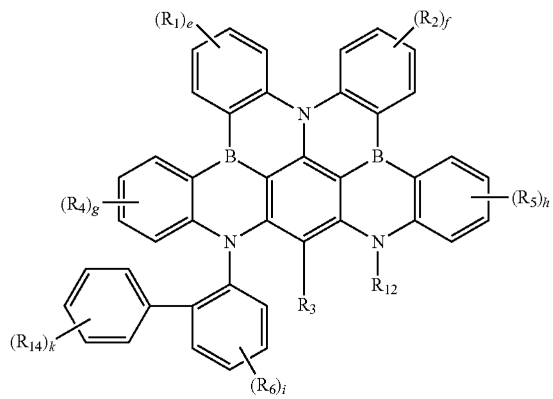

In Formula 12, $R_{12}$ may be a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 12, $R_{14}$ may be a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 12, k may be an integer from 0 to 5. When k is 2 or greater, multiple $R_{14}$ groups may be the same as or different from each other.

In Formula 12, $R_1$ to $R_6$, and e to i may be the same as defined in connection with Formulas 1 and 2.

The polycyclic compound represented by Formula 1 according to an embodiment may be any one selected from Compound Groups 1 and 2 below. However, embodiments are not limited thereto.

[Compound Group 1]

1

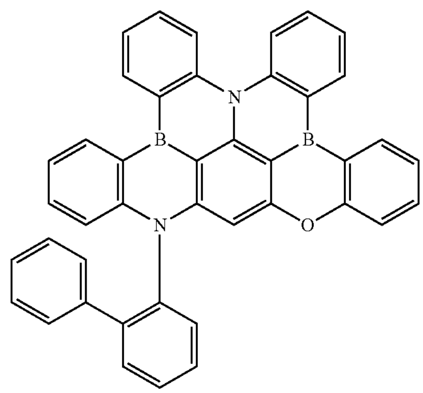

2

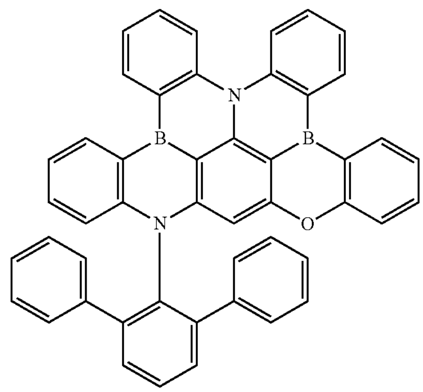

3

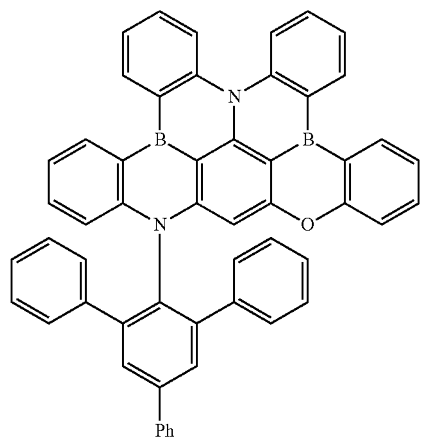

-continued
1-D
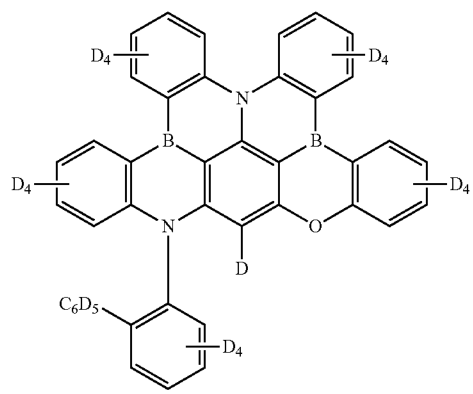
2-D
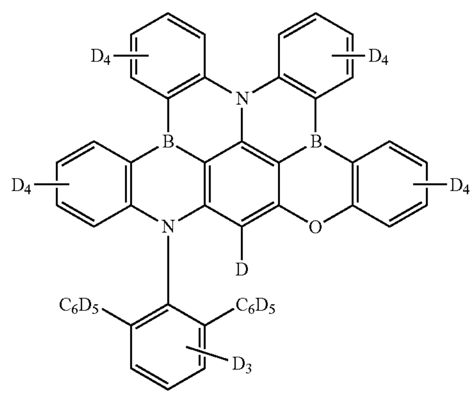
3-D
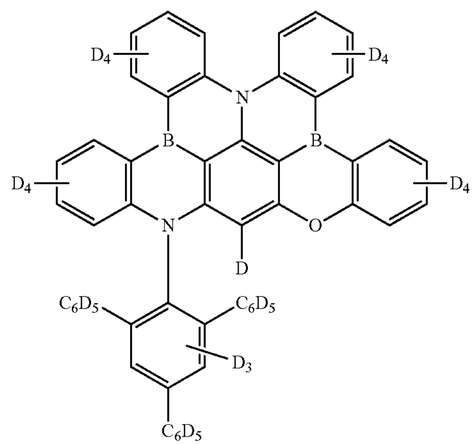
-continued
4
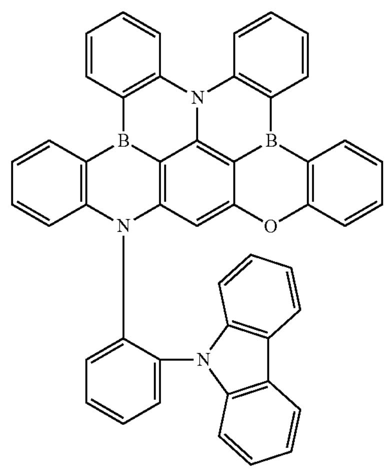
5
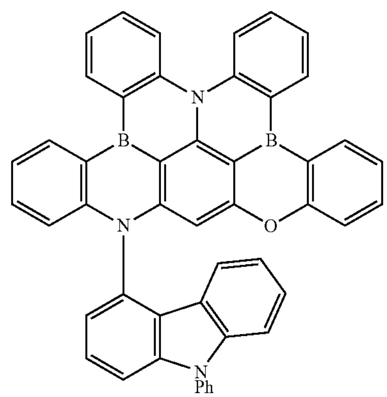
6
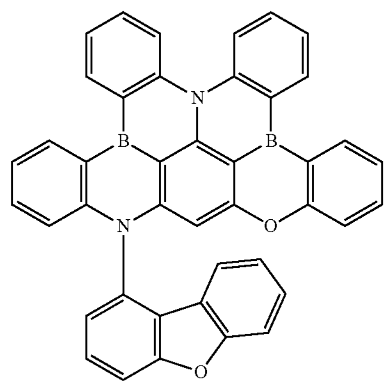
7
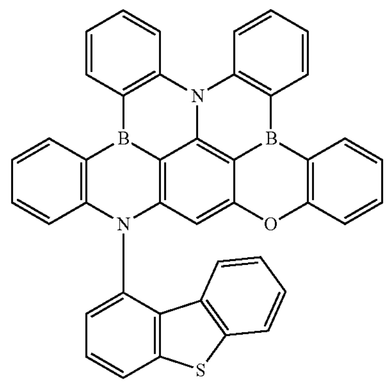

8
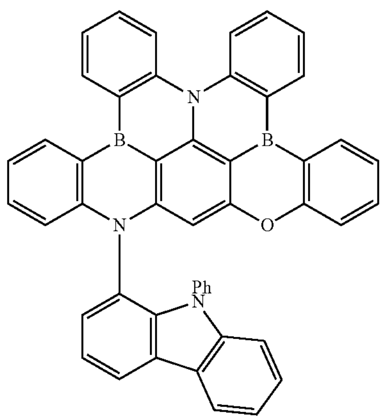
9
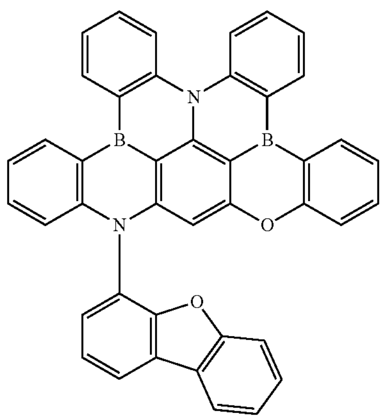
10
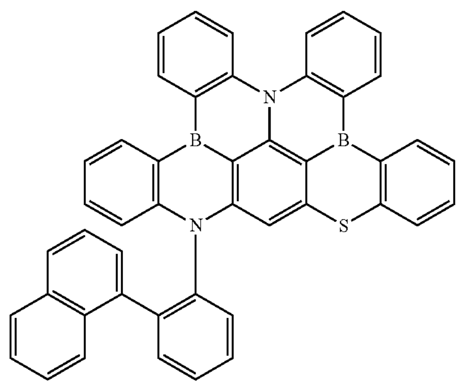
11
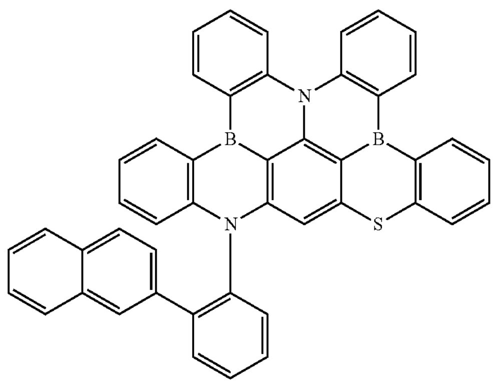
12
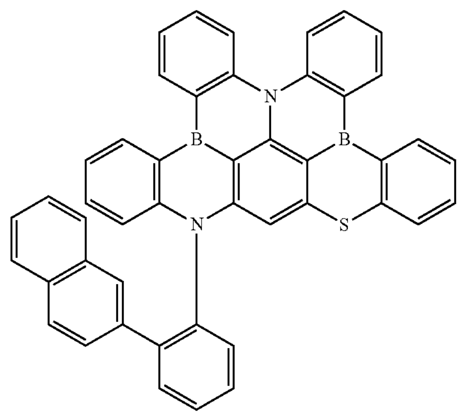
13
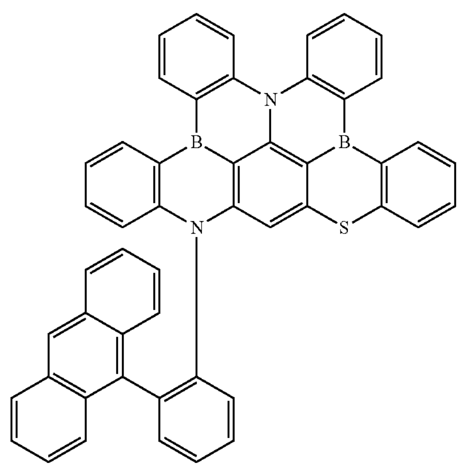
14
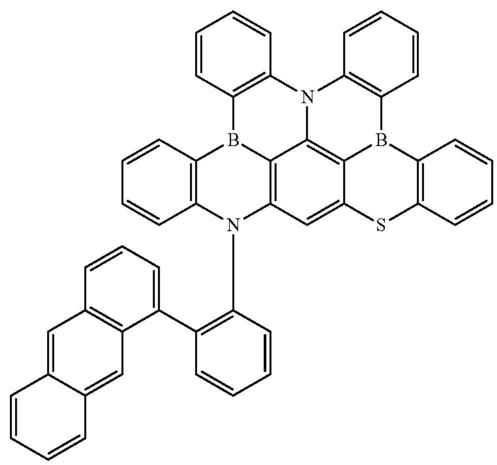

-continued
15
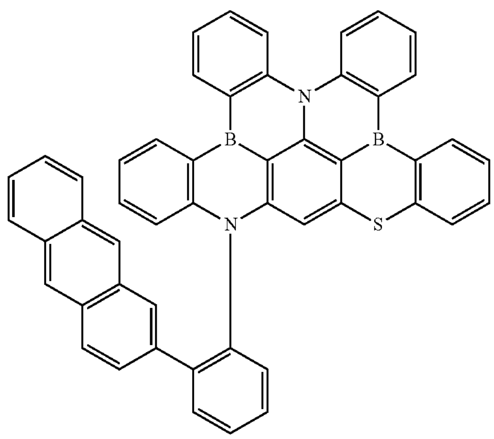
16
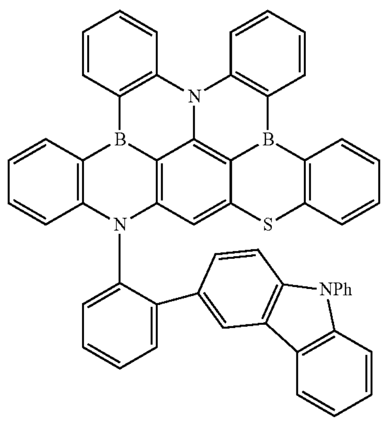
17
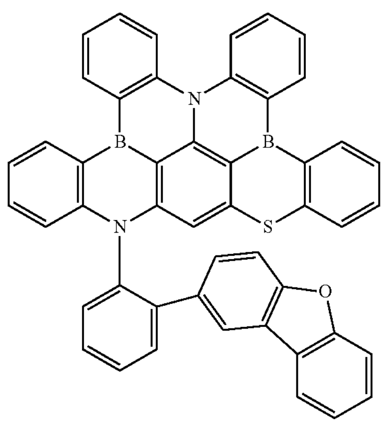
-continued
18
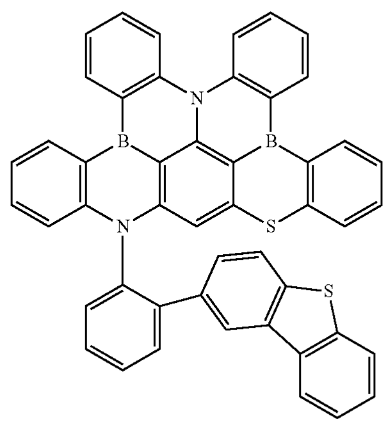
19
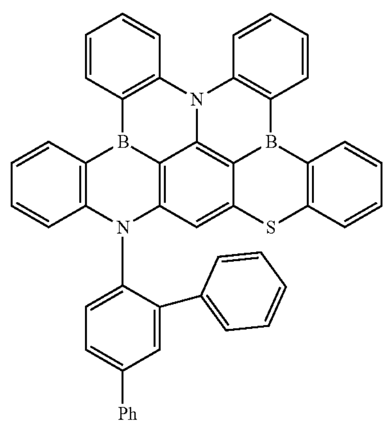
20
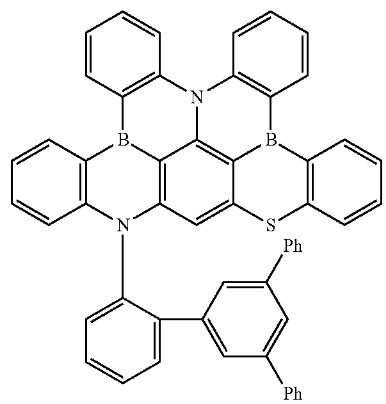
21
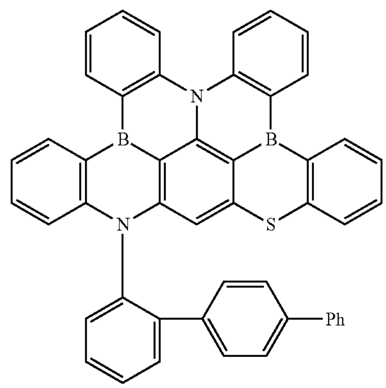

-continued
22
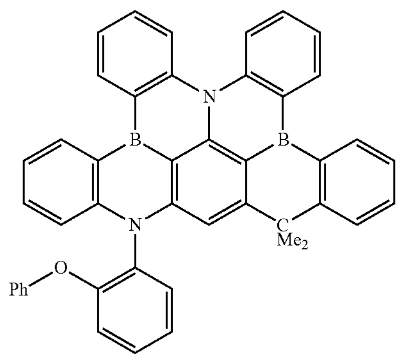
23
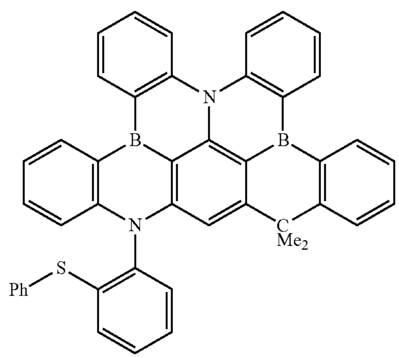
24
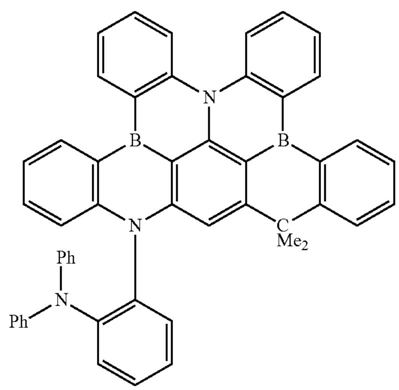
25
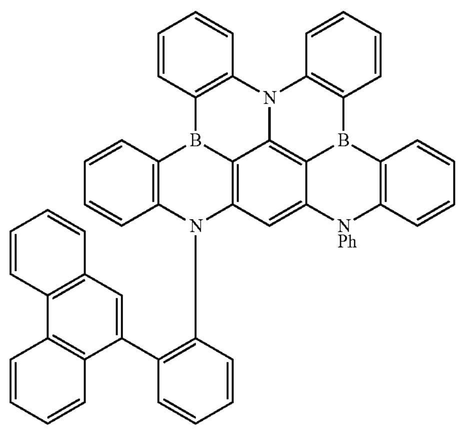
-continued
26
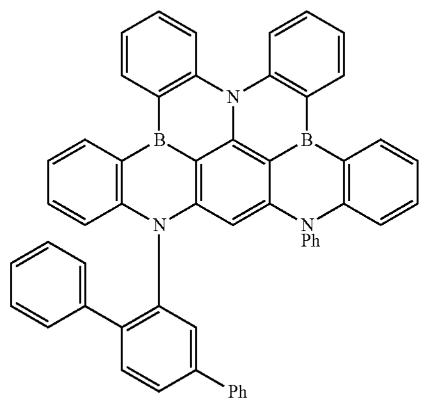
27
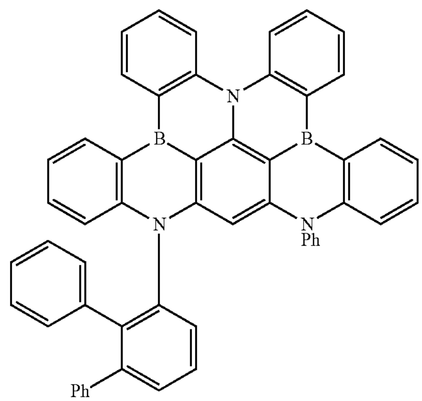
28
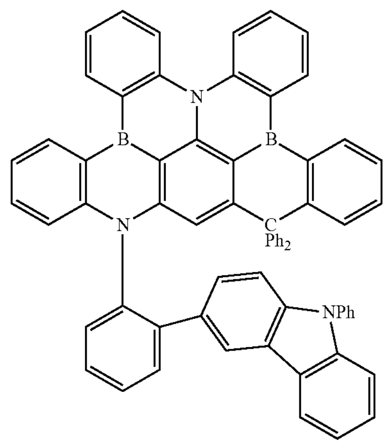

-continued
29
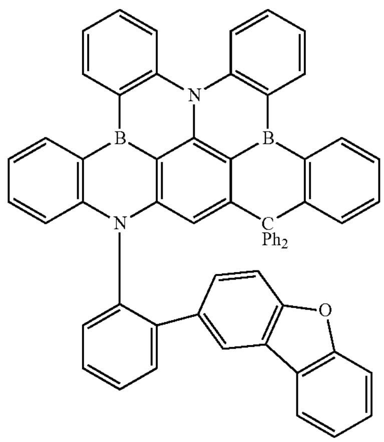
30
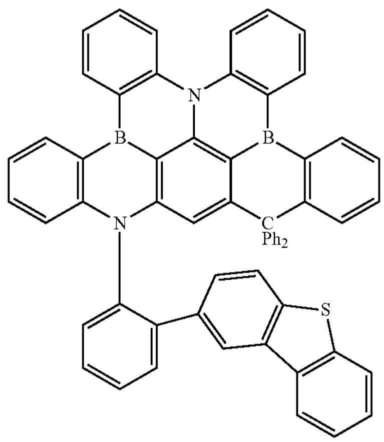
31
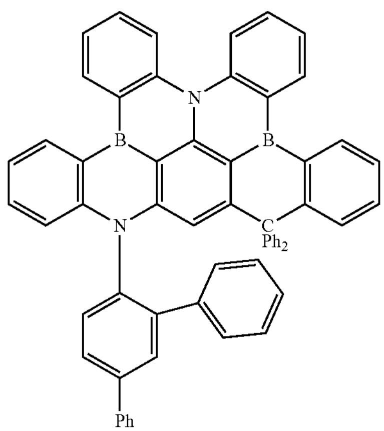
-continued
32
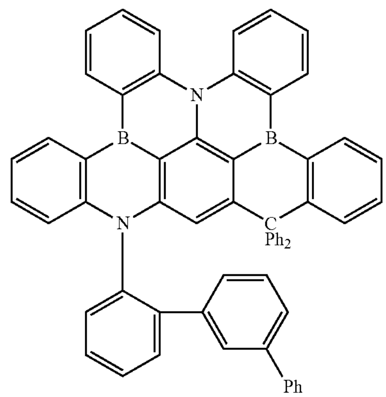
33
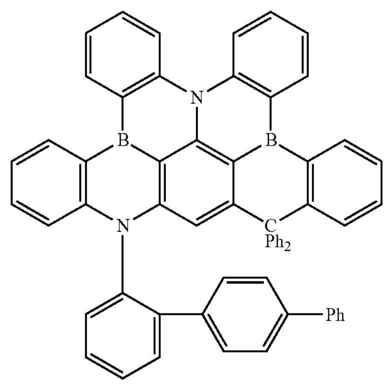
34
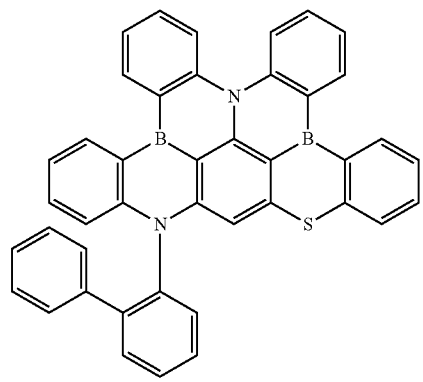
35
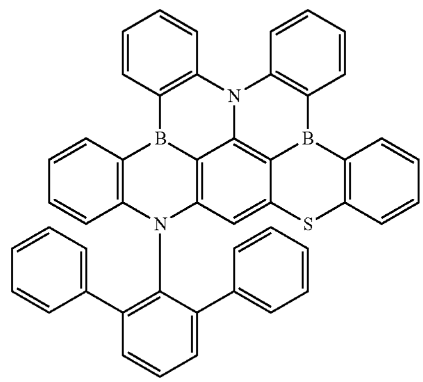

36
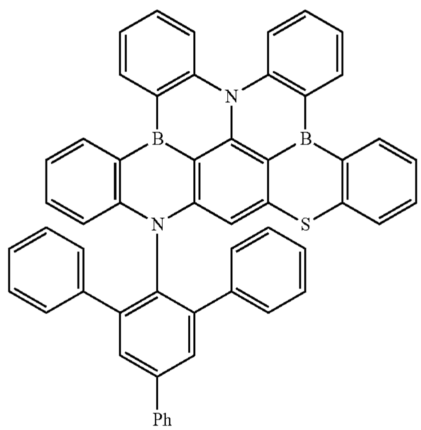
37
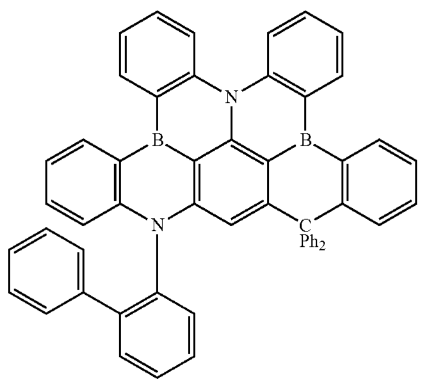
38
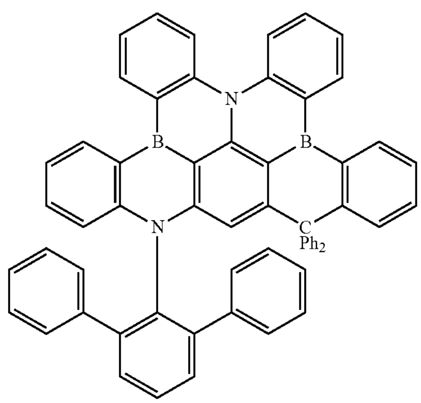
39
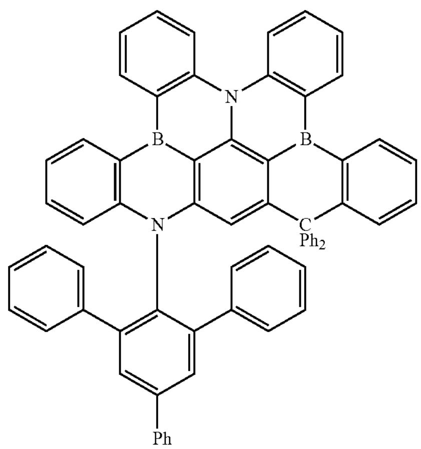
40
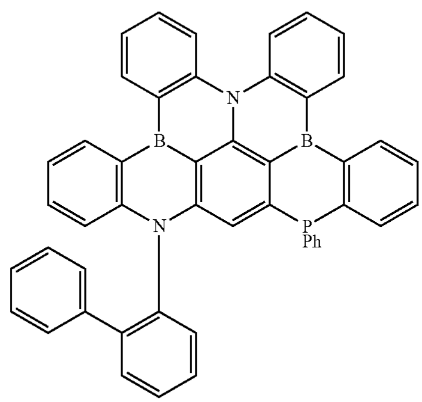
41
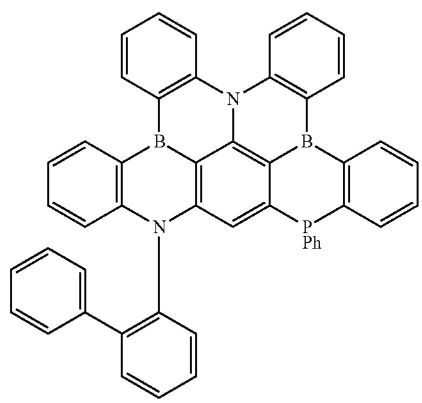
42
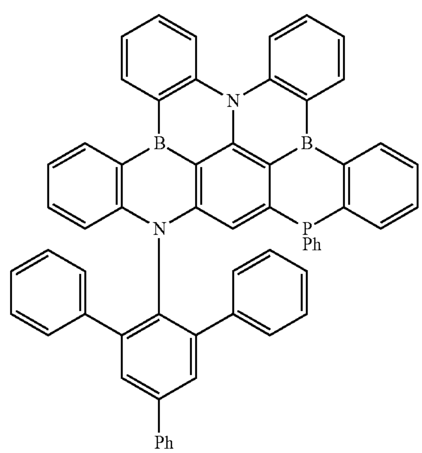
43
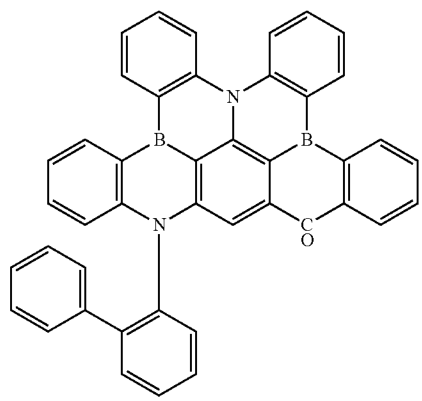

44
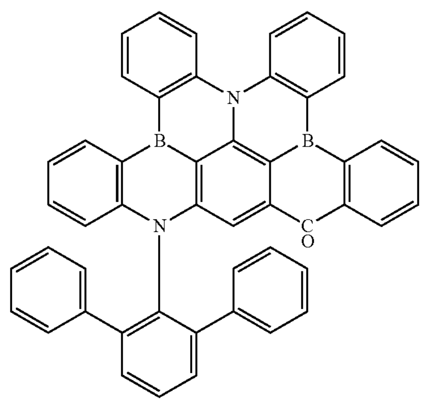
45
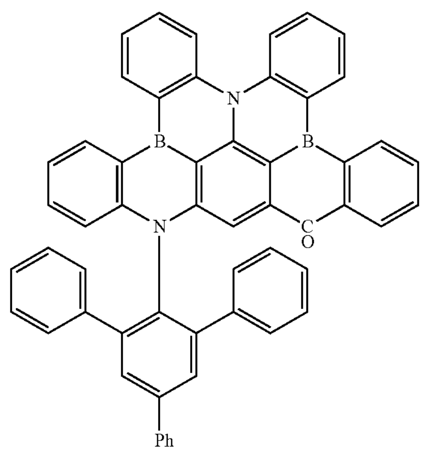
46
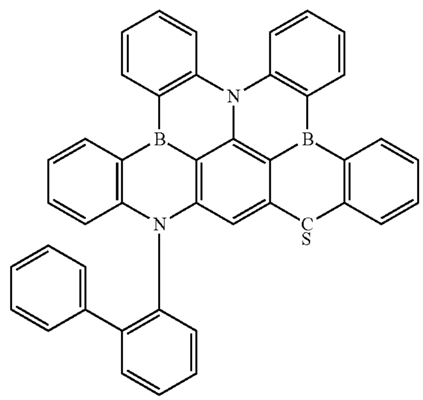
47
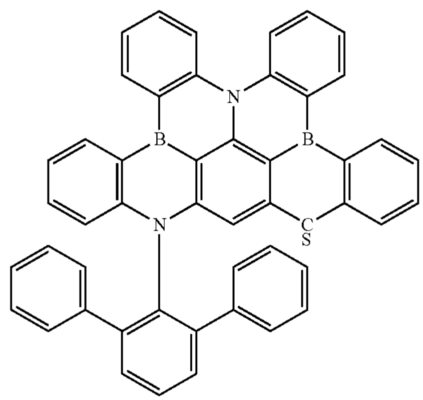
48
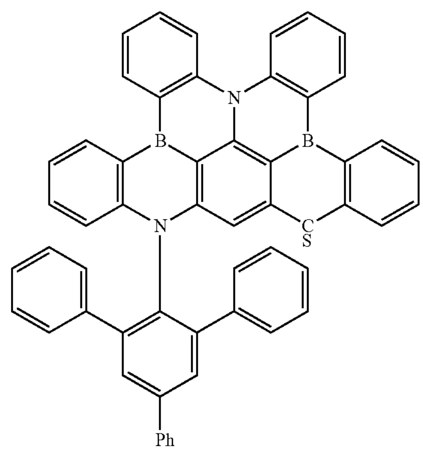
49
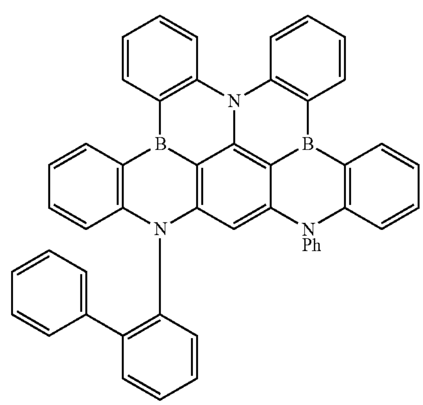
50
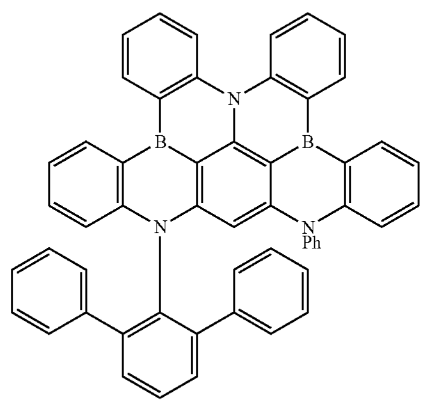

-continued
51
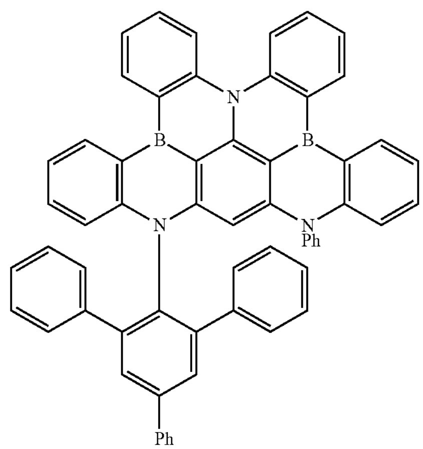
52
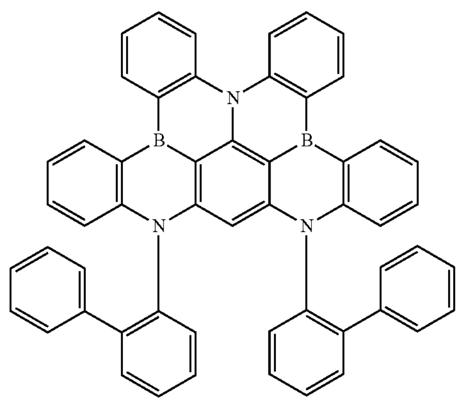
53
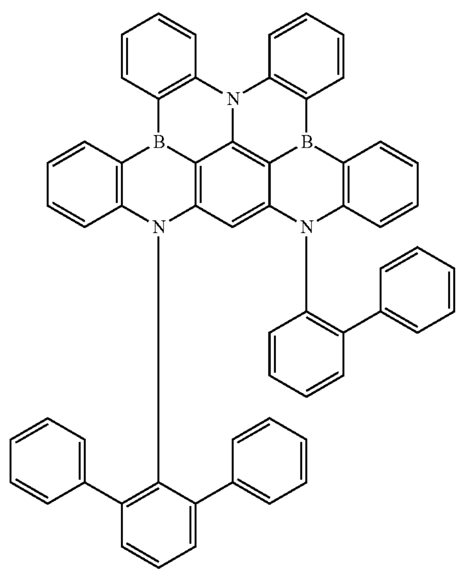
-continued
54
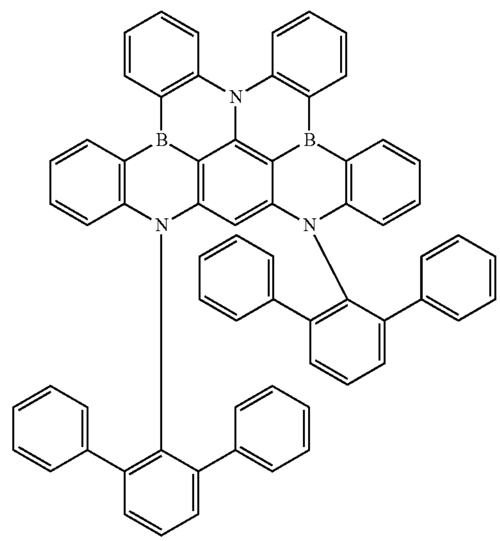
55
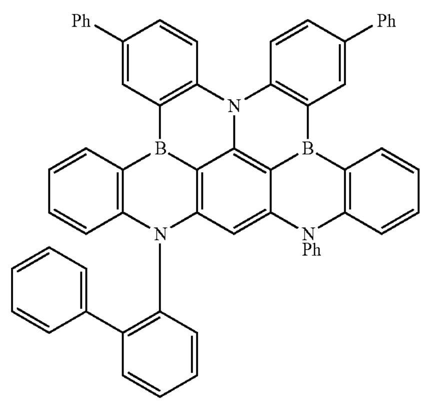
56
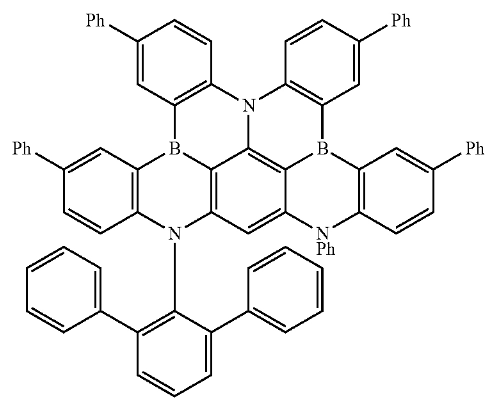

-continued
57
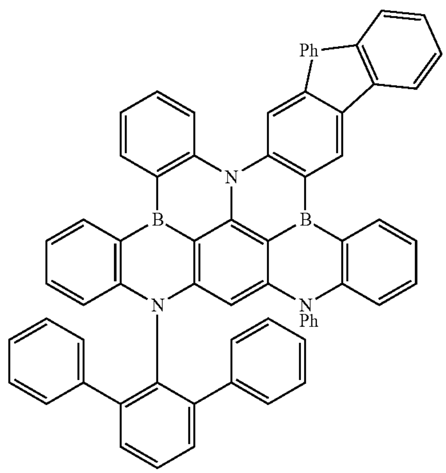
58
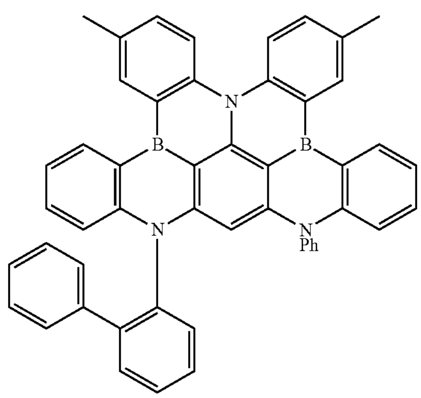
59
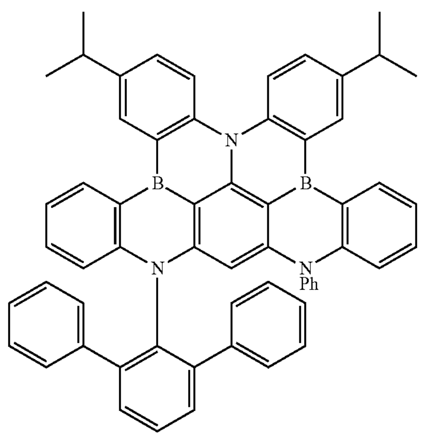
-continued
60
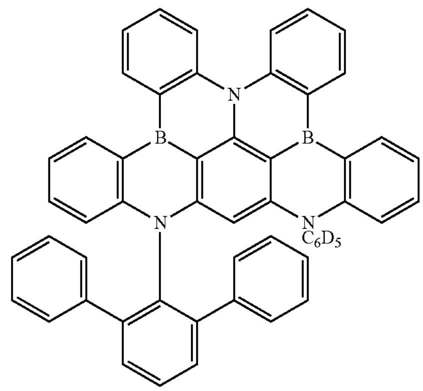
61
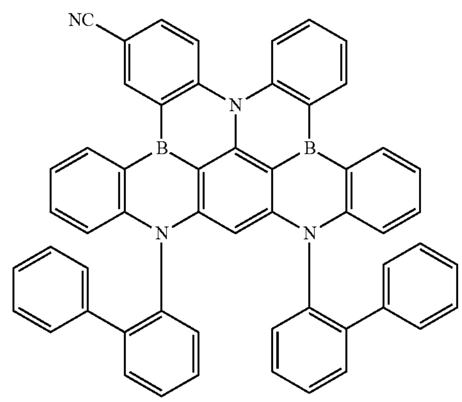
62
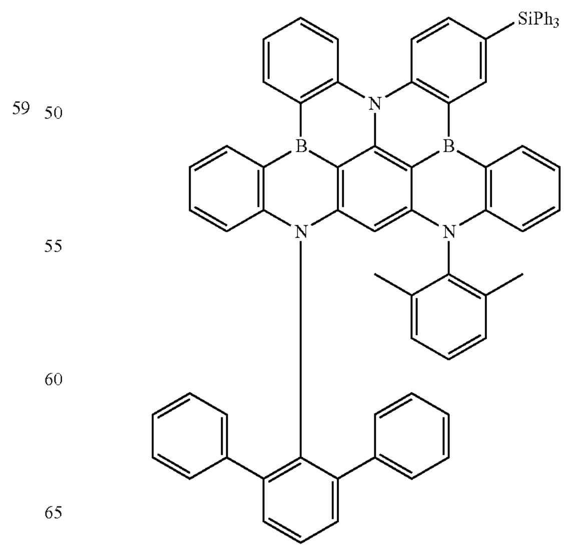

-continued
63
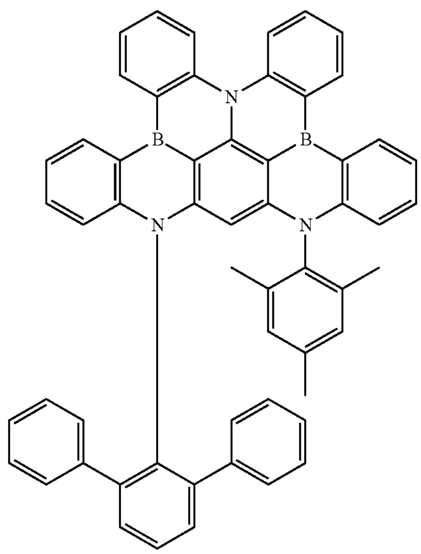
64
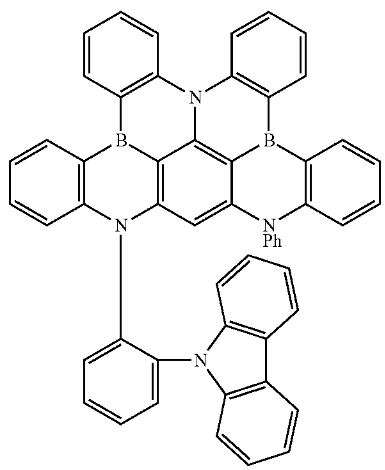
65
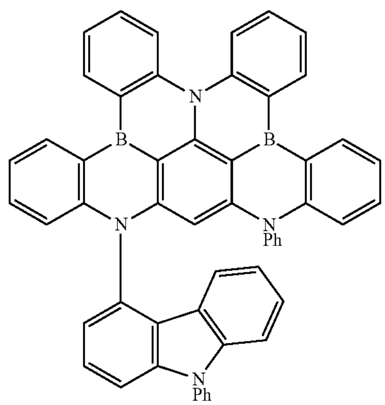
-continued
66
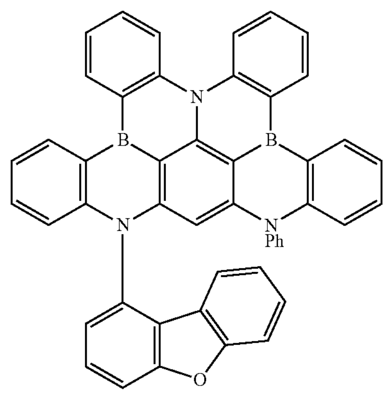
67
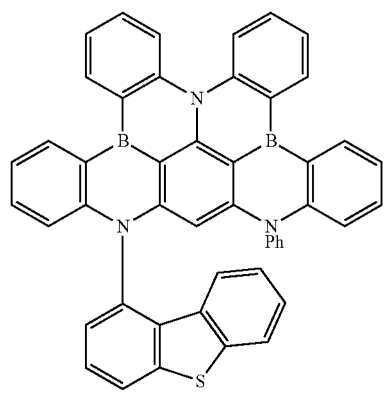
68
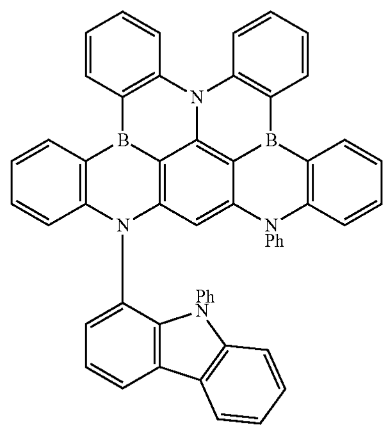
69
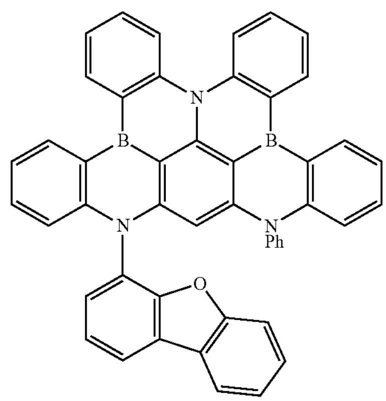

-continued
70
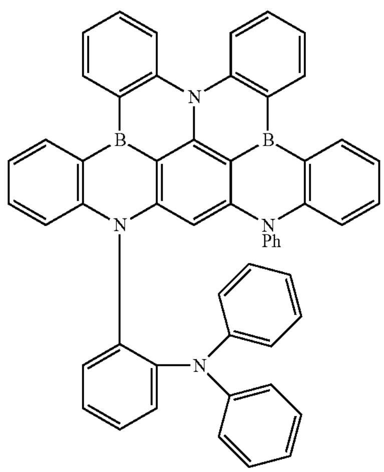
71
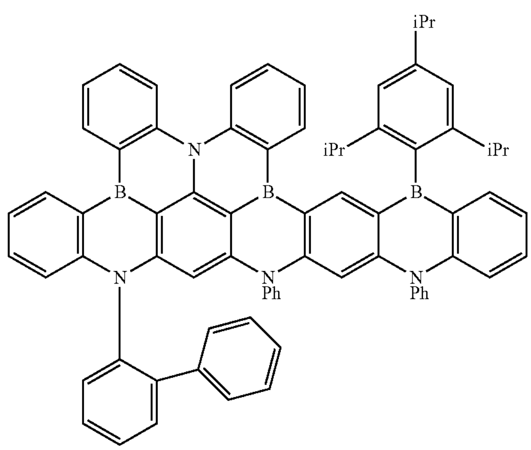
72
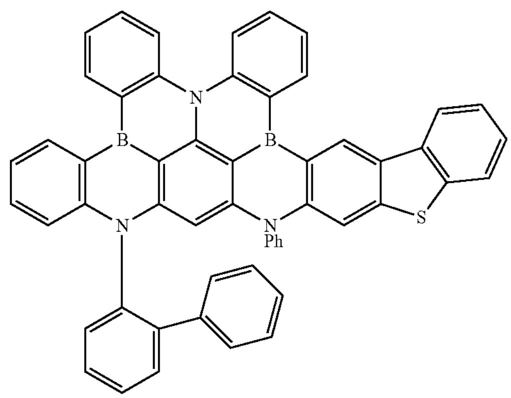
-continued
73
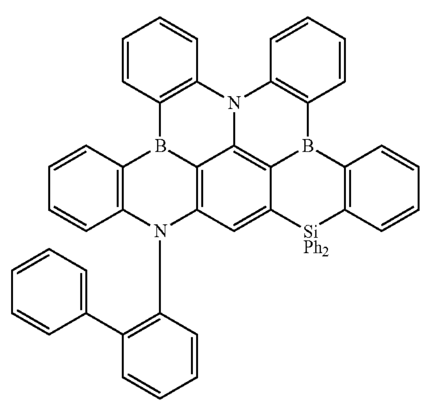
74
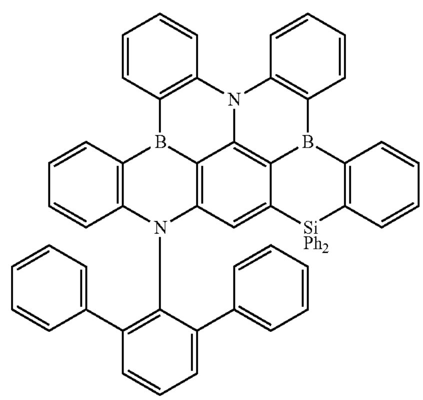
75
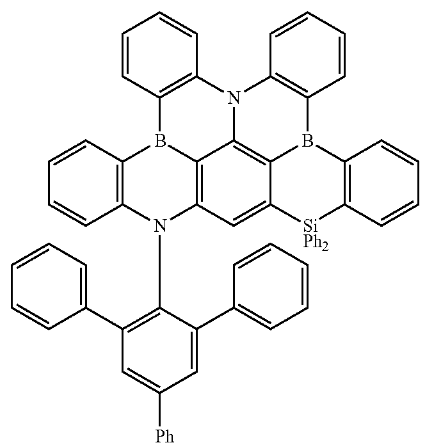
76
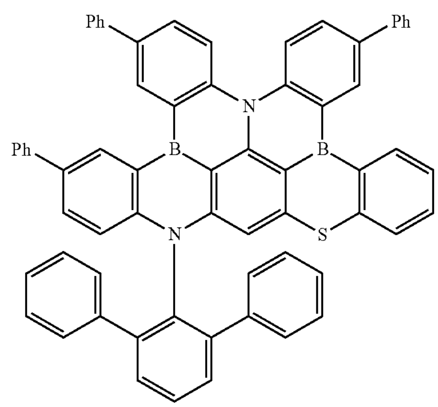

-continued
77
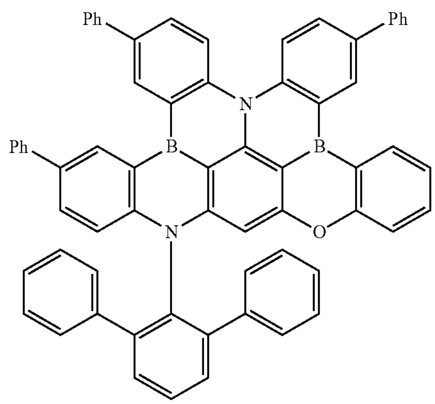
78
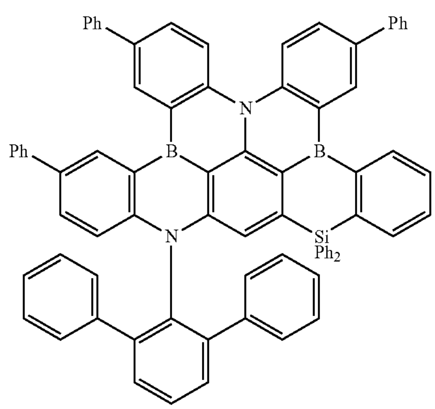
79
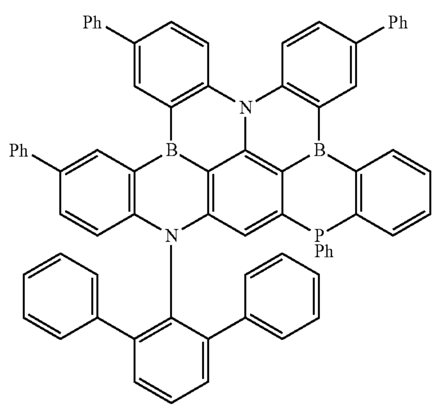
80
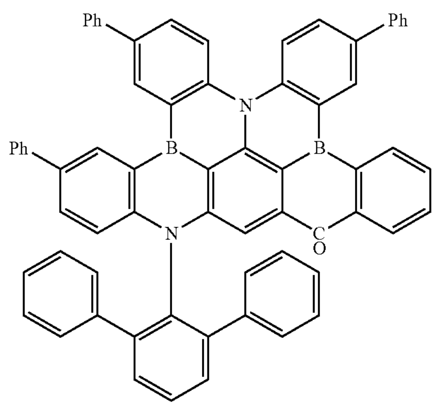
-continued
81
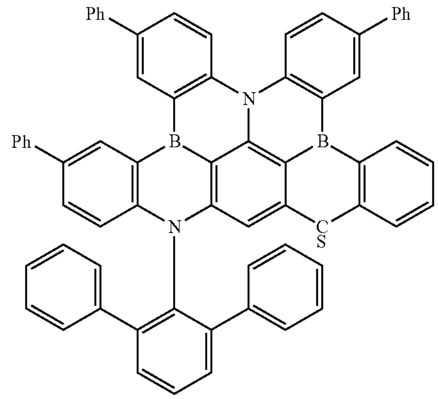
82
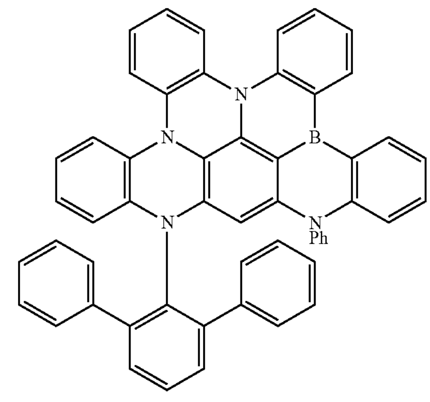
83
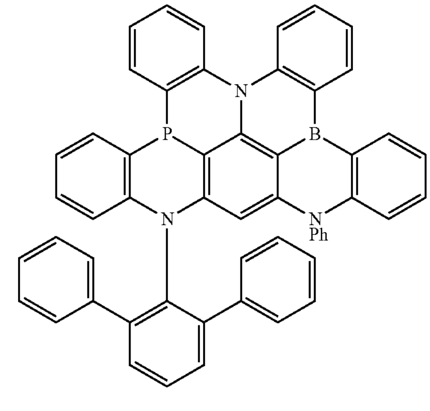
84
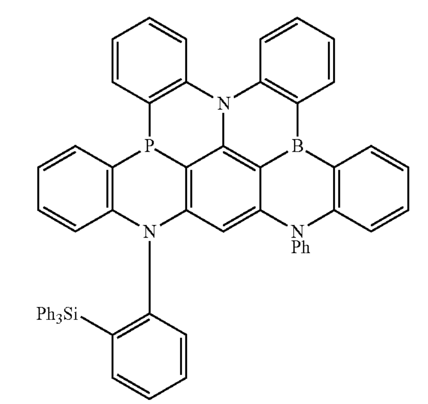

-continued
85
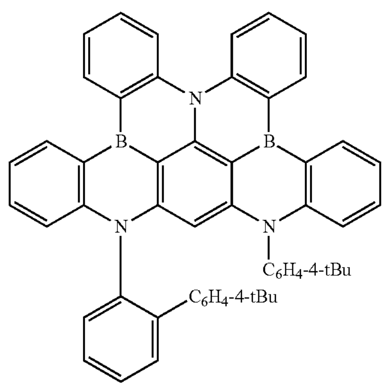
86
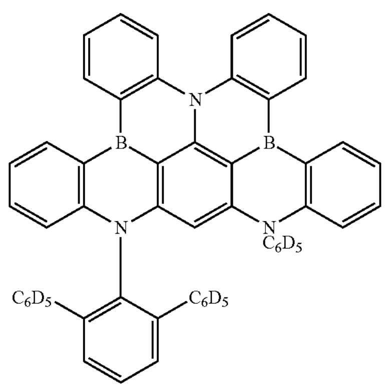
87
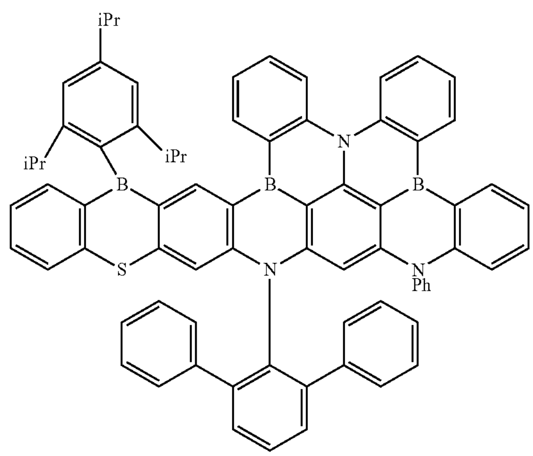
-continued
88
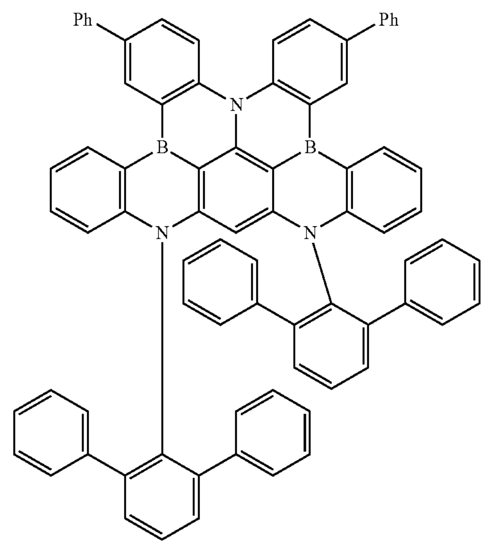
89
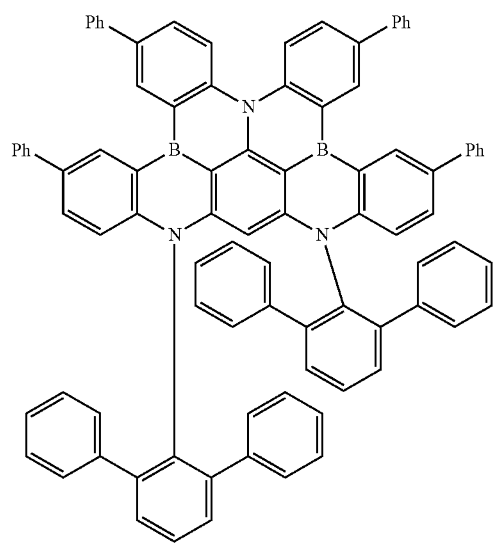

-continued
90
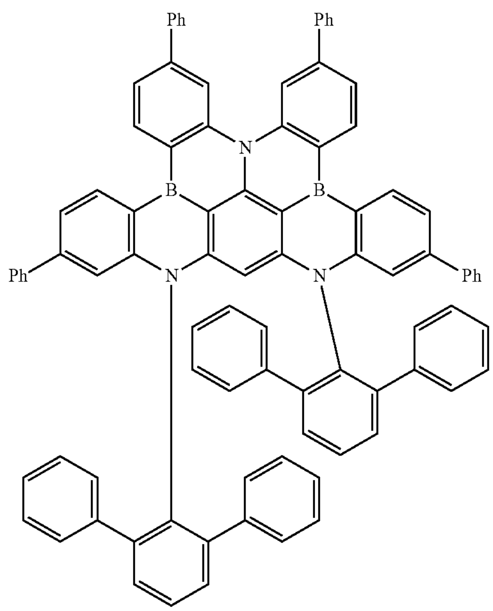
91
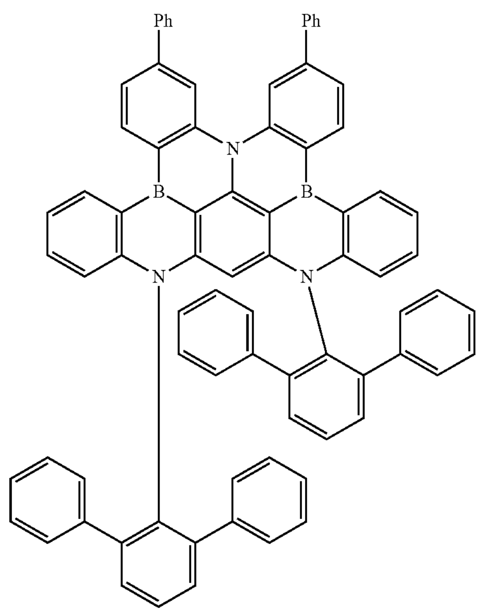
92
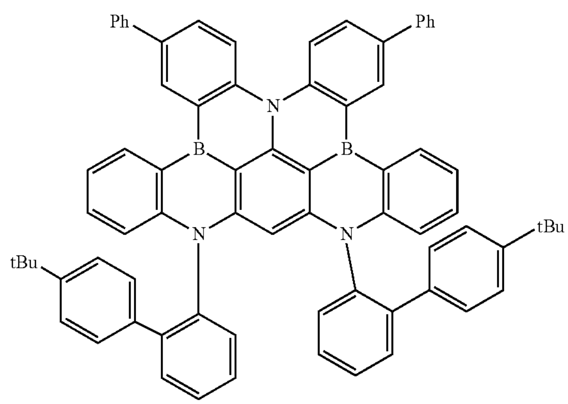
-continued
93
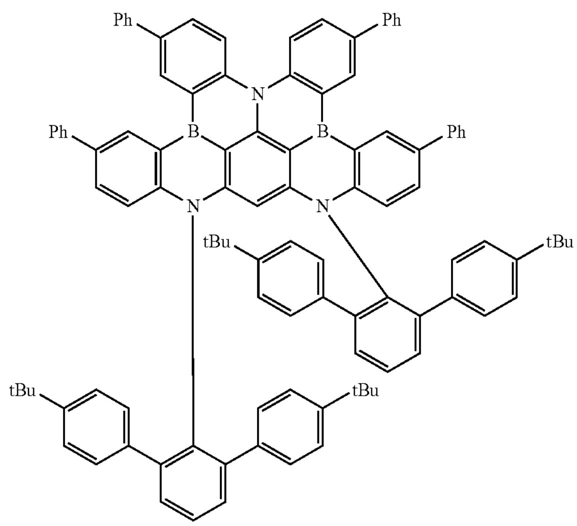
94
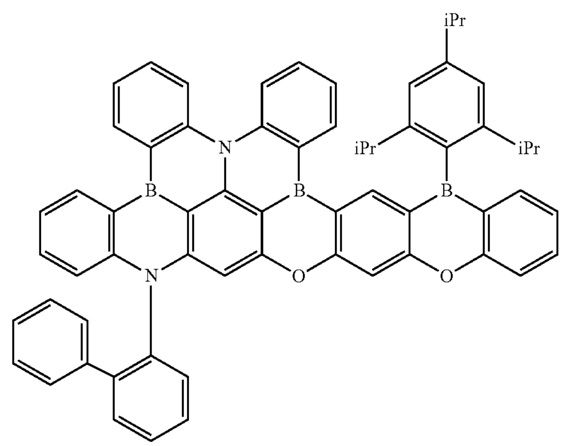
95
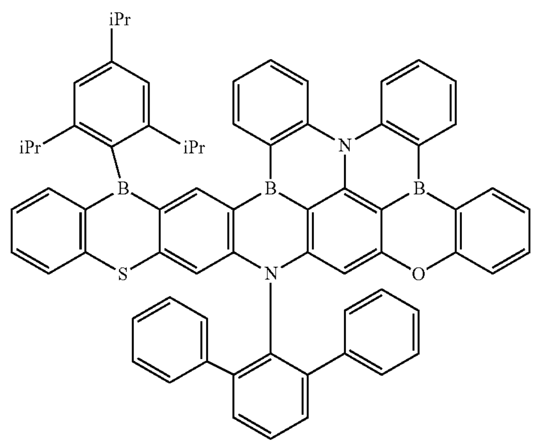

-continued
96
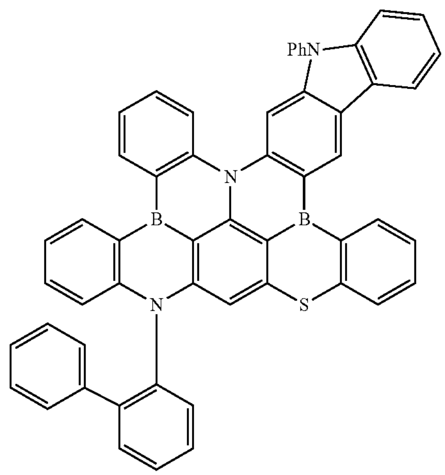
97
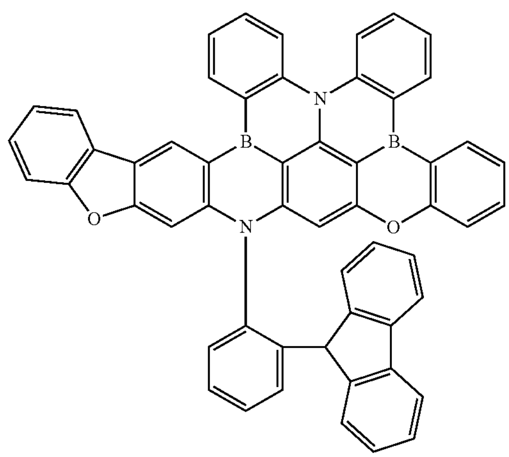
98
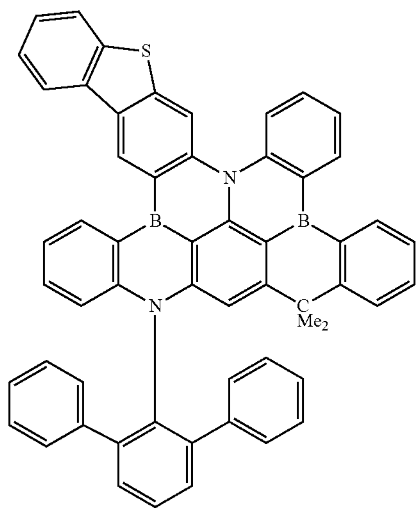
-continued
99
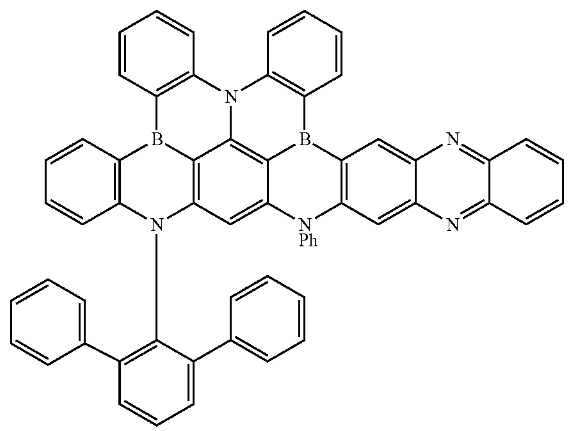
100
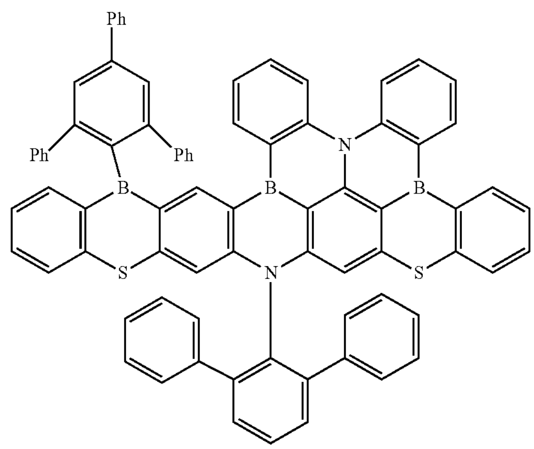
101
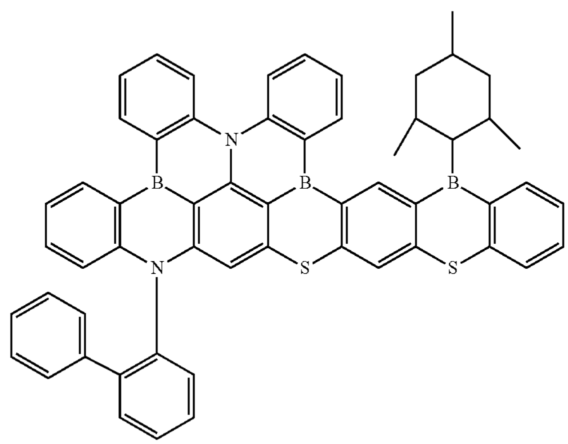

-continued
102
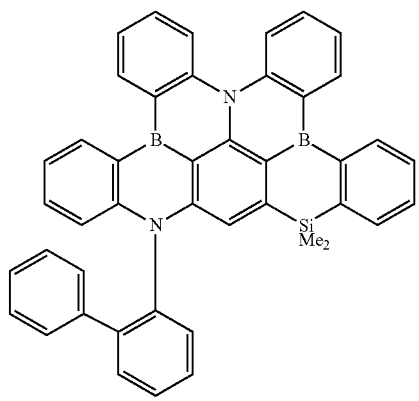
103
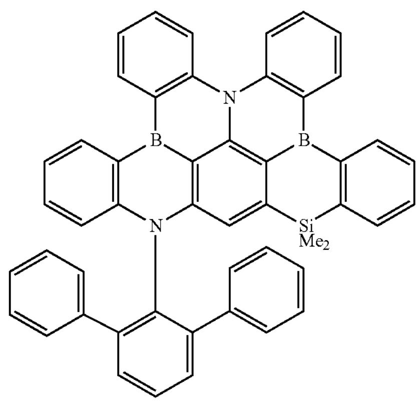
104
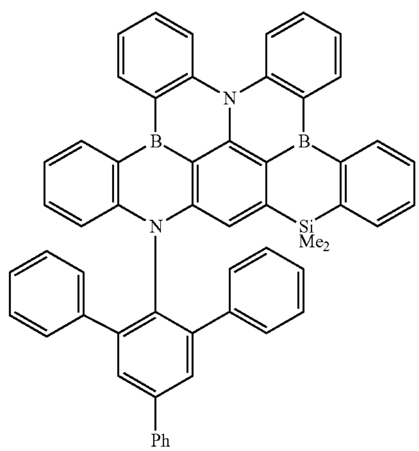
105
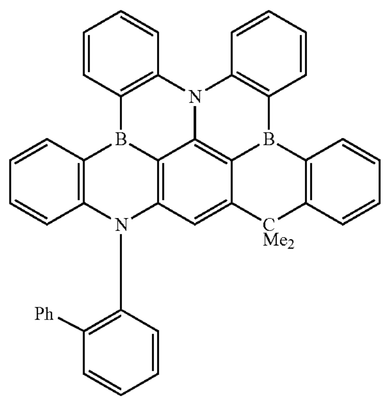
-continued
106
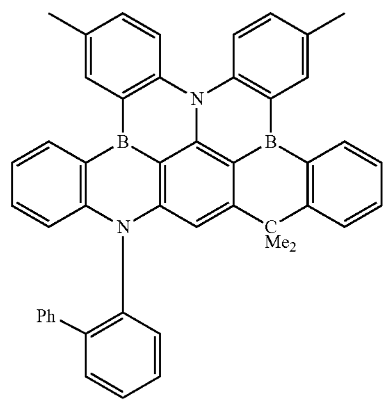
107
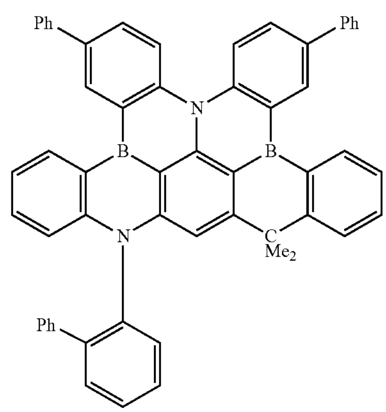
108
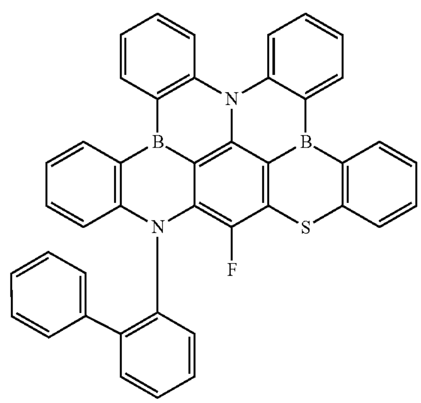
109
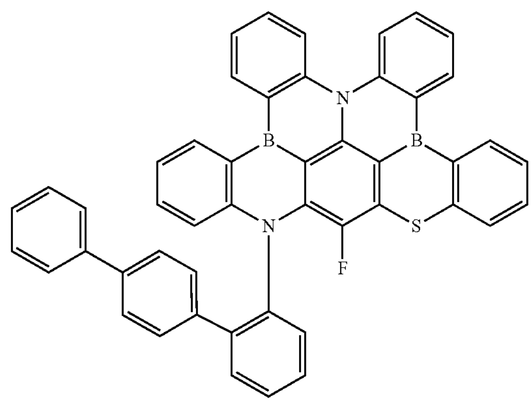

-continued
110
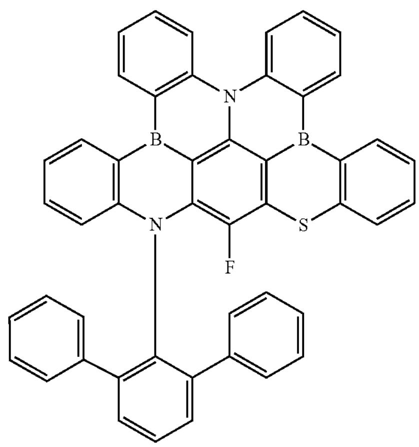
111
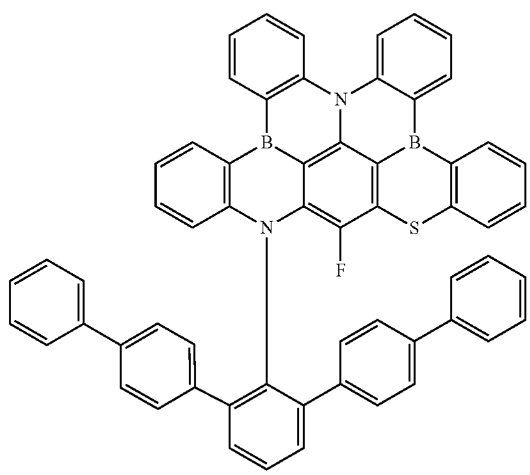
112
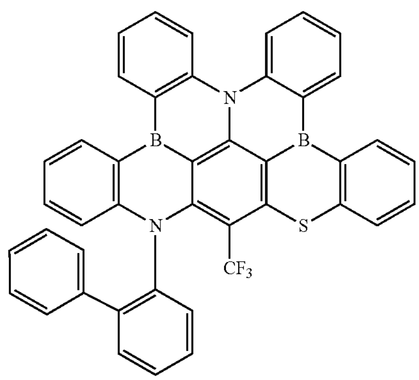
-continued
113
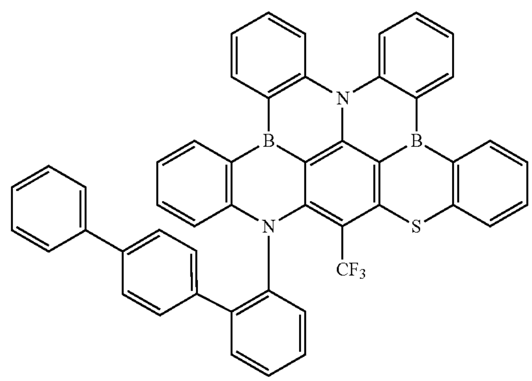
114
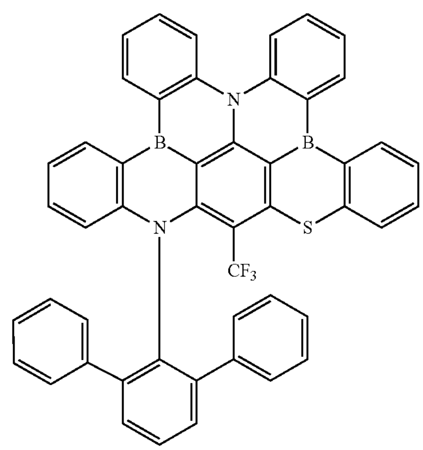
115
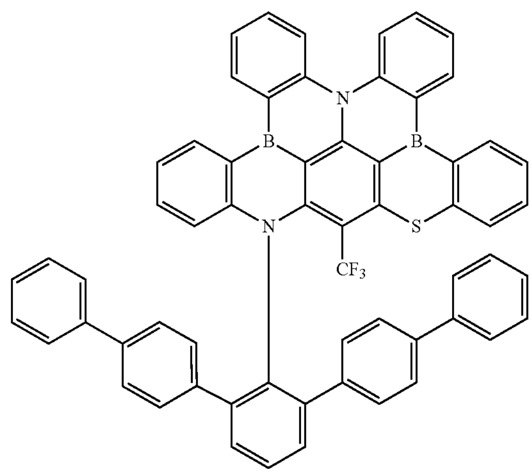

-continued
116
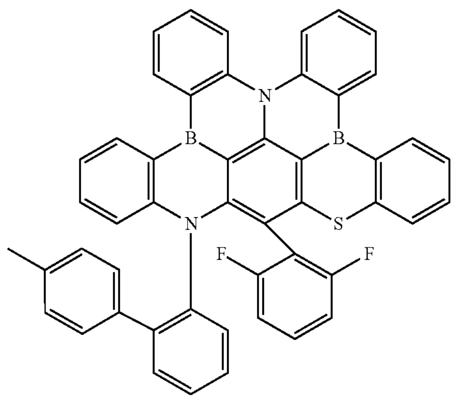
117
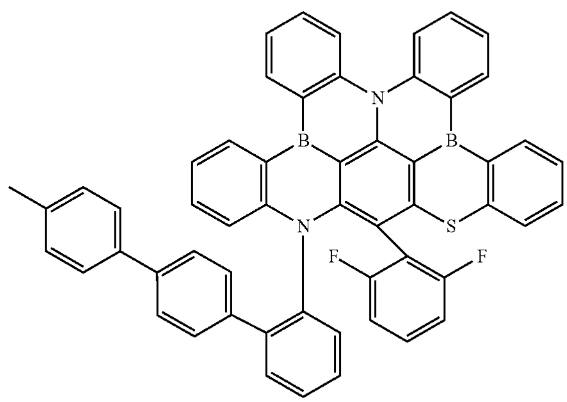
118
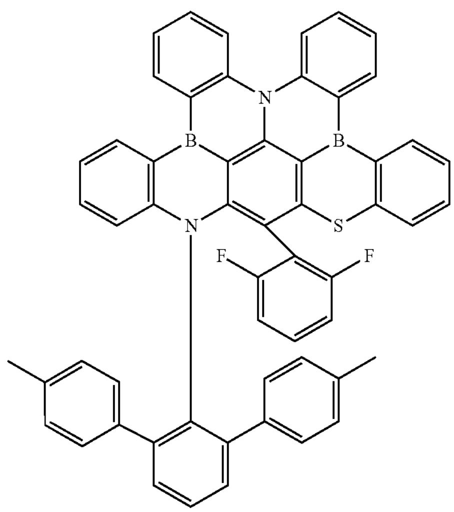
-continued
119
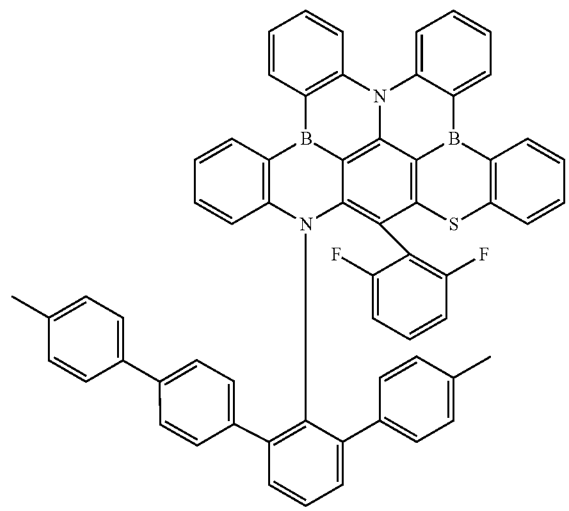
120
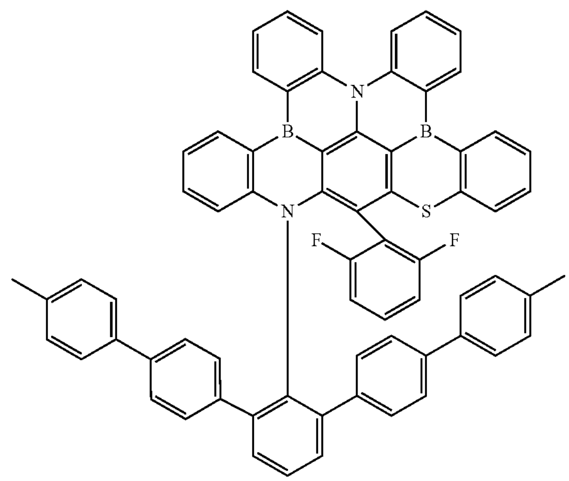
121
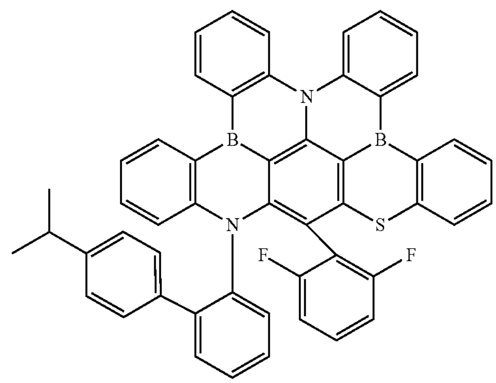

-continued
122
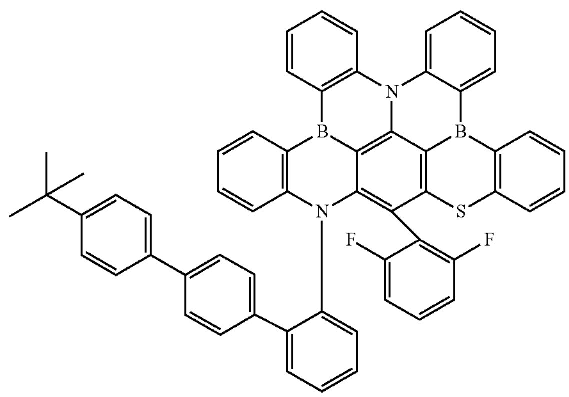
123
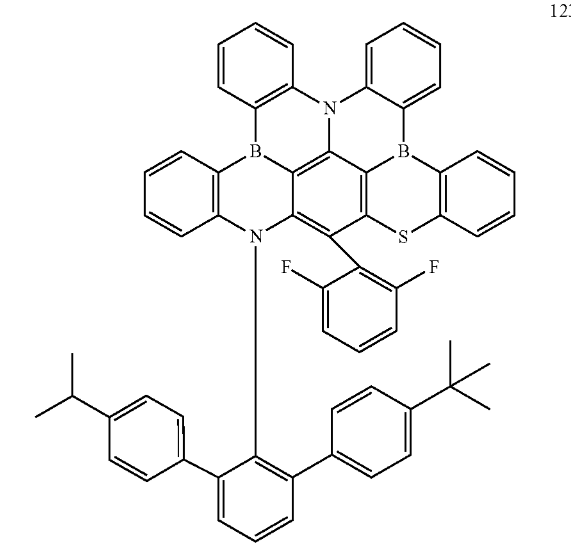
124
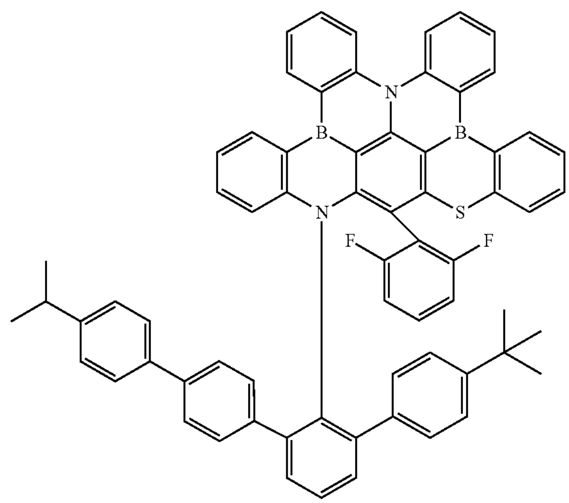
-continued
125
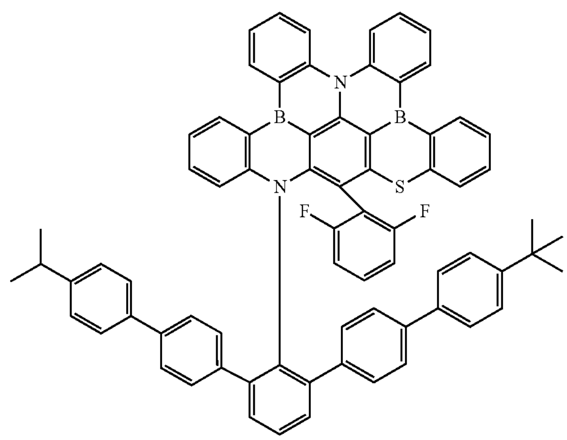
[Compound Group 2]
2-1
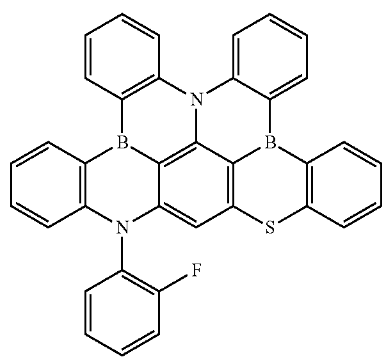
2-2
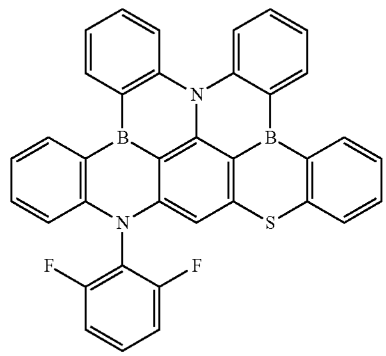
2-3
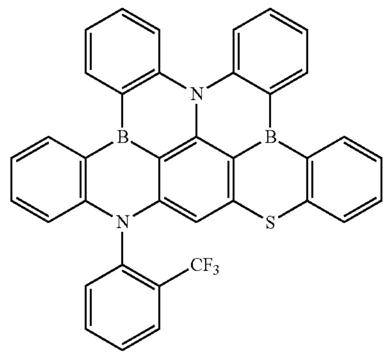

-continued
2-4
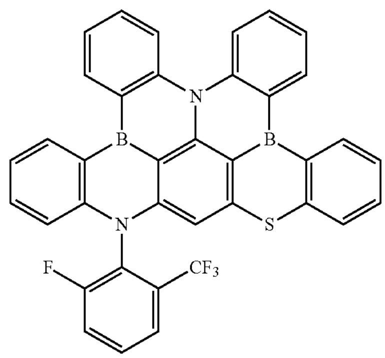
2-5
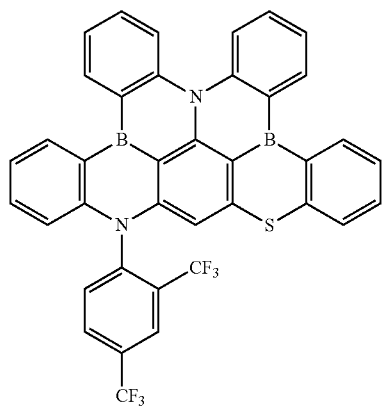
2-6
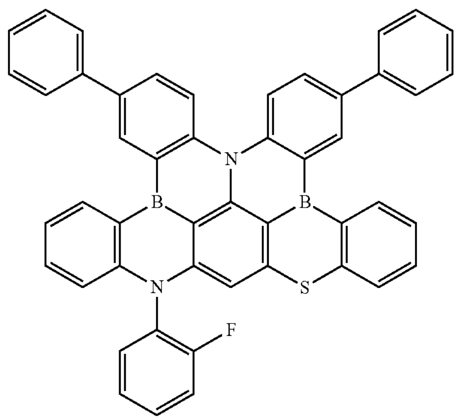
2-7
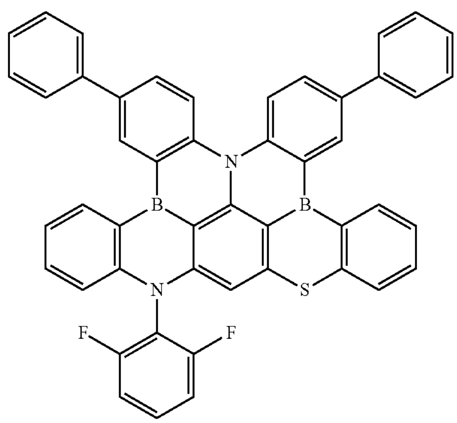
-continued
2-8
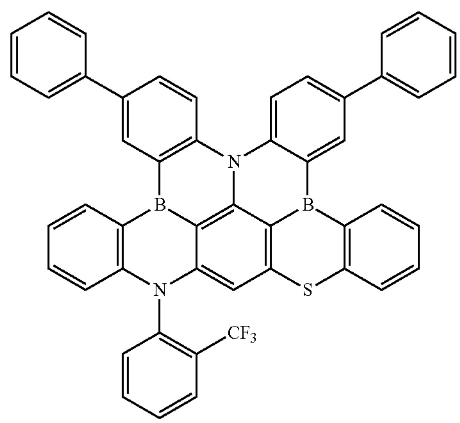
2-9
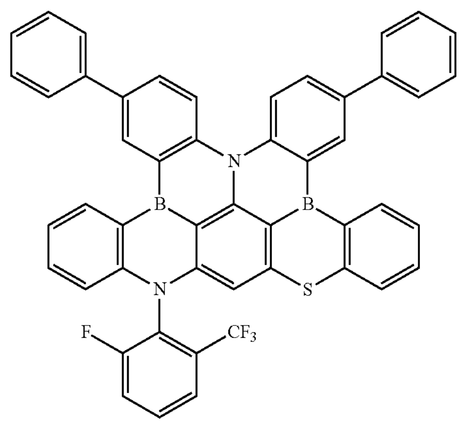
2-10
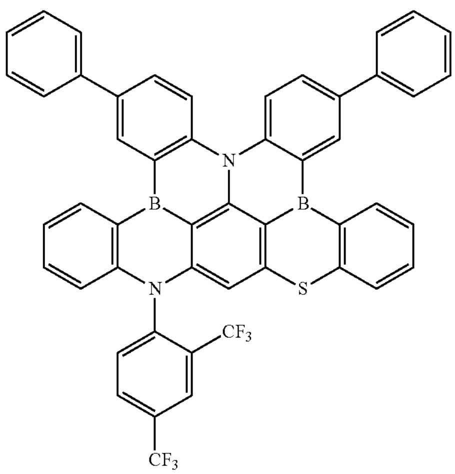

-continued
2-11
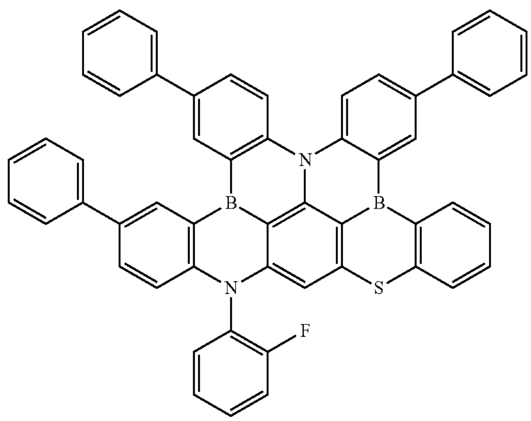
2-12
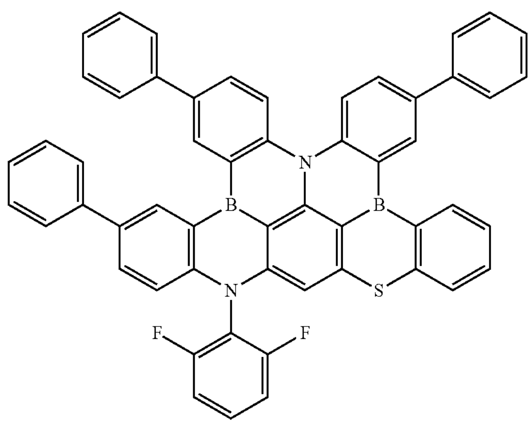
2-13
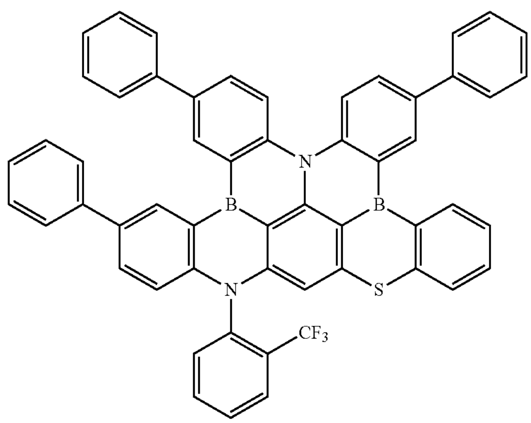
-continued
2-14
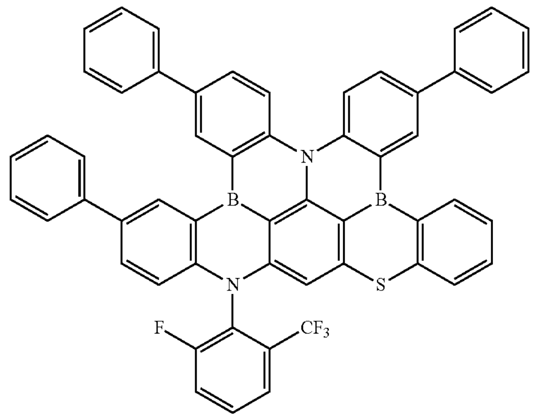
2-15
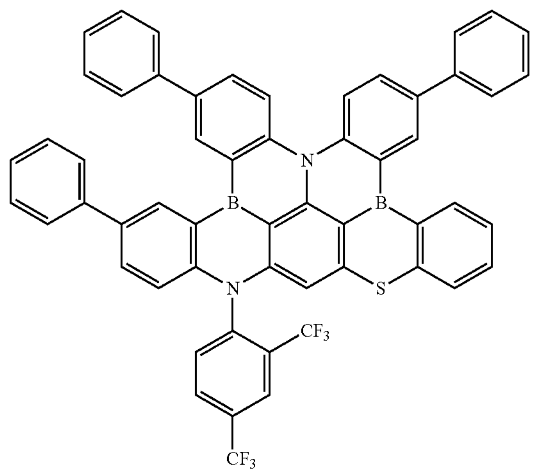
2-16
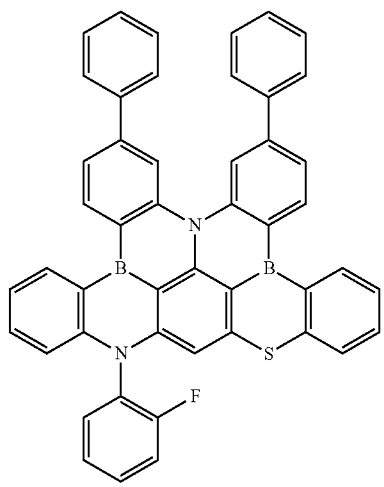

-continued
2-17
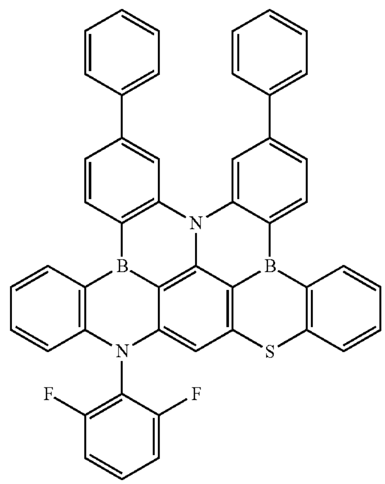
2-18
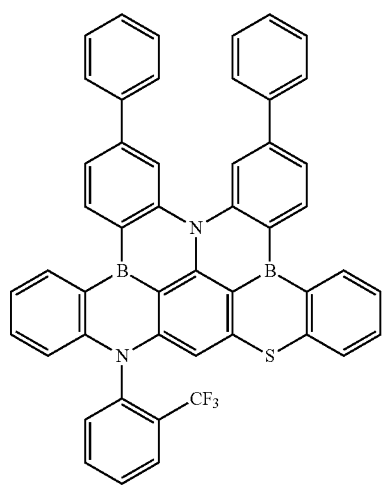
2-19
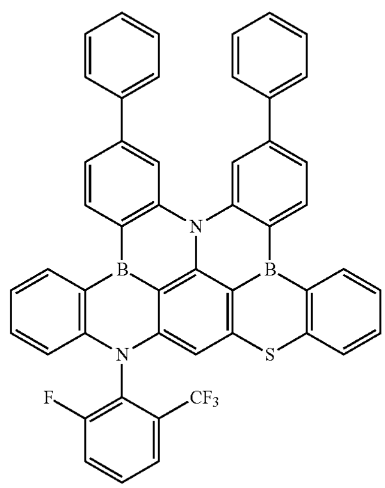
-continued
2-20
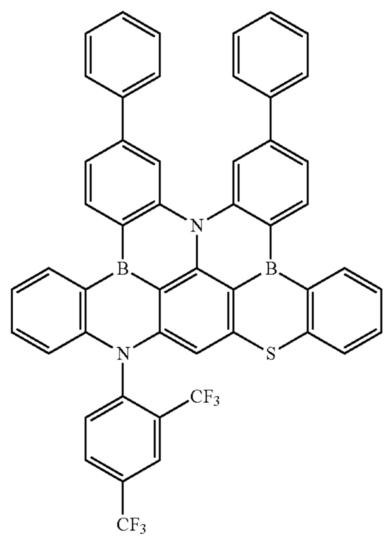
2-21
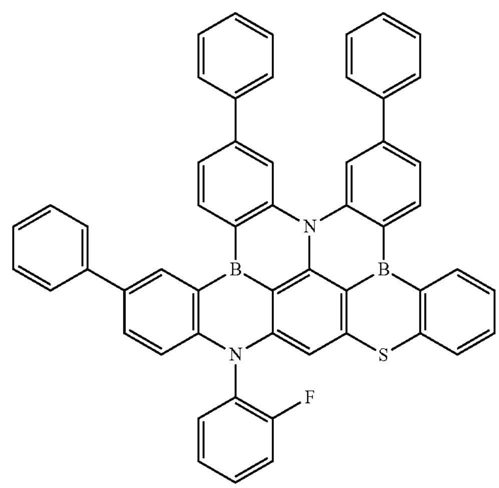
2-22
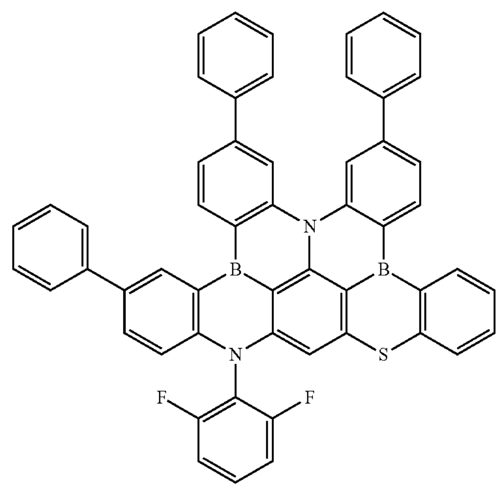

-continued
2-23
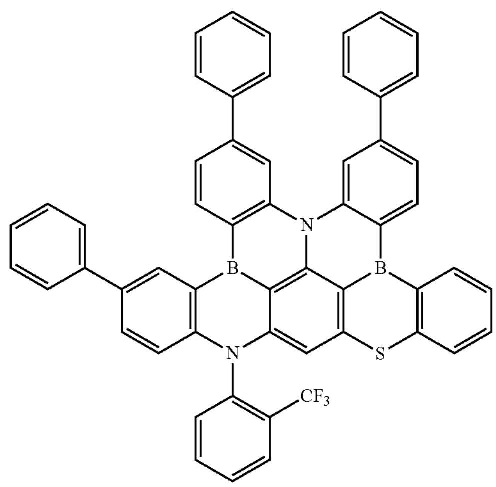
2-24
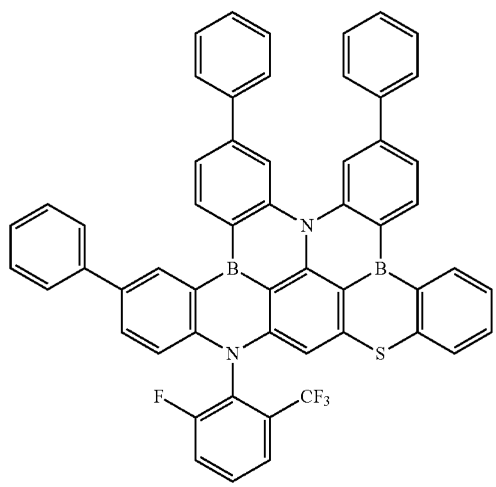
2-25
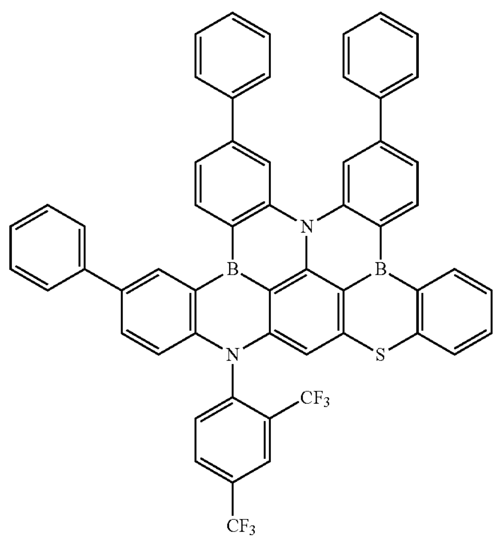
-continued
2-26
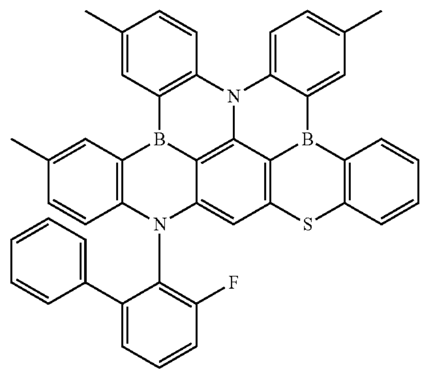
2-27
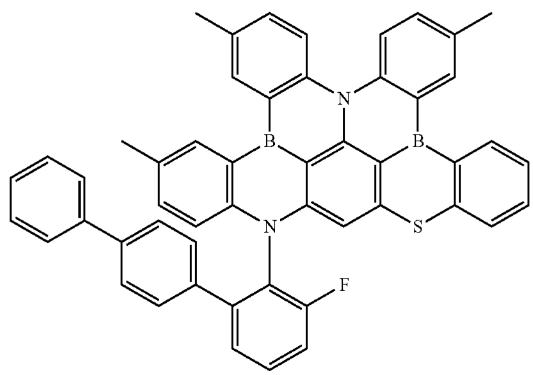
2-28
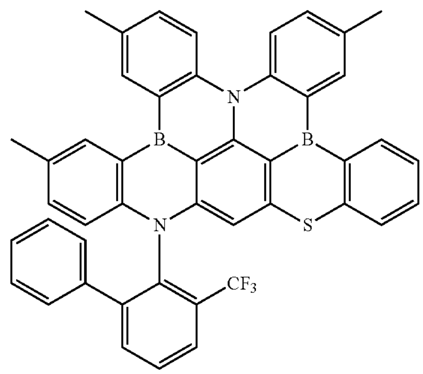
2-29
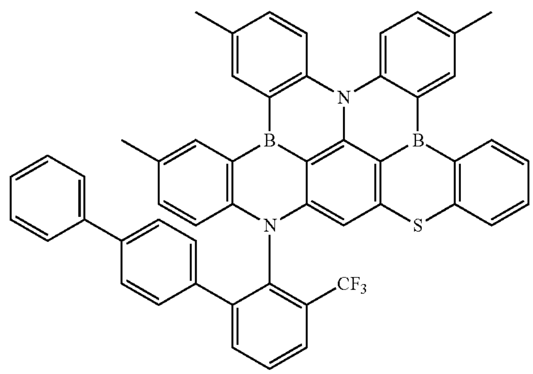

-continued
2-30
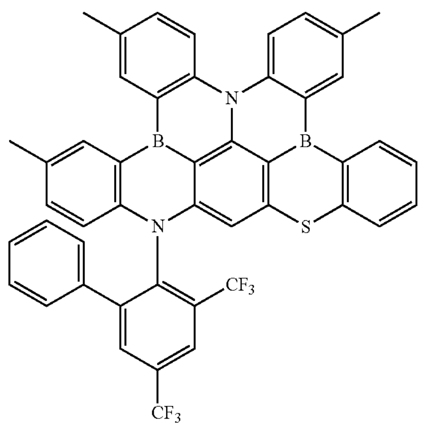
2-31
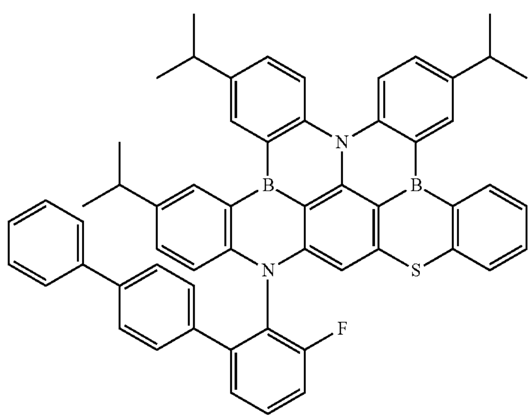
2-32
-continued
2-33
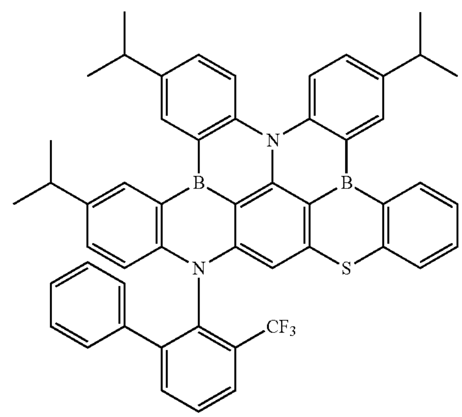
2-34
2-35
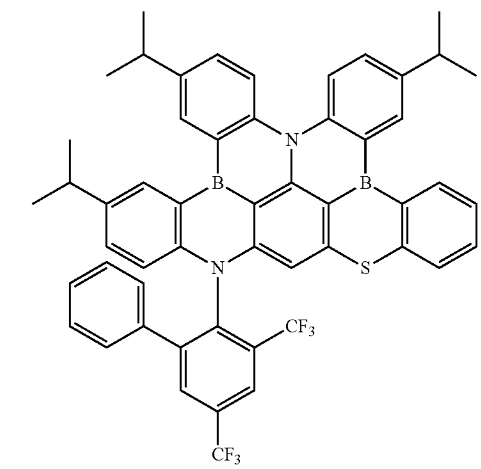

-continued
2-36
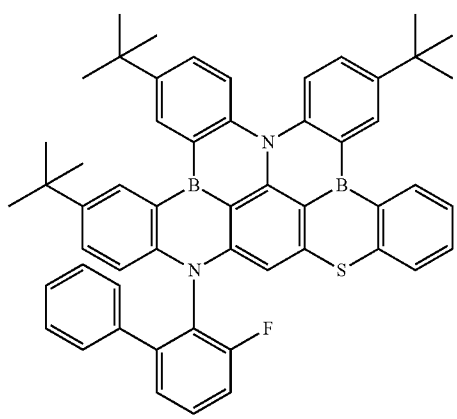
2-37
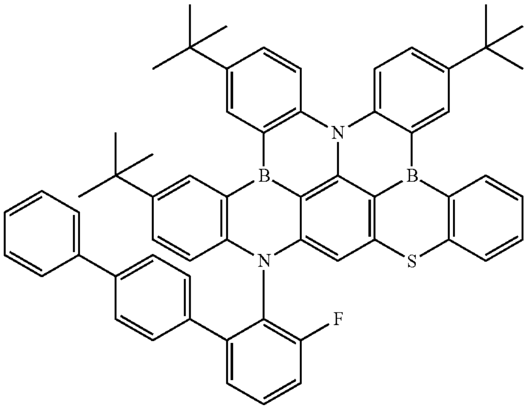
2-38
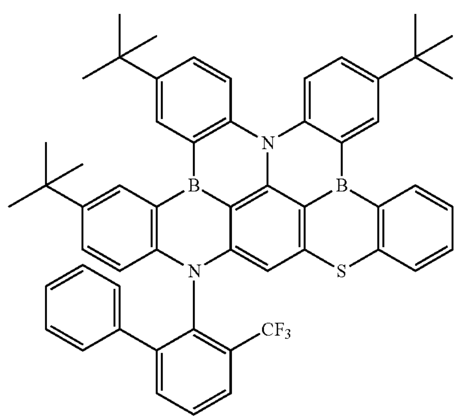
-continued
2-39
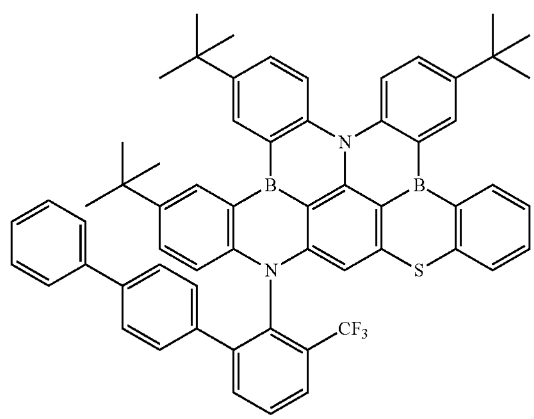
2-41
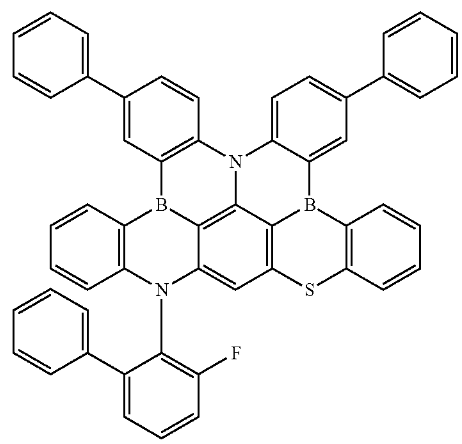
2-42
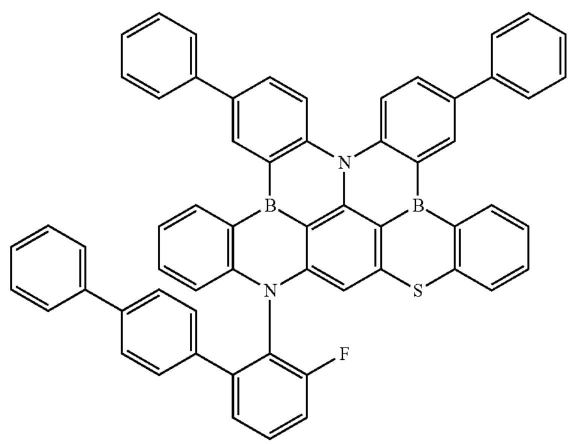

-continued
2-43
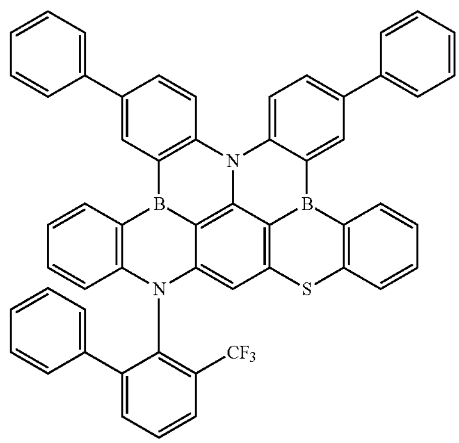
2-44
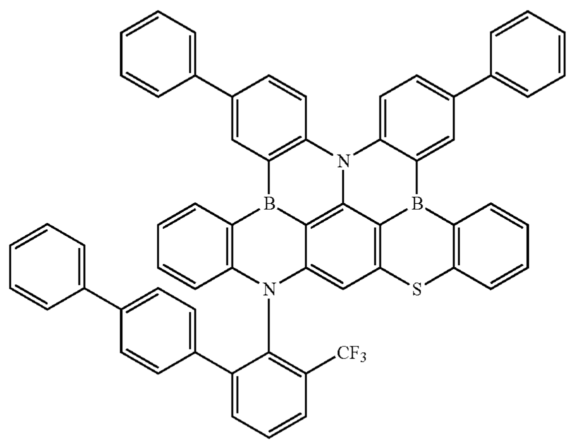
2-45
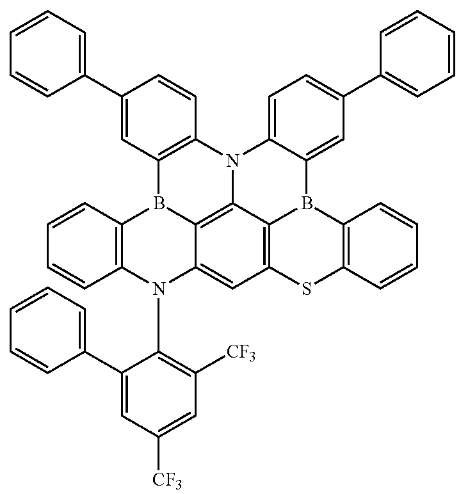
-continued
2-46
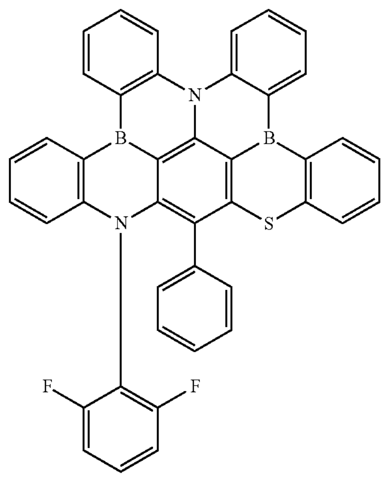
2-47
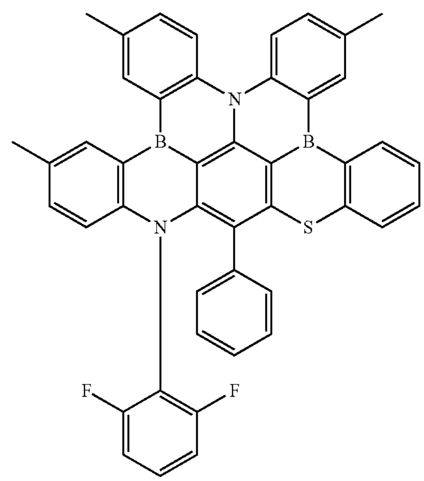
2-48
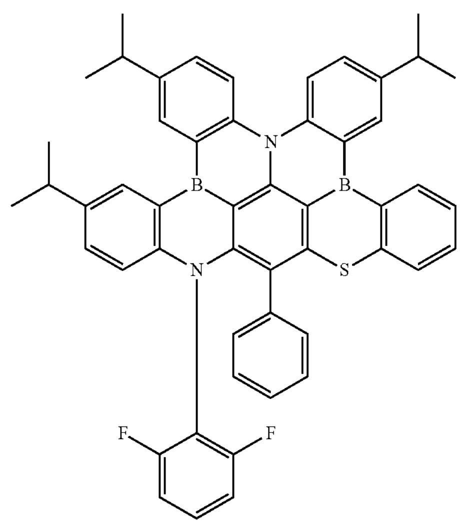

-continued
2-49
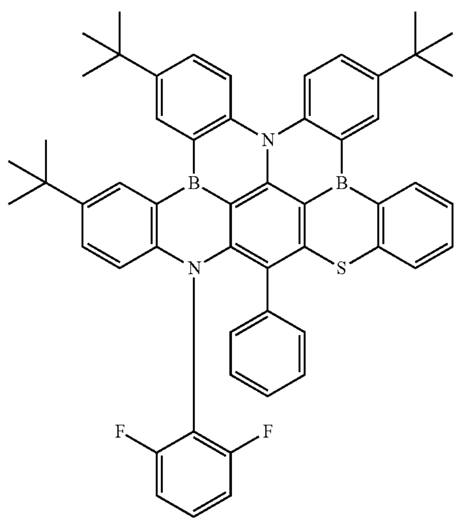
2-50
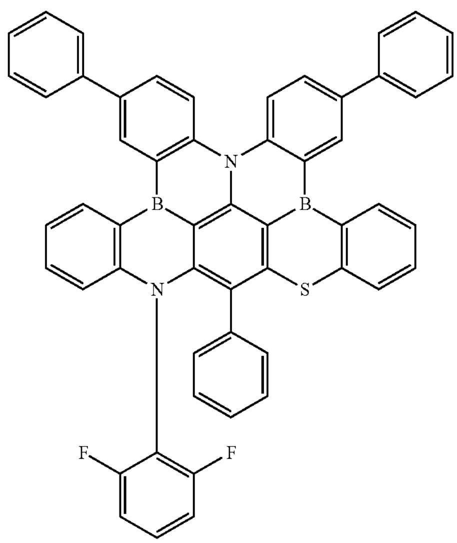
2-51
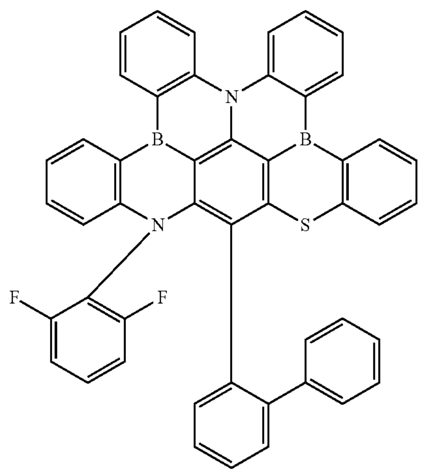
-continued
2-52
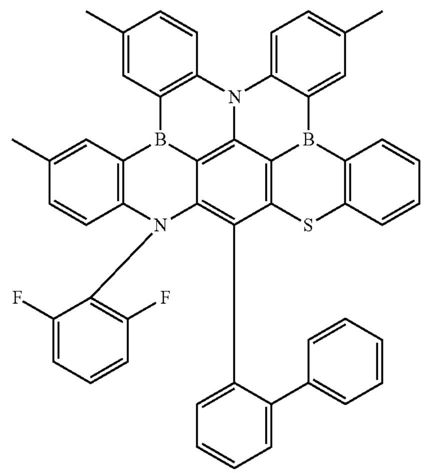
2-53
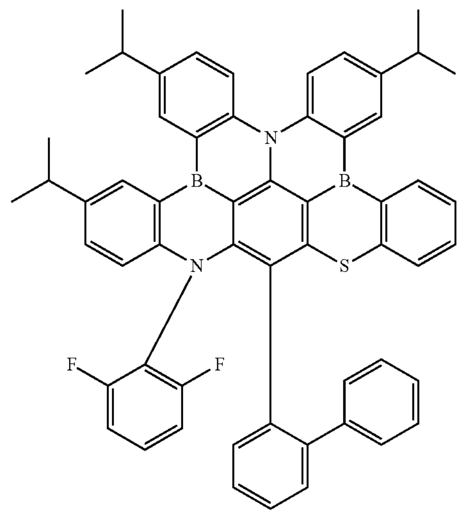
2-54
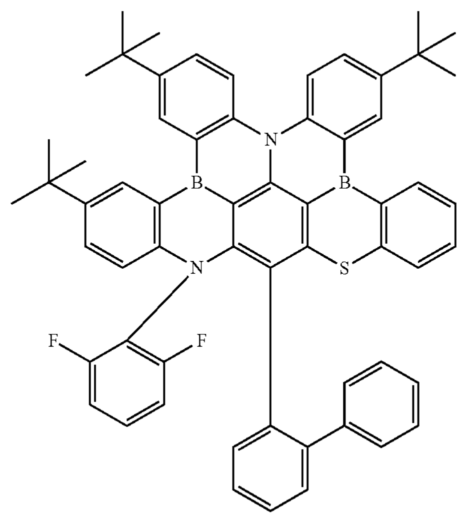

-continued
2-55
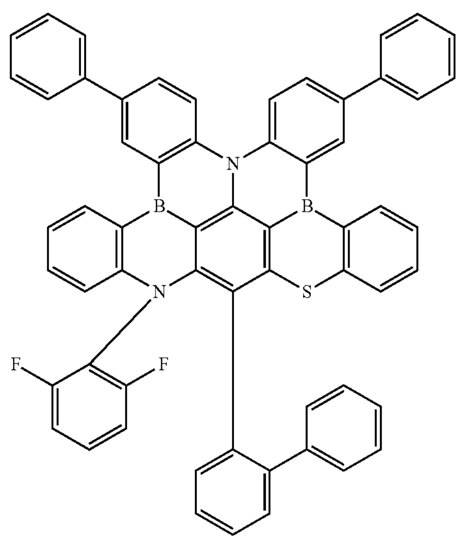
2-56
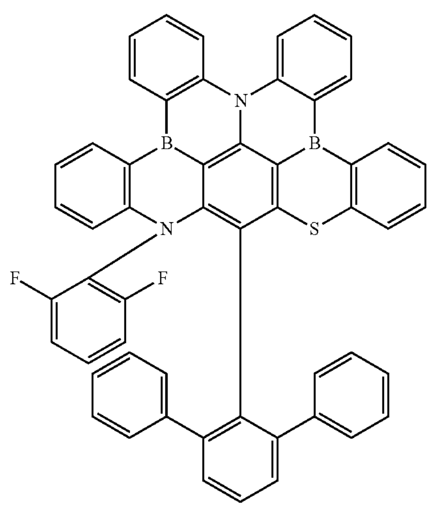
2-57
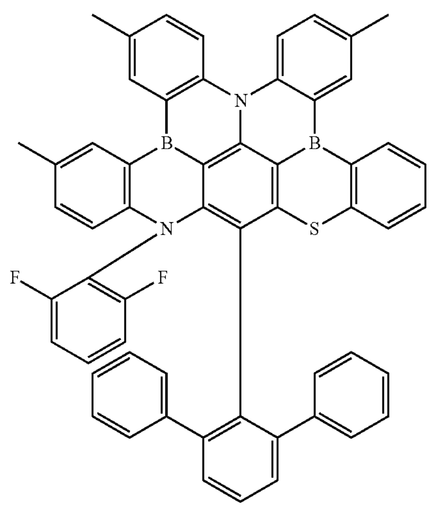
-continued
2-58
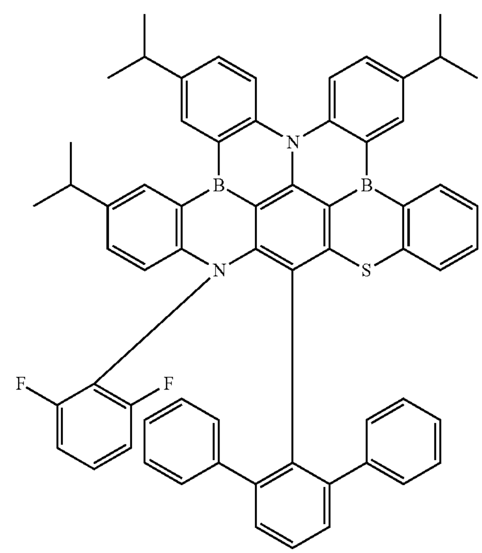
2-59
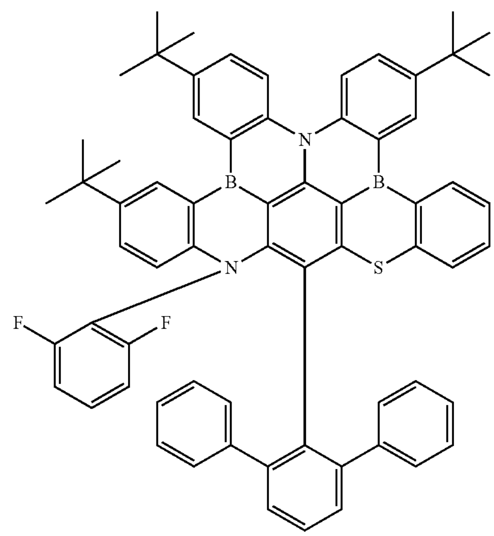

-continued
2-60
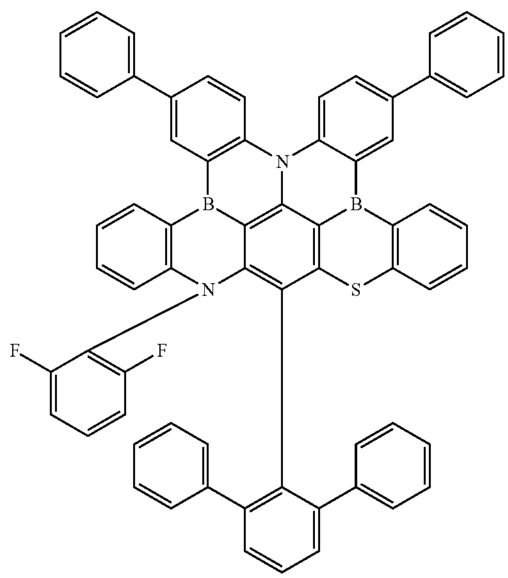
2-61
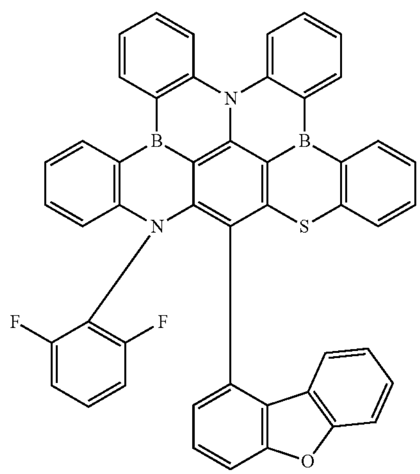
2-62
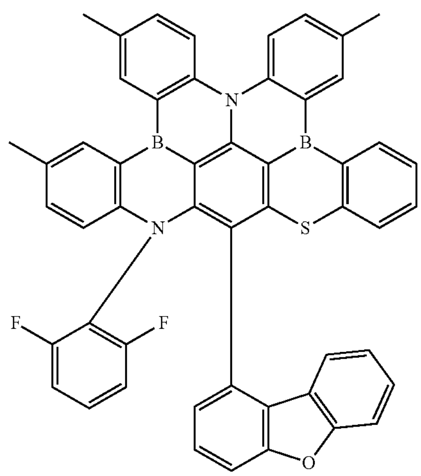
-continued
2-63
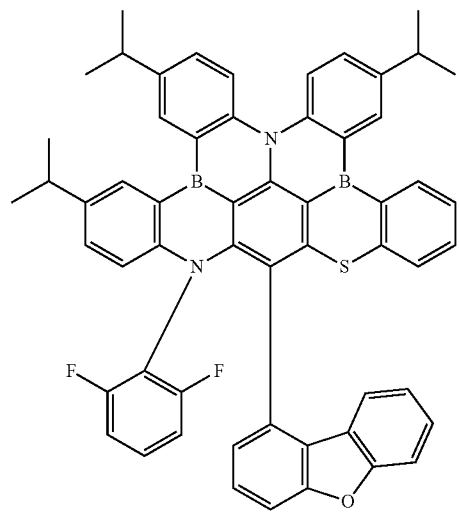
2-64
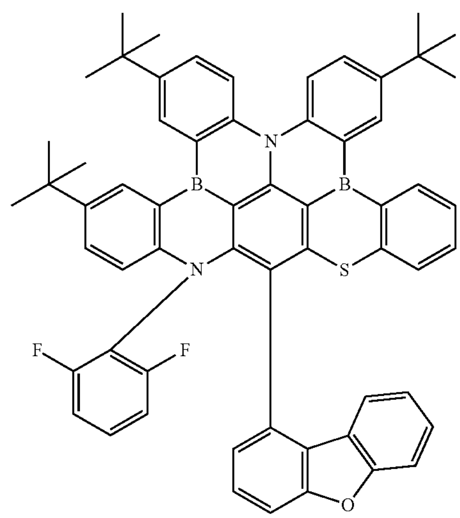
2-65
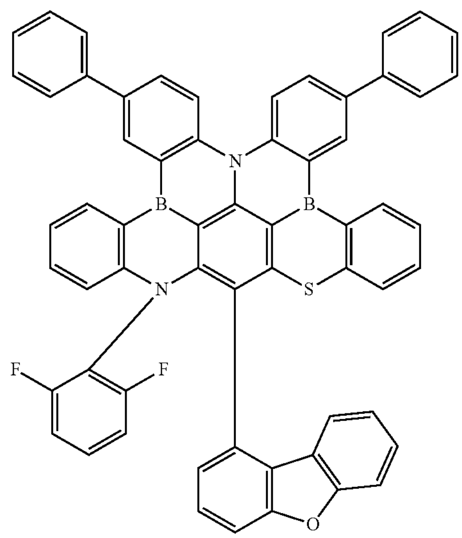

-continued
2-66
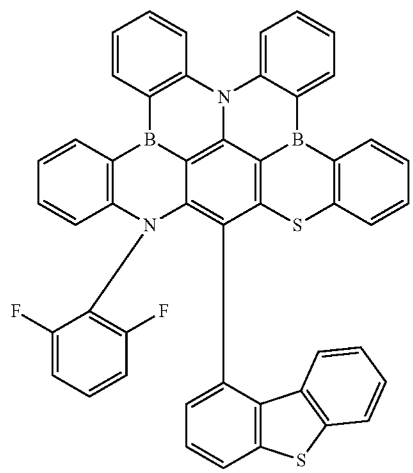
2-67
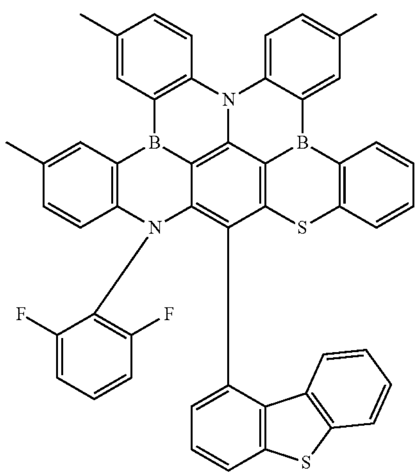
2-68
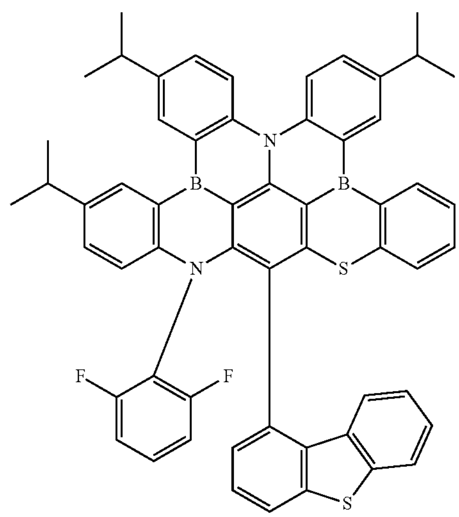
-continued
2-69
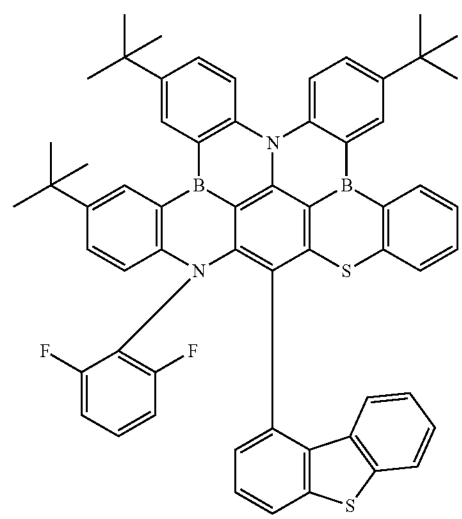
2-70
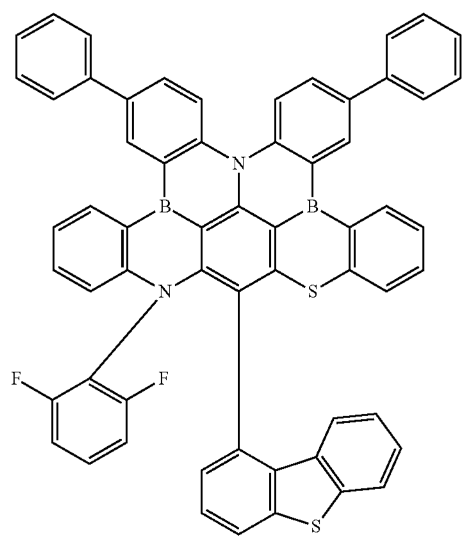
2-71
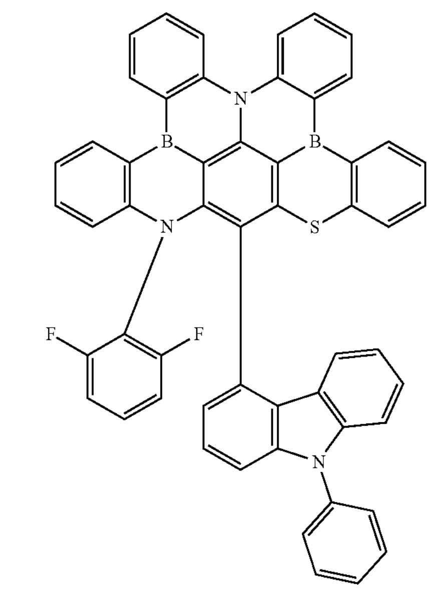

-continued
2-72
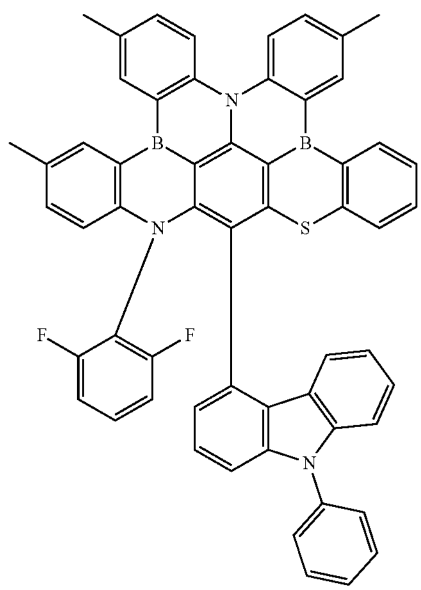
2-73
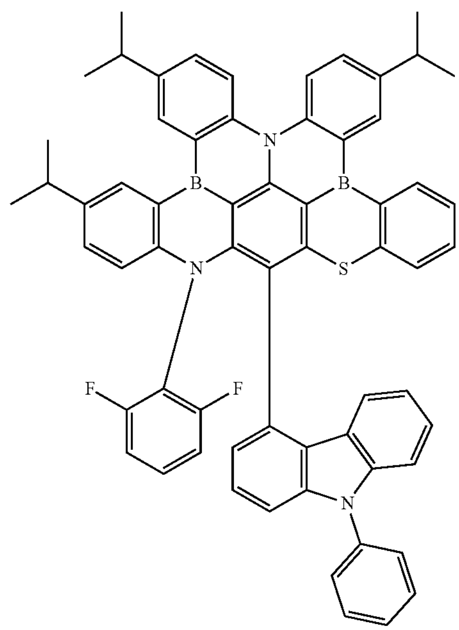
-continued
2-74
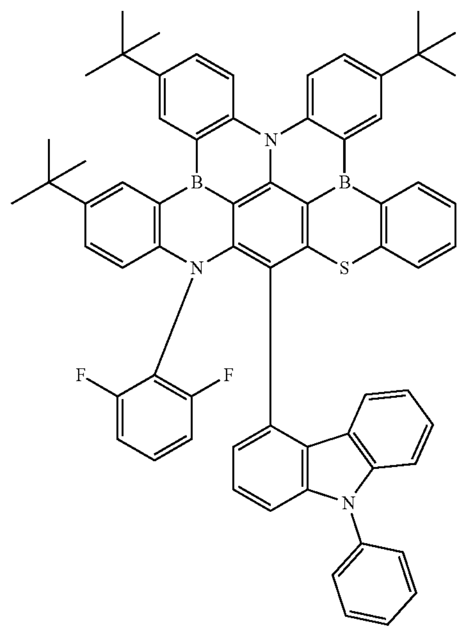
2-75
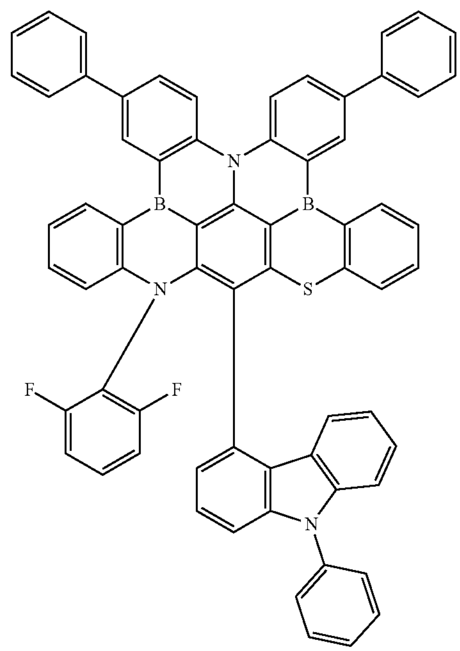
2-76
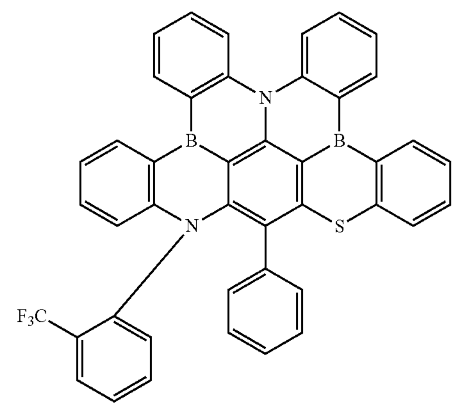

-continued
2-77
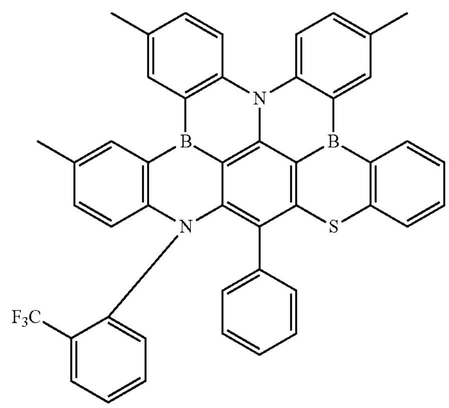
2-78
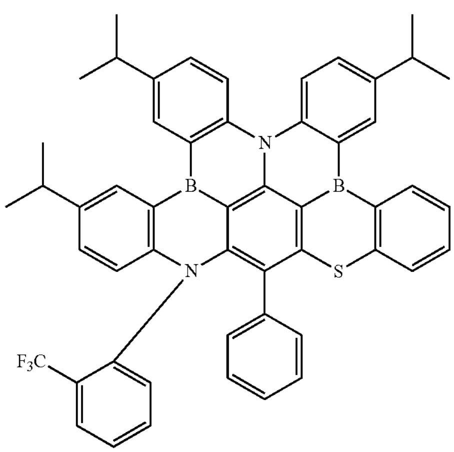
2-79
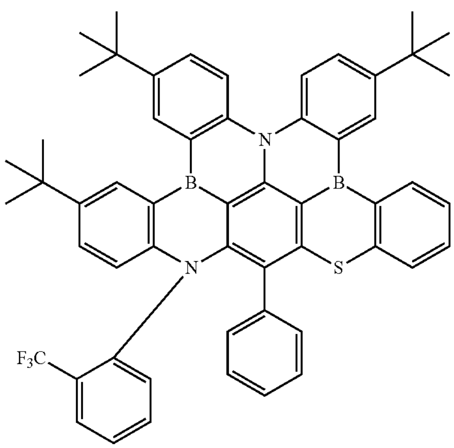
-continued
2-80
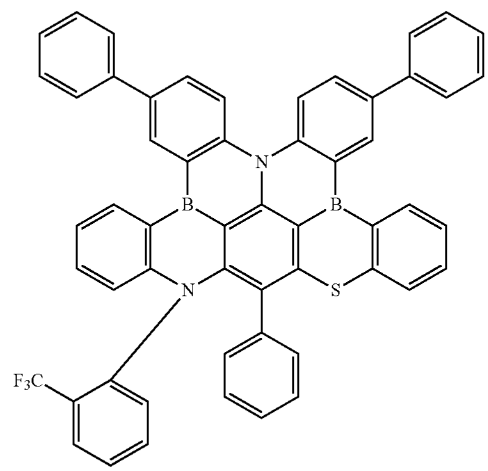
2-81
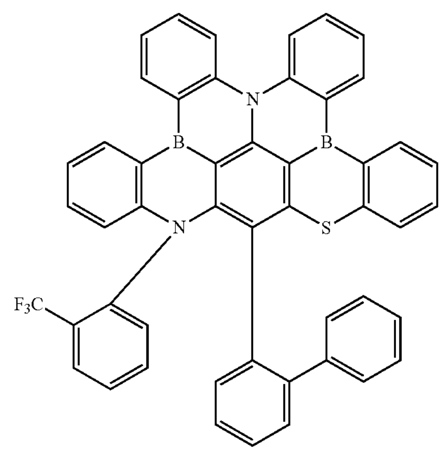
2-82
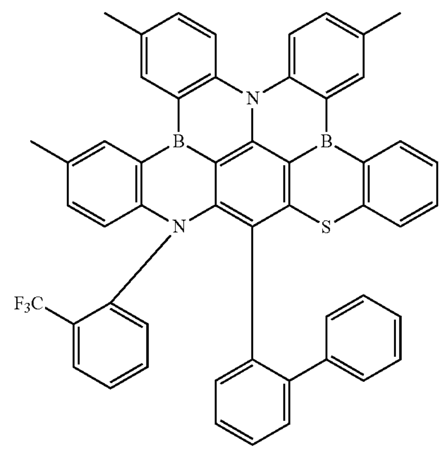

-continued
2-83
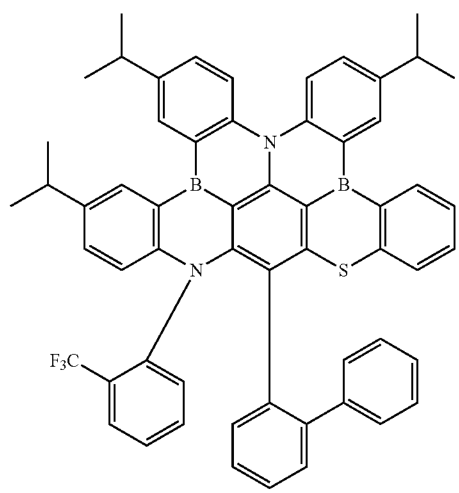
2-84
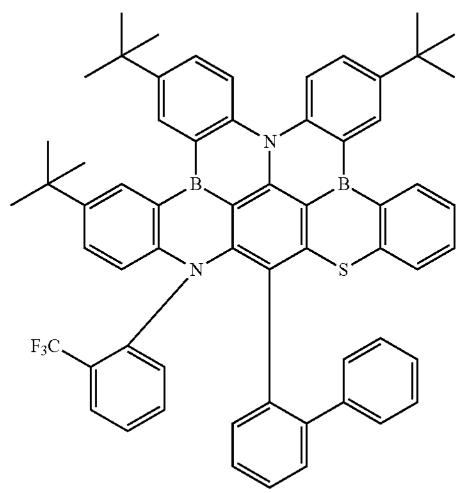
2-85
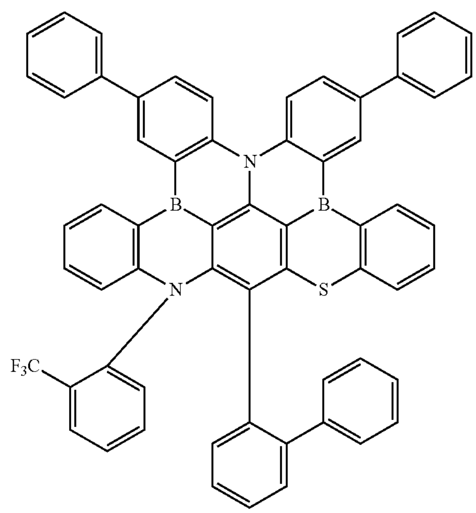
-continued
2-86
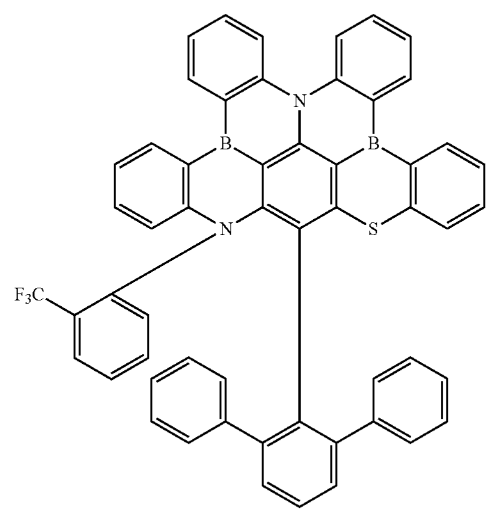
2-87
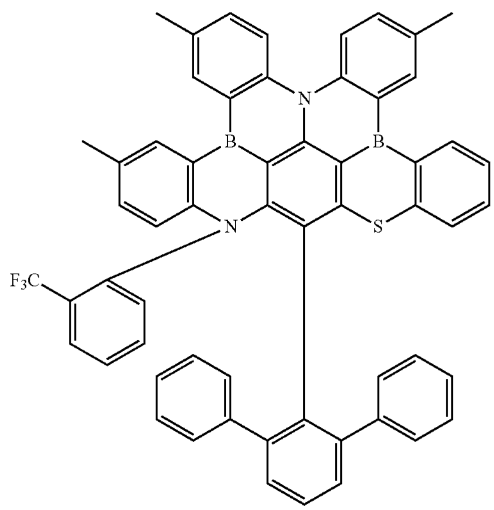
2-88
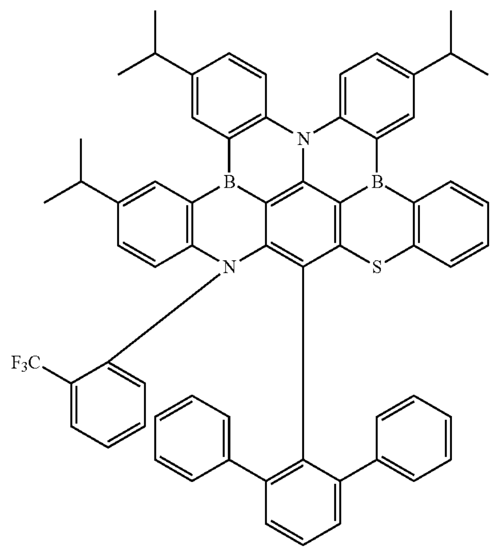

-continued
2-89
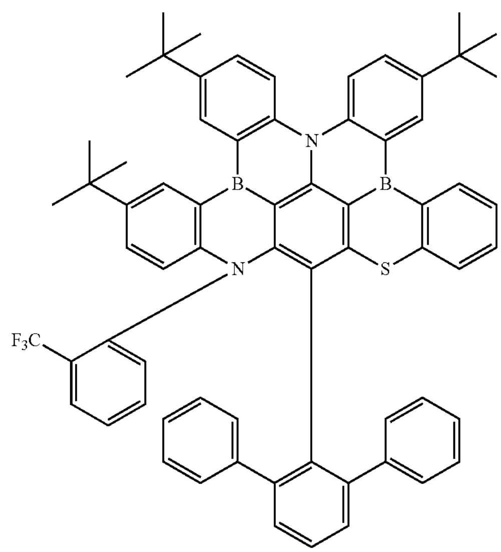
2-90
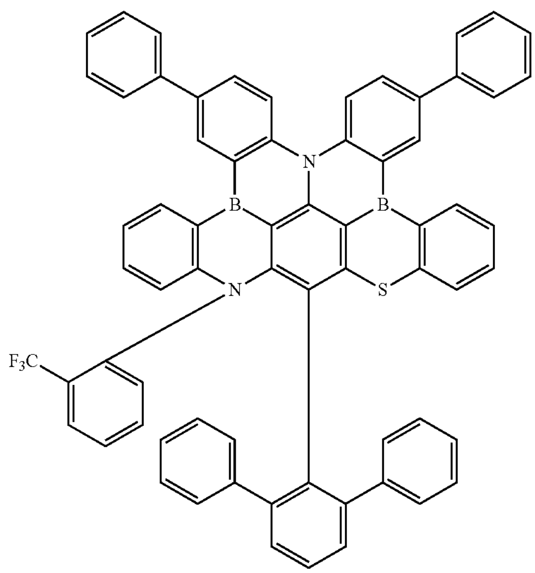
2-91
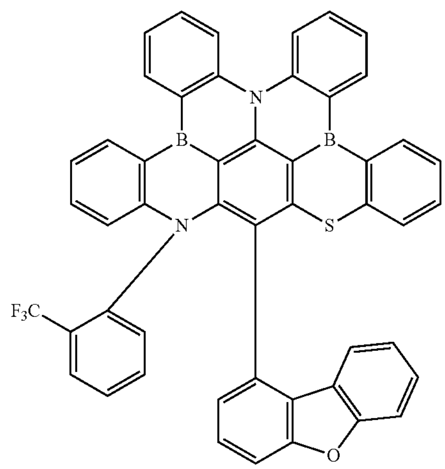
-continued
2-92
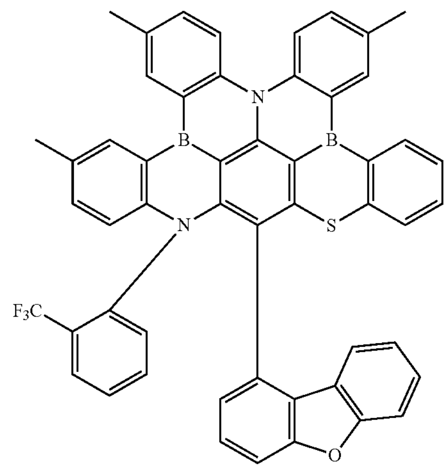
2-93
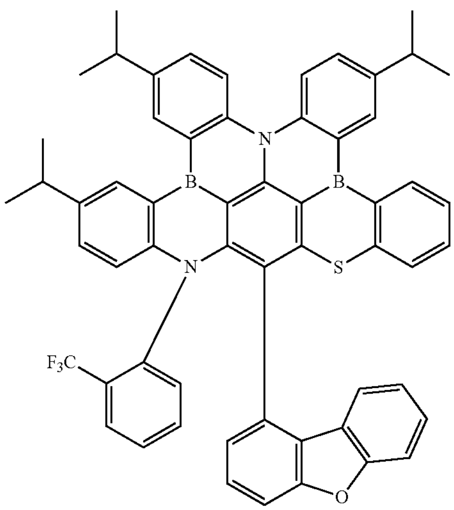
2-94
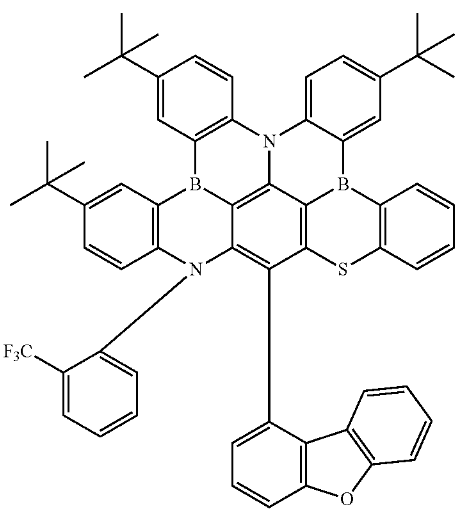

-continued
2-95
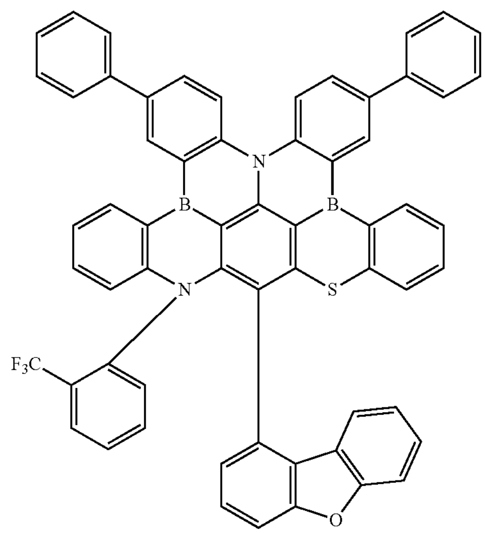
2-96
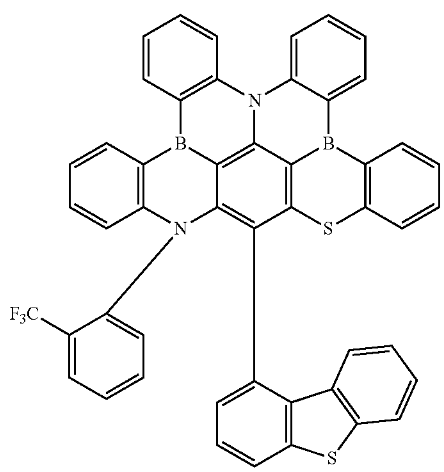
2-97
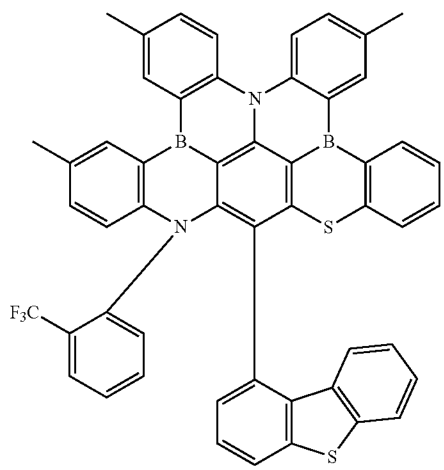
-continued
2-98
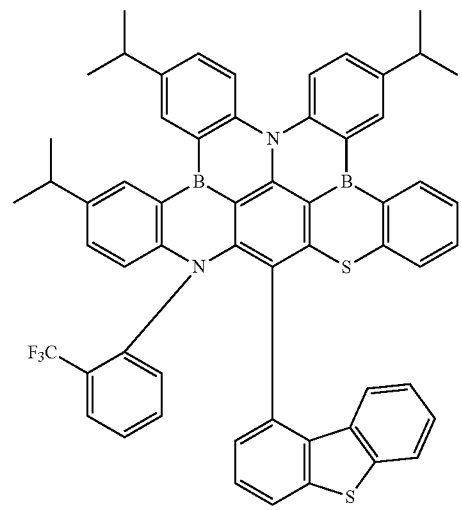
2-99
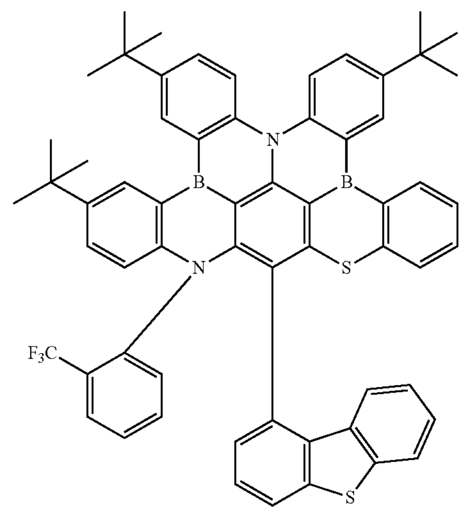
2-100
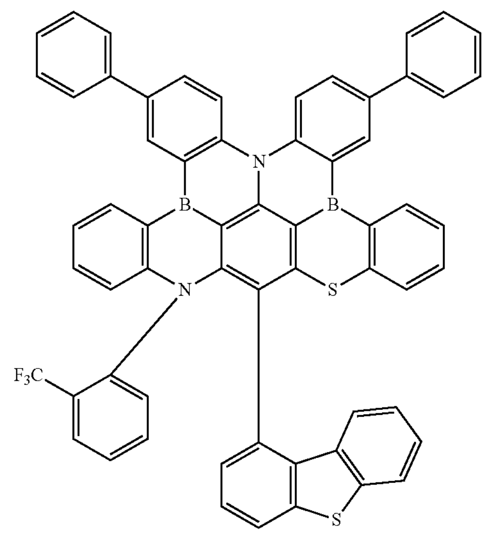

-continued
2-101
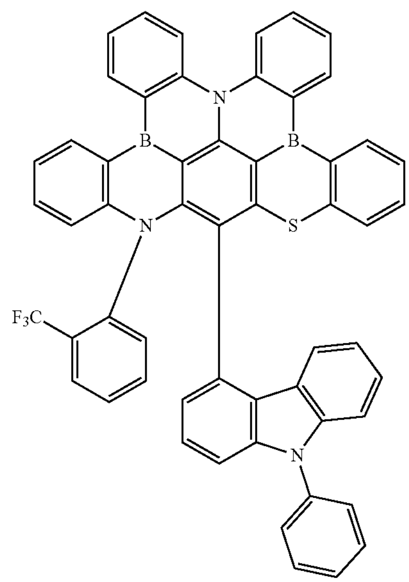
2-103
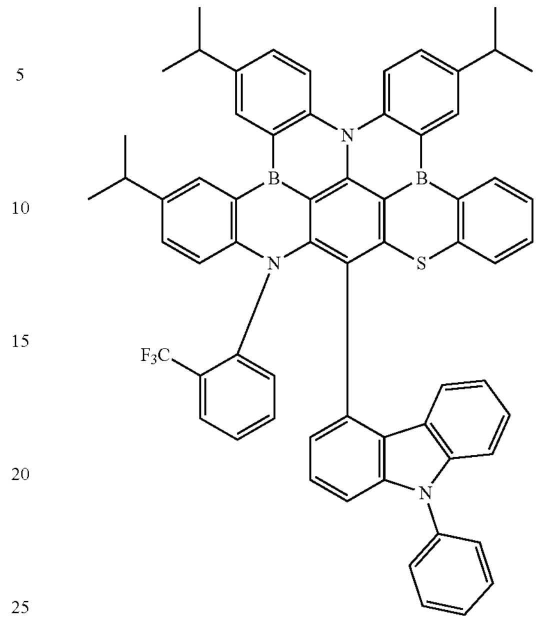
2-102
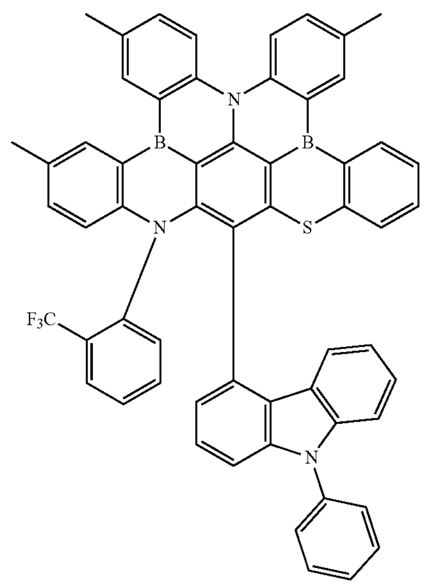
2-104
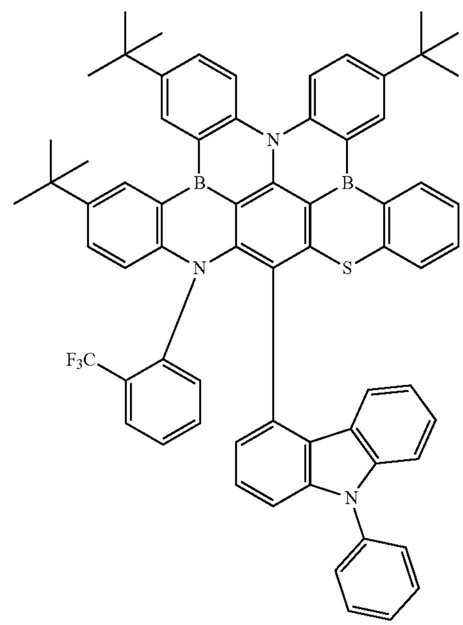

-continued
2-105
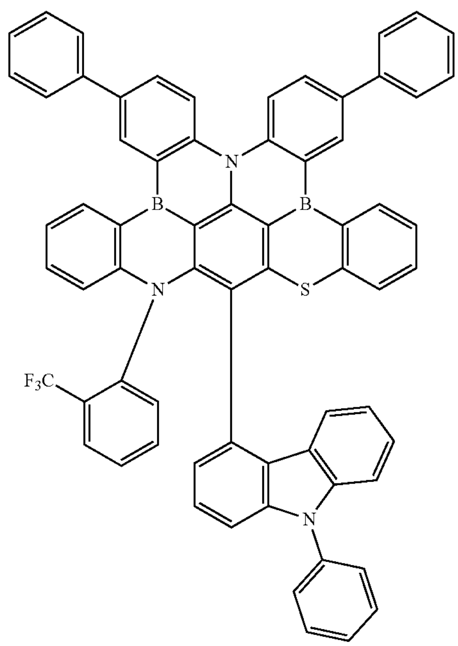
2-106
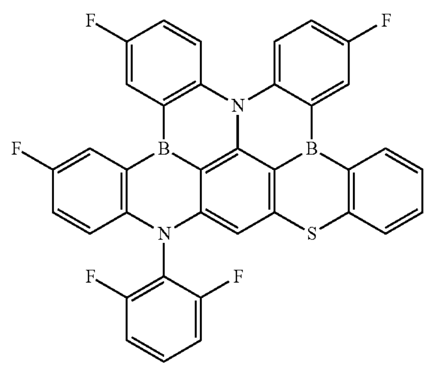
2-107
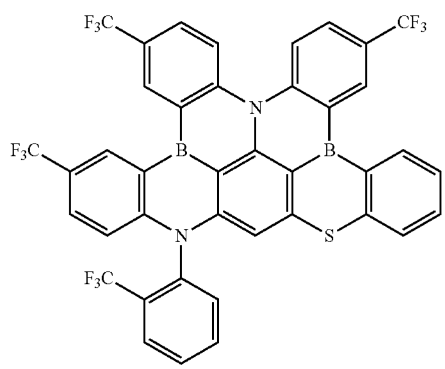
-continued
2-108
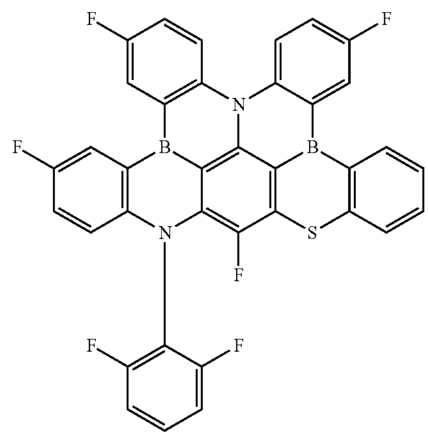
2-109
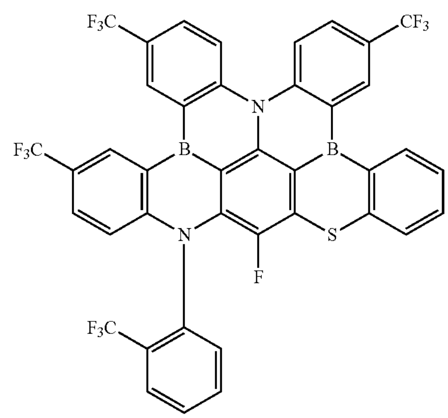
2-110
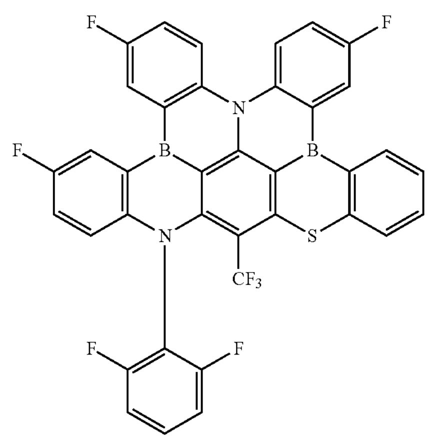

-continued
2-111
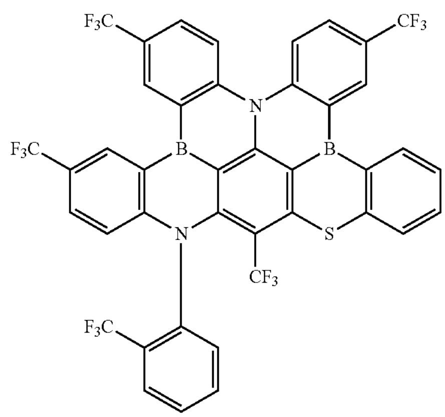
2-112
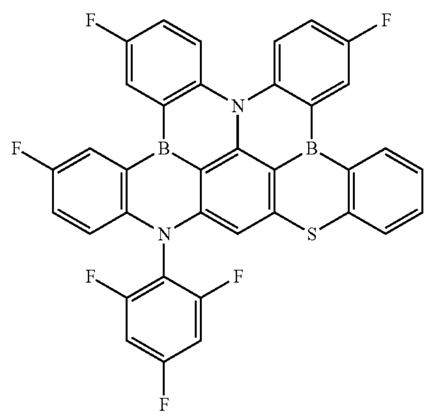
2-113
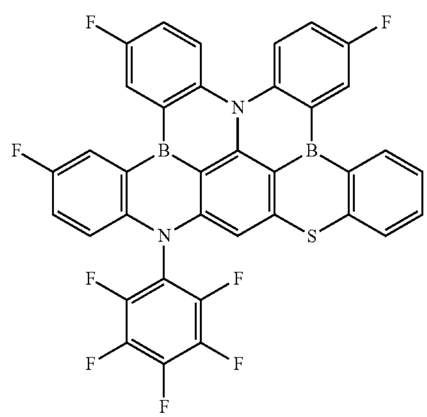
-continued
2-114
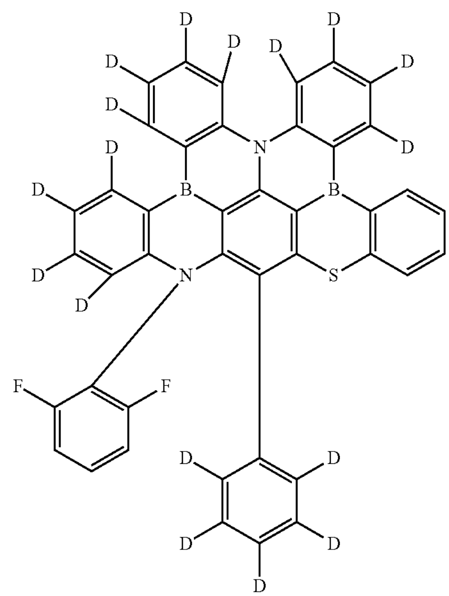
2-115
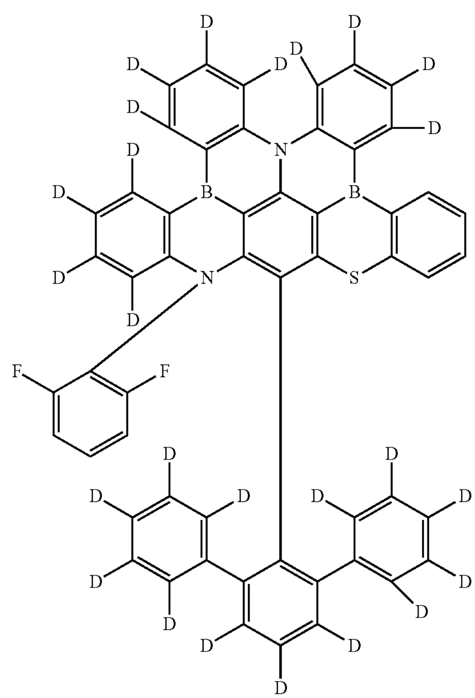

-continued
2-116
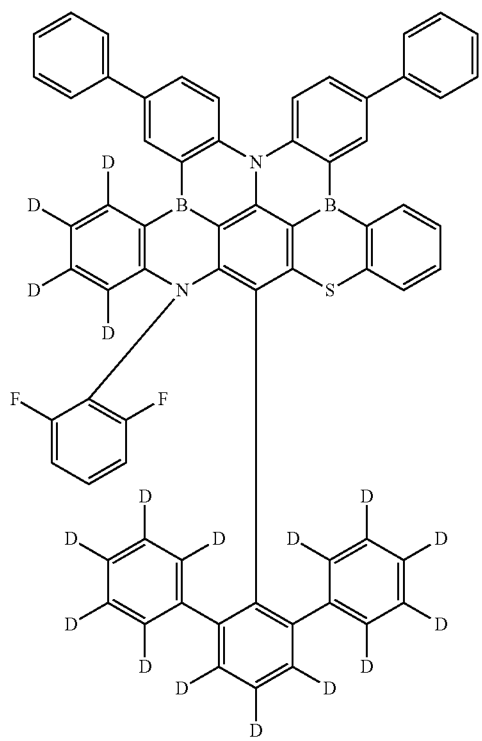
2-118
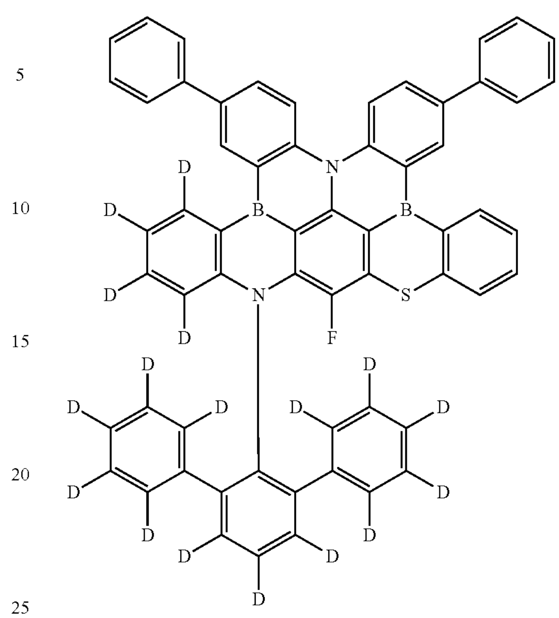
2-117
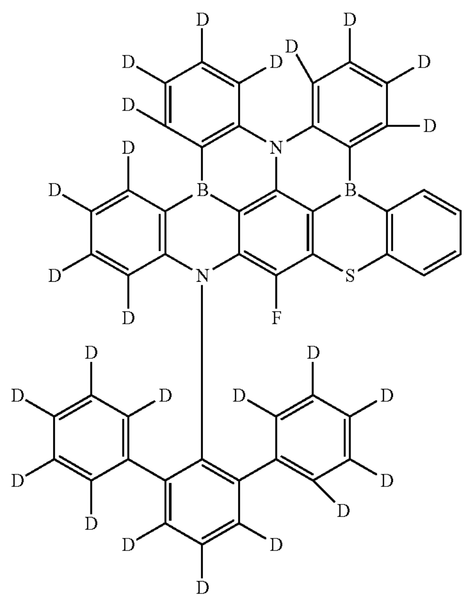
2-119
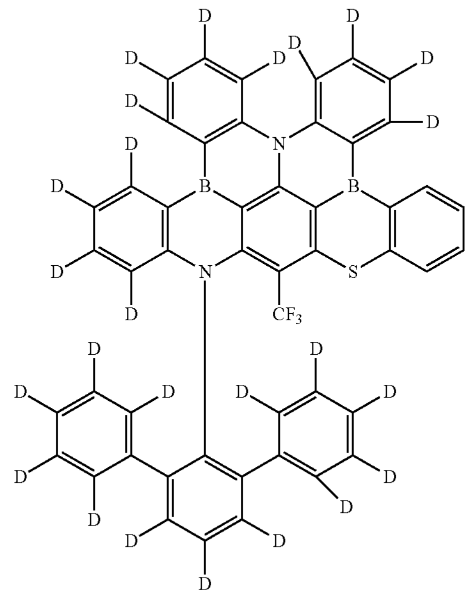

-continued 2-120

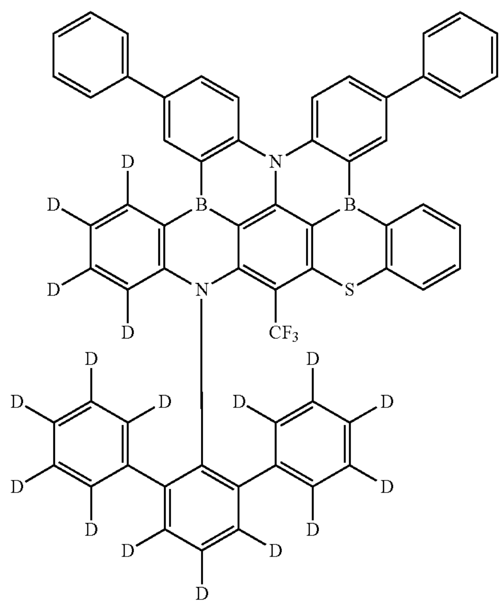

In the organic electroluminescence device ED of an embodiment, the emission layer EML may include a first compound and a second compound which are different from each other. For example, the first compound may be a dopant, and the second compound may be a host. In an embodiment, the first compound may include a polycyclic compound according to an embodiment. For example, in an embodiment, the emission layer EML may be a delayed fluorescence emission layer including the first compound and the second compound, and the first compound may include the polycyclic compound of an embodiment.

In the organic electroluminescence device ED of an embodiment, the emission layer EML may include an anthracene derivative, a pyrene derivative, a fluoranthene derivative, a chrysene derivative, a dihydrobenzanthracene derivative, or a triphenylene derivative. For example, in an embodiment, the emission layer EML may further include an anthracene derivative or a pyrene derivative.

The emission layer EML may include a compound represented by Formula E-1 below. The compound represented by Formula E-1 below may be used as a fluorescent host material.

[Formula E-1]

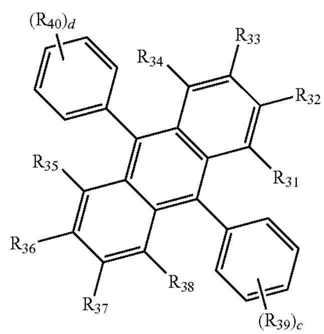

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from compounds E1 to E19 below.

E1

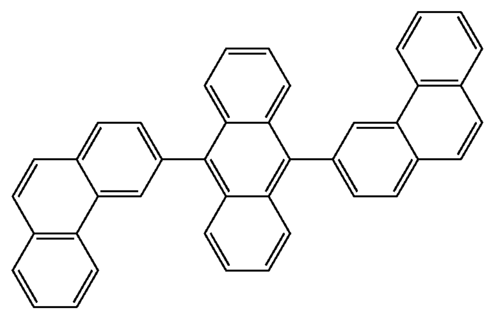

E2

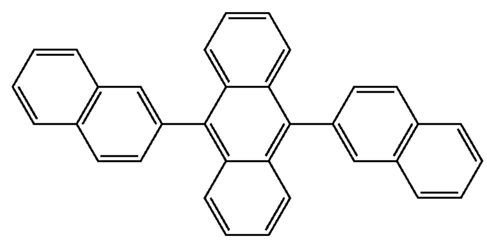

E3

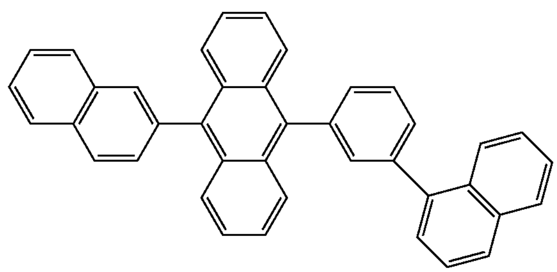

E4

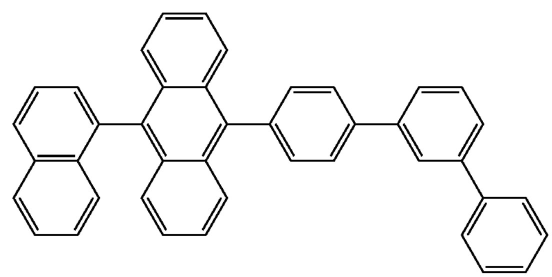

-continued
E5
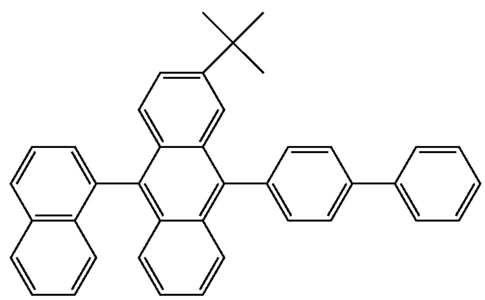
E6
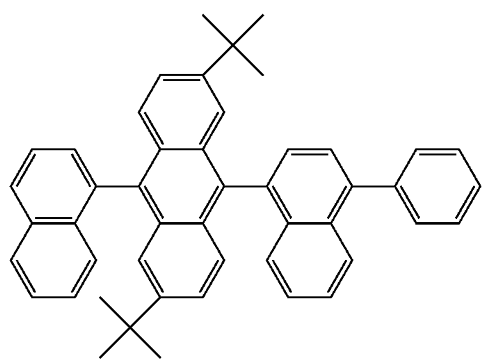
E7
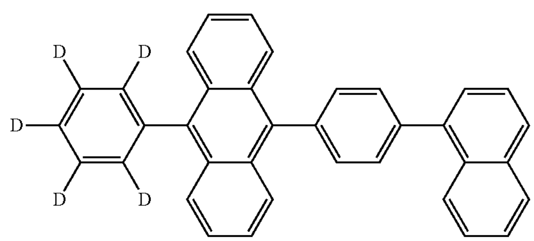
E8
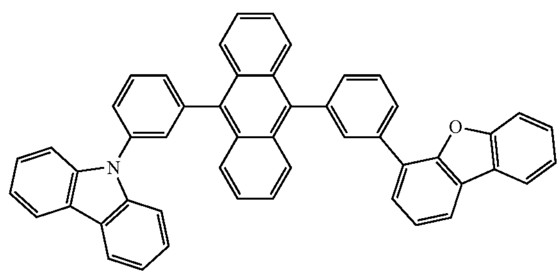
E9
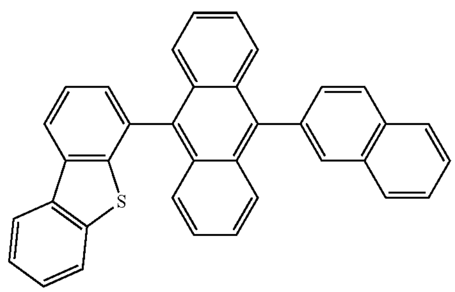
-continued
E10
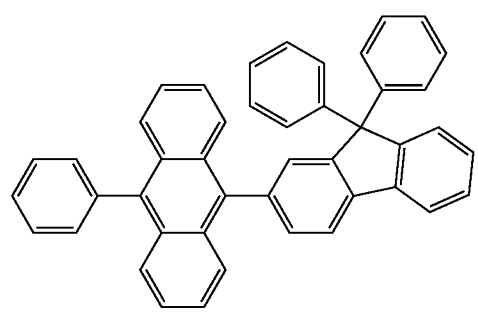
E11
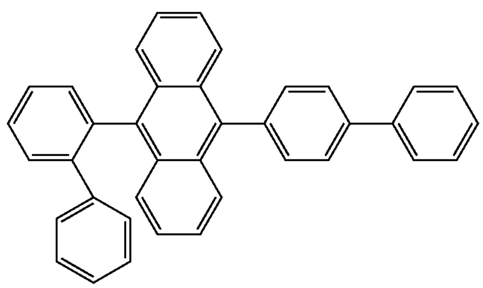
E12
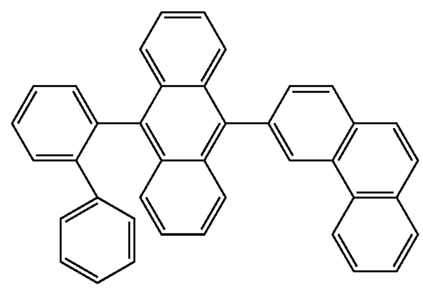
E13
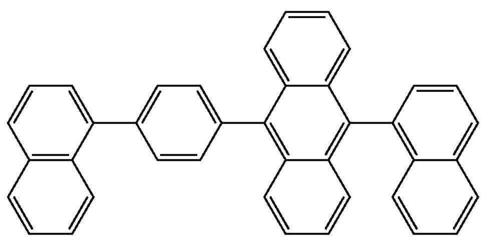
E14
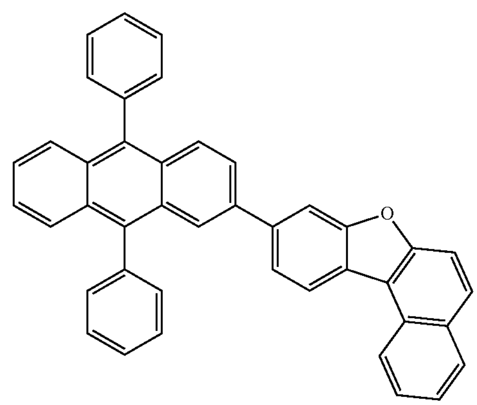

-continued

E15

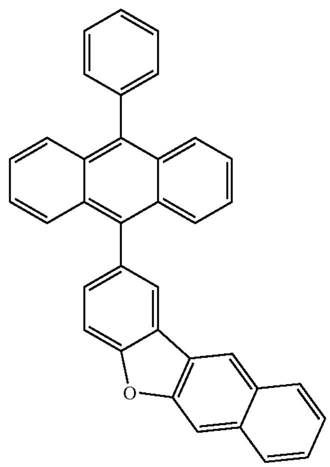

E16

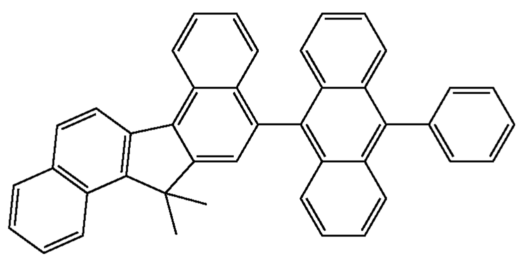

E17

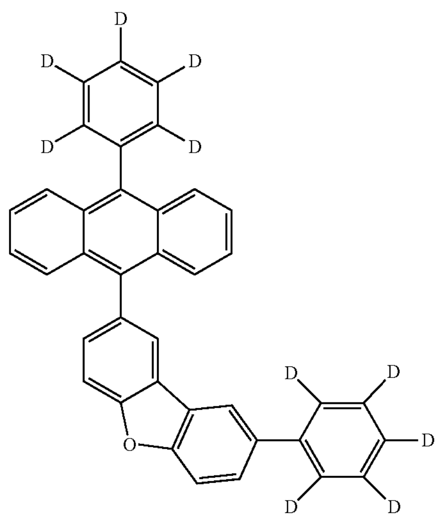

E18

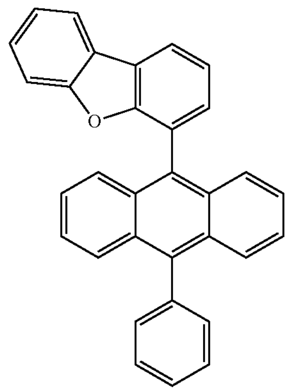

-continued

E19

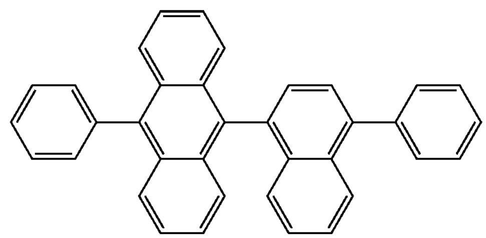

In an embodiment, the emission layer EML may include a compound represented by Formula E-2a or Formula E-2b below. The compound represented by Formula E-2a or Formula E-2b may be used as a phosphorescent host material.

[Formula E-2a]

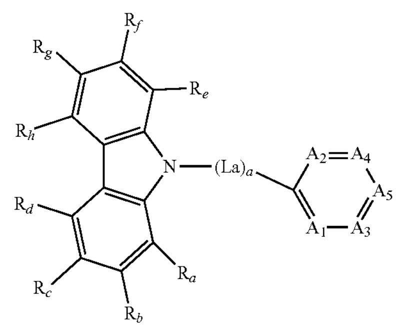

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2a, when a is 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

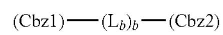

In Formula E-2b, Cbz1 and Cbz2 may each independently be an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2 below. However, the compounds listed in Compound Group E-2 below are only examples, and the compound represented by Formula E-2a or Formula E-2b is not limited to those listed in Compound Group E-2 below.

[Compound Group E-2]

E-2-1

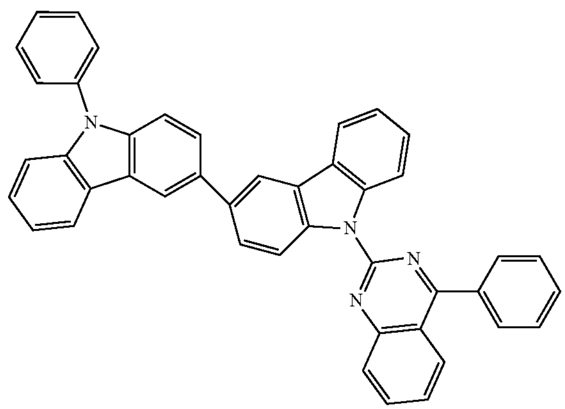

E-2-2

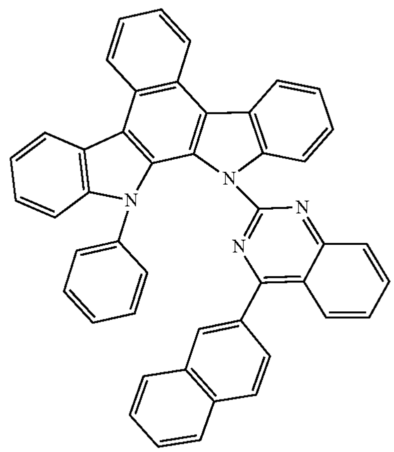

-continued

E-2-3

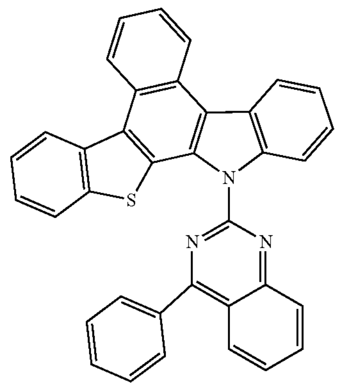

E-2-4

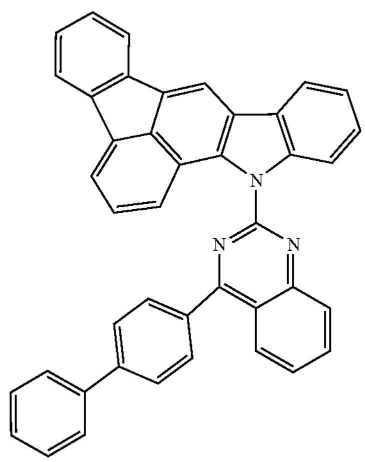

E-2-5

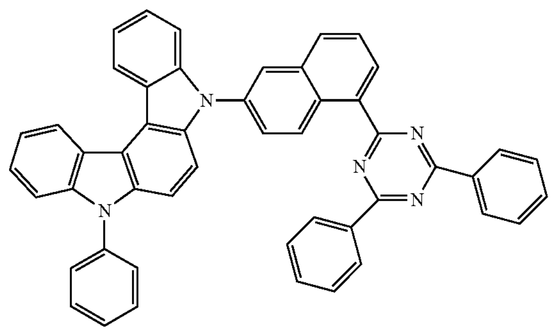

E-2-6

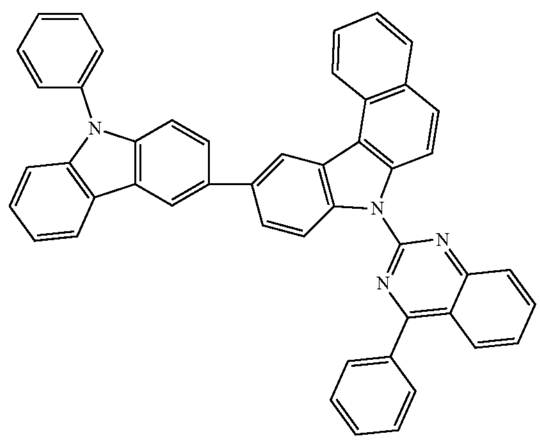

-continued
E-2-7
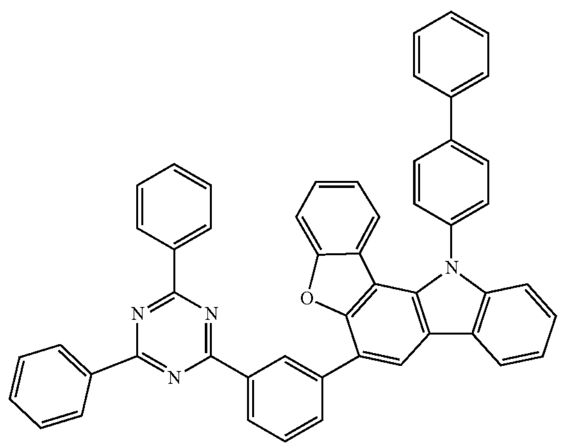
E-2-8
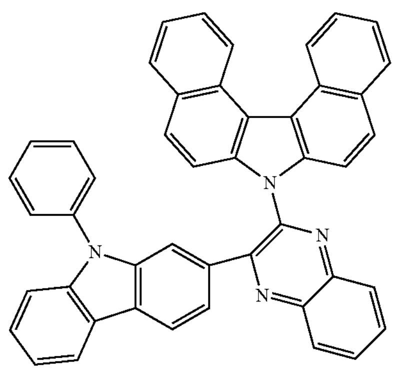
E-2-9
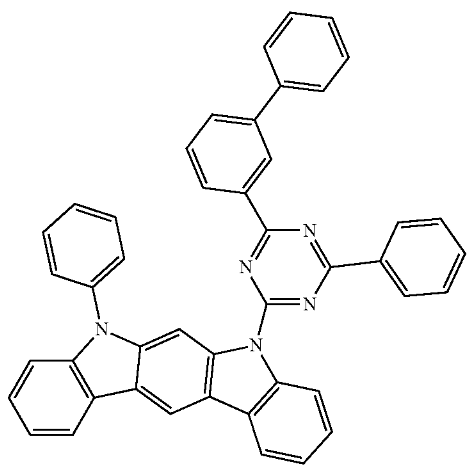
-continued
E-2-10
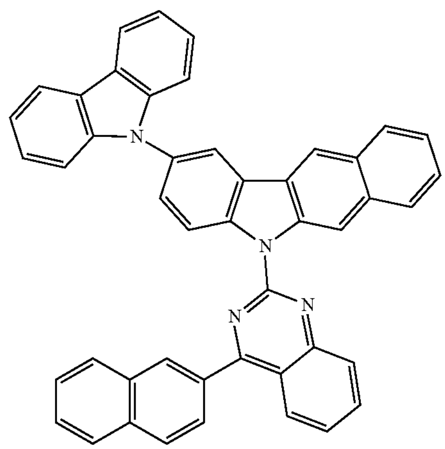
E-2-11
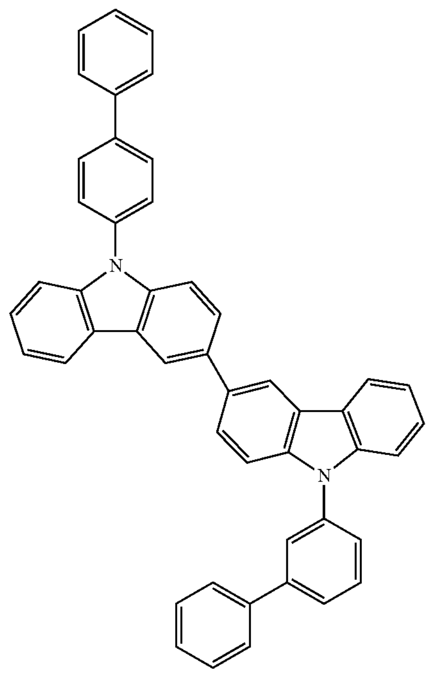
E-2-12
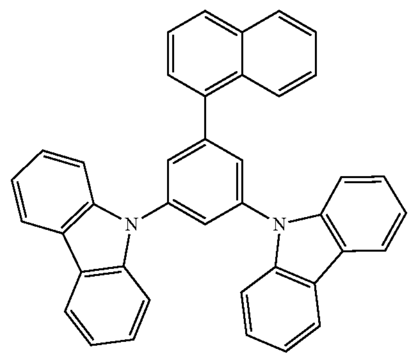

-continued
E-2-13
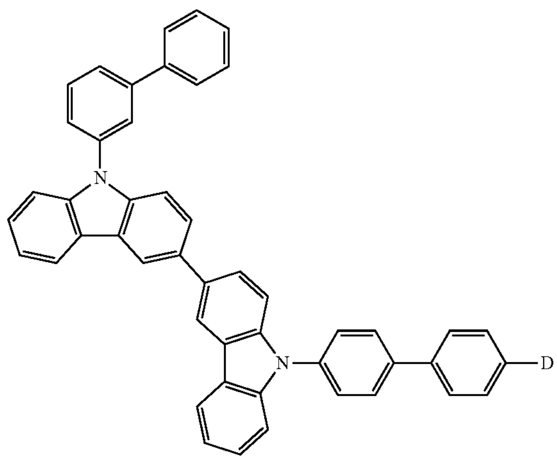
E-2-14
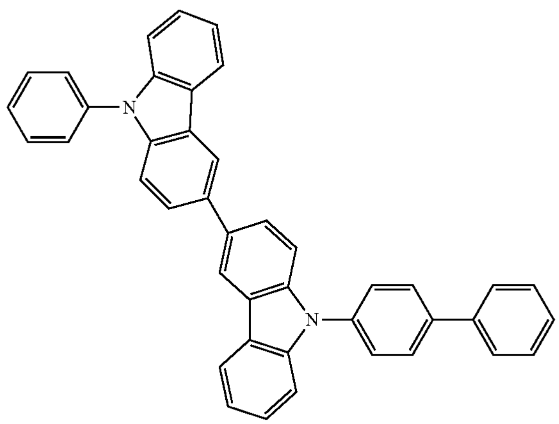
E-2-15
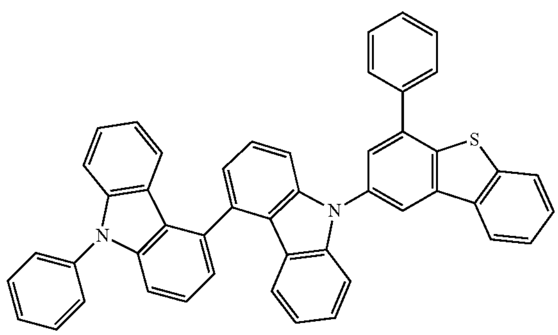
-continued
E-2-16
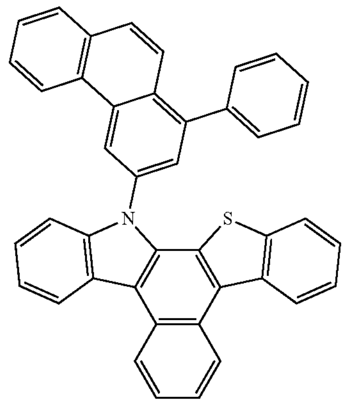
E-2-17
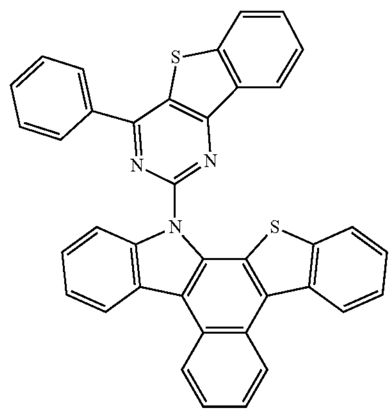
E-2-18
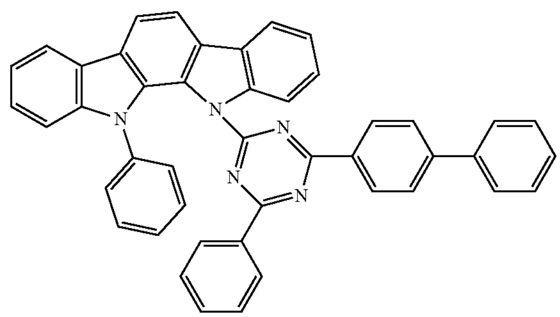
E-2-19
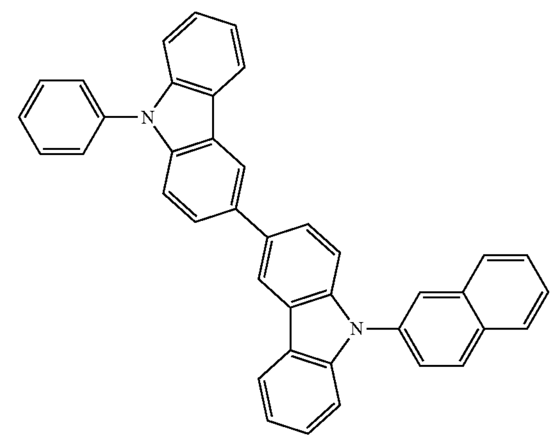

-continued

E-2-20

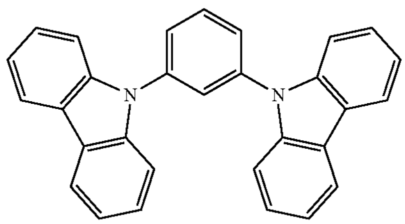

E-2-21

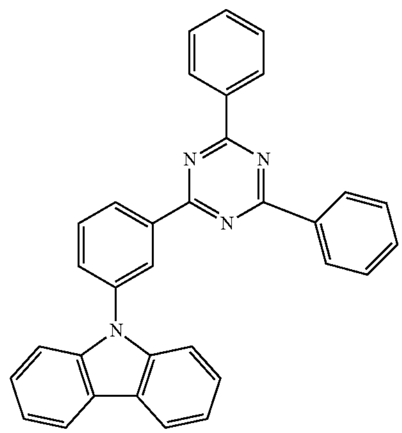

E-2-22

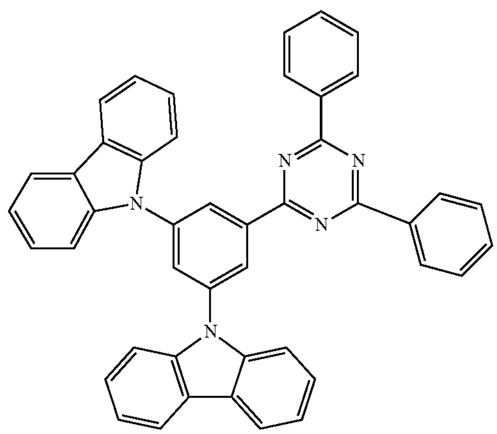

E-2-23

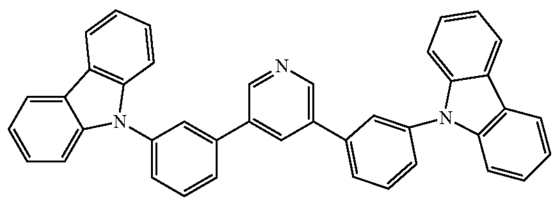

-continued

E-2-24

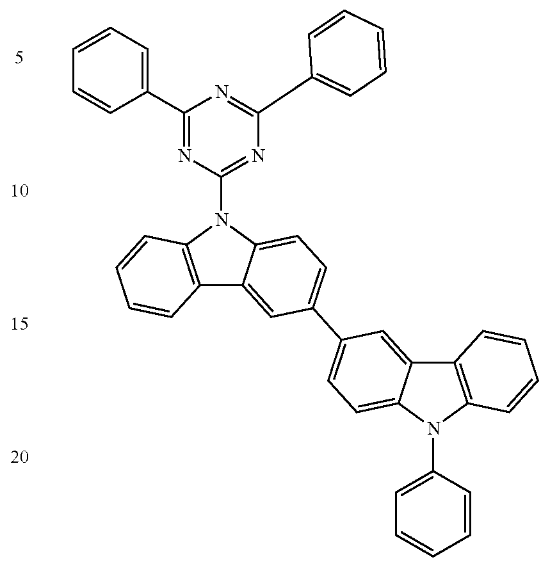

The emission layer EML may further include a common material in the art as a host material. For example, the emission layer EML may include, as a host material, at least one of bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4"-tris(carbazol-9-yl)-triphenylamine (TCTA), and 1,3,5-tris(1-phenyl-1H-benzo[d]imidazol-2-yl) benzene (TPBi). However, embodiments are not limited thereto, and for example, tris(8-hydroxyquinolino)aluminum ($Alq_3$), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include a compound represented by Formula M-a or Formula M-b below. The compound represented by Formula M-a or M-b below may be used as a phosphorescent dopant material.

[Formula M-a]

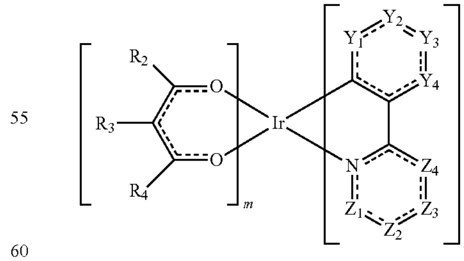

In Formula M-a above, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescent dopant.

The compound represented by Formula M-a may be any one selected from Compounds M-a1 to M-a25 below. However, Compounds M-a1 to M-a25 below are only examples, and the compound represented by Formula M-a is not limited to Compounds M-a1 to M-a25 below.

M-a1

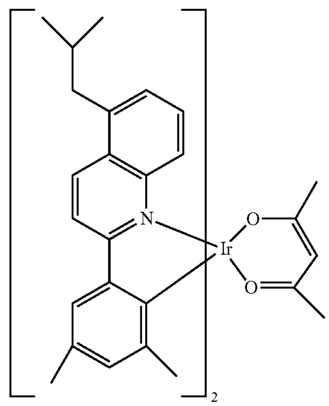

M-a2

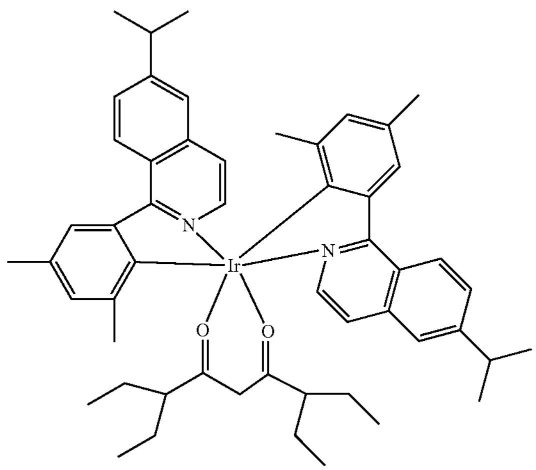

M-a3

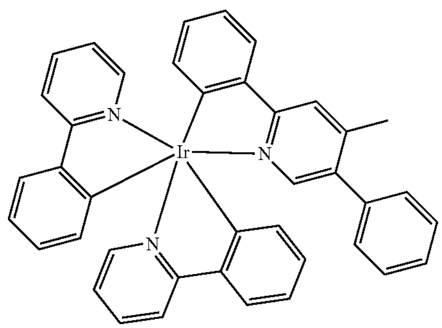

-continued

M-a4

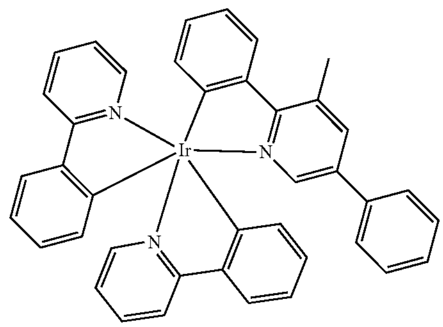

M-a5

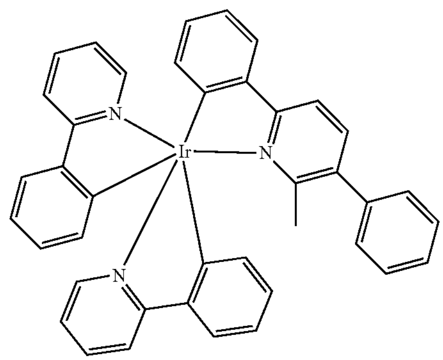

M-a6

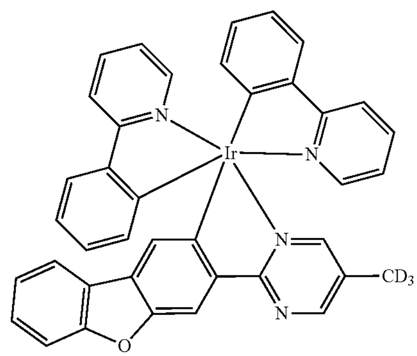

M-a7

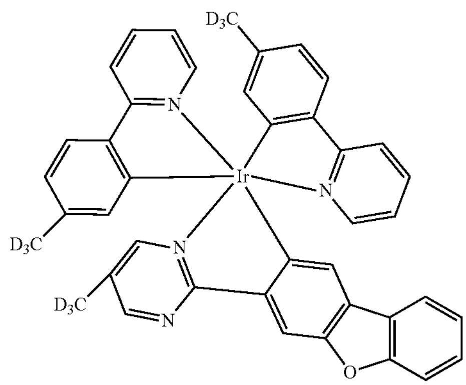

-continued
M-a8
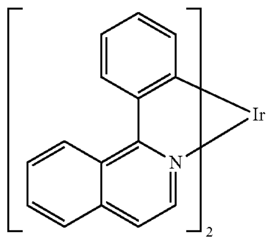
M-a9
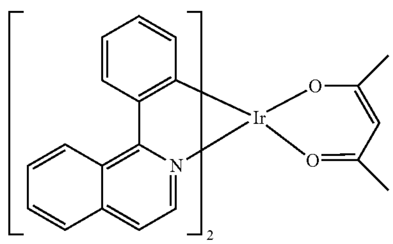
M-a10
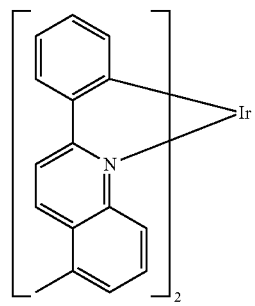
M-a11
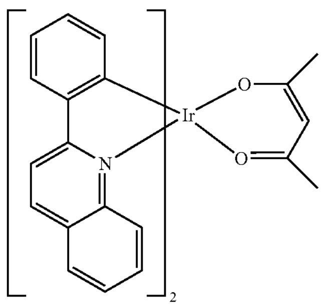
M-a12
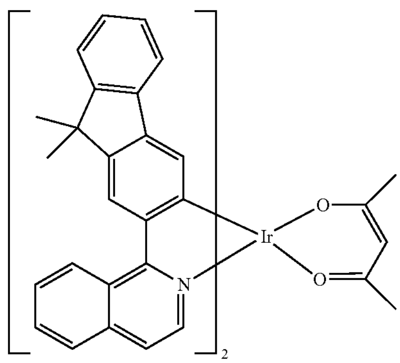
-continued
M-a13
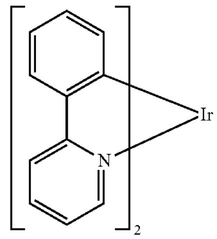
M-a14
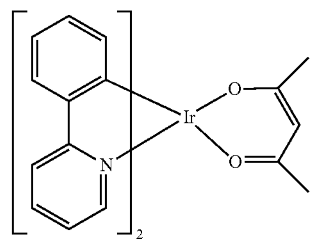
M-a15
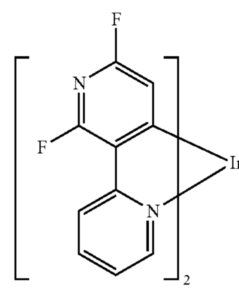
M-a16
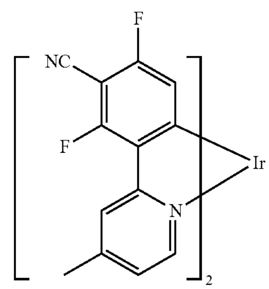
M-a17
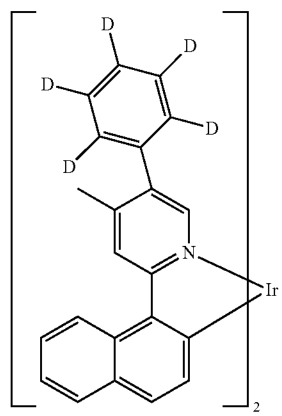

-continued
M-a18
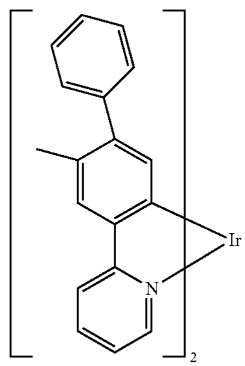
M-a19
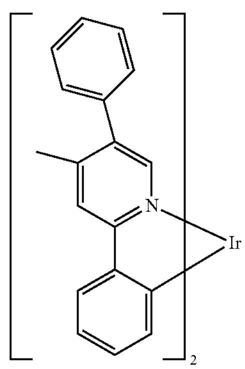
M-a20
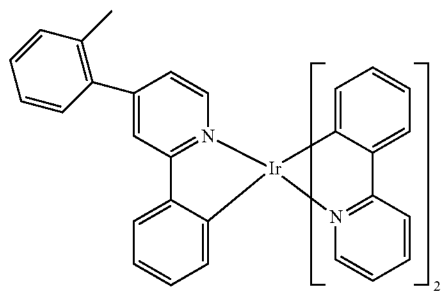
M-a21
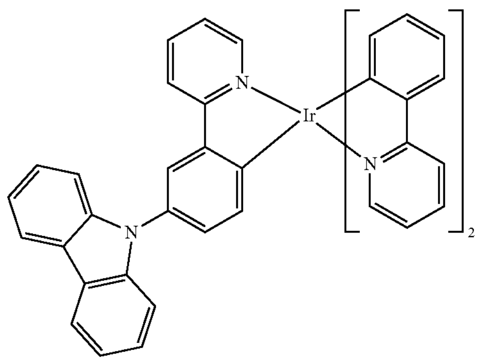
-continued
M-a22
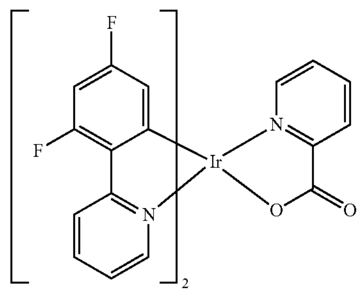
M-a23
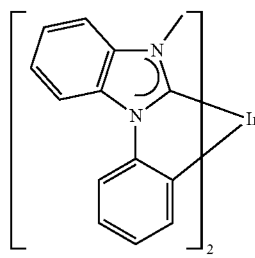
M-a24
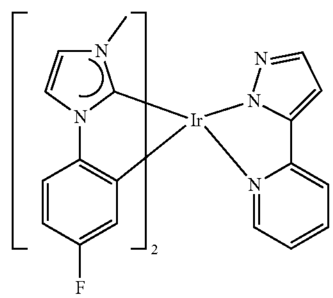
M-a25
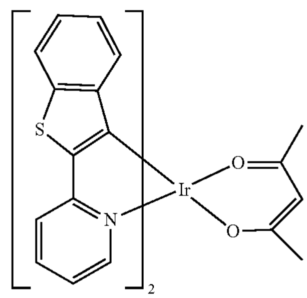
Compounds M-a1 and M-a2 may be used as a red dopant material, and Compounds M-a3 and M-a4 may be used as a green dopant material.

[Formula M-b]

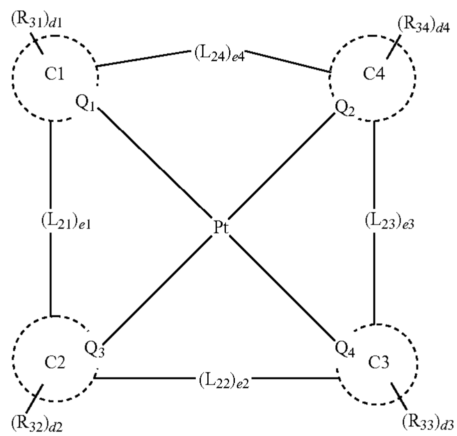

In Formula M-b, QR to QR may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. In Formula M-b, $L_{21}$ to $L_{24}$ may each independently be a direct linkage,

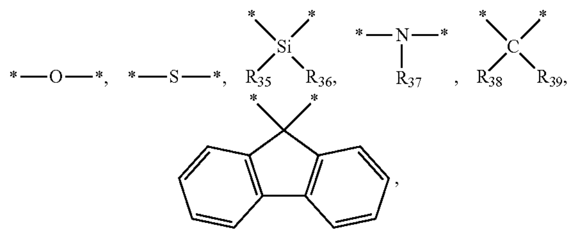

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescent dopant or a green phosphorescent dopant.

The compound represented by Formula M-b may be any one selected from the compounds below. However, the compounds below are only examples, and the compound represented by Formula M-b is not limited to the compounds below.

M-b-1

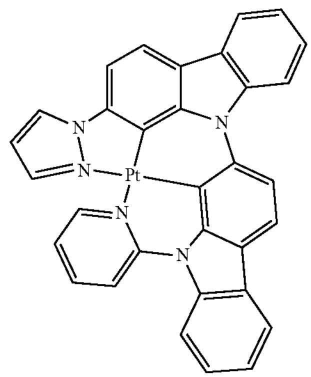

M-b-2

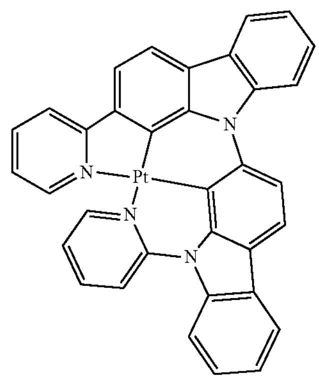

M-b-3

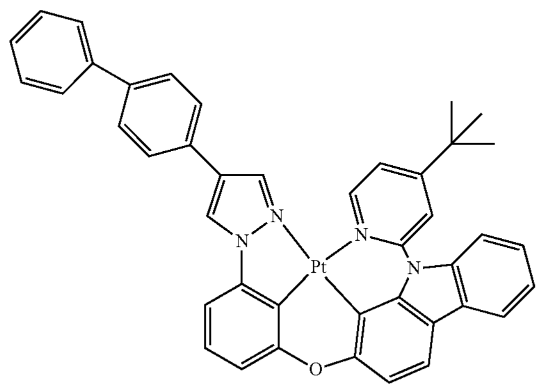

M-b-4

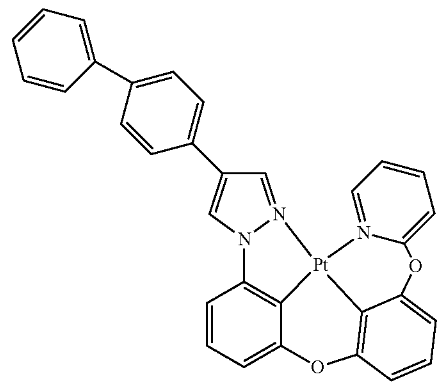

-continued

M-b-5

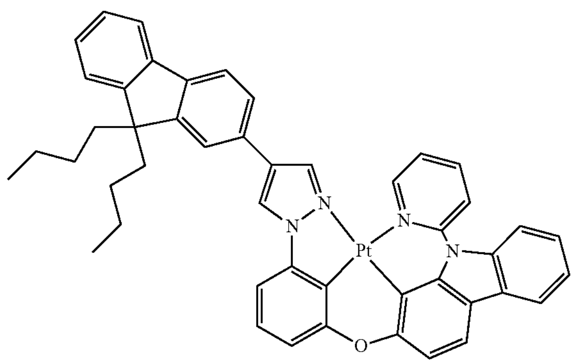

M-b-6

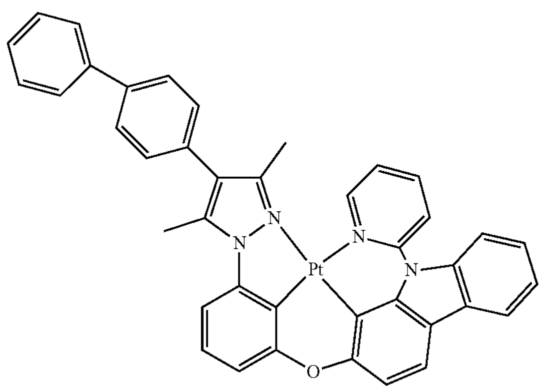

M-b-7

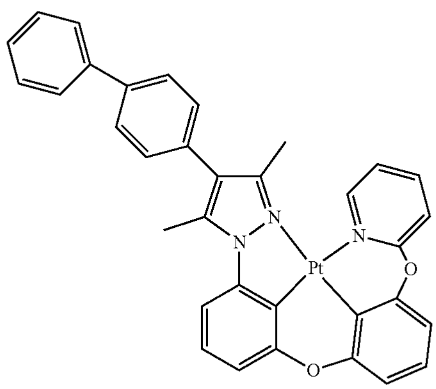

M-b-8

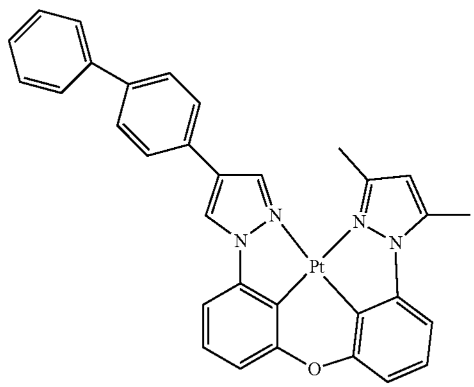

-continued

M-b-9

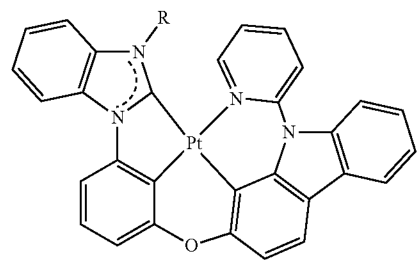

M-b-10

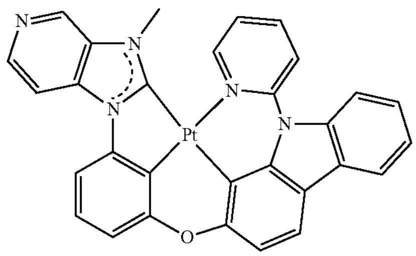

M-b-11

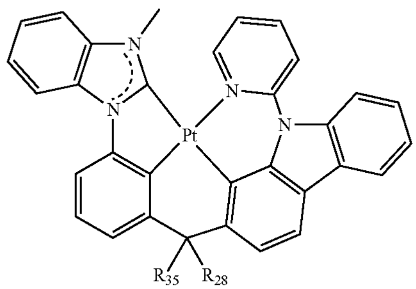

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formulas F-a to F-c below. The compounds represented by Formulas F-a to F-c below may be used as a fluorescent dopant material.

[Formula F-a]

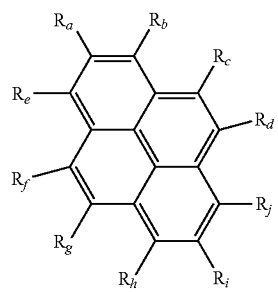

In Formula F-a above, two selected from $R_a$ to $R_j$ may each independently be substituted with $*$—$NAr_1Ar_2$. The remainder of $R_a$ to $R_j$ which are not substituted with $*$—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group $*$—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of Ari and $Ar_2$ may be a heteroaryl group containing O or S as a ring-forming atom.

[Formula F-b]

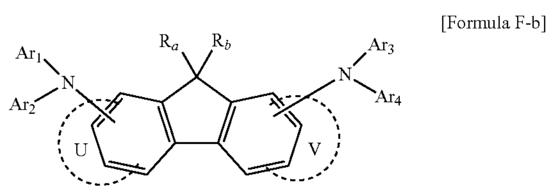

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be 0 or 1. In Formula F-b, U indicates the number of rings fused at the position of U, and V indicates the number of rings fused at the position of V. For example, when U or V is 1, a ring indicated by U or V may form a condensed ring, and when U or V is 0, a ring indicated by U or V may not be present. When U is 0 and V is 1, or when U is 1 and V is 0, a condensed ring having a fluorene core of Formula F-b may be a cyclic compound having four rings. When both U and V are 0, the condensed ring of Formula F-b may be a cyclic compound having three rings. When both U and V are 1, the condensed ring having a fluorene core of Formula F-b may be a cyclic compound having five rings.

In Formula F-b, when U or V is 1, U and V may each independently be a substituted or unsubstituted hydrocarbon ring having 5 to 30 ring-forming carbon atoms, or a substituted or unsubstituted heterocycle having 2 to 30 ring-forming carbon atoms.

[Formula F-c]

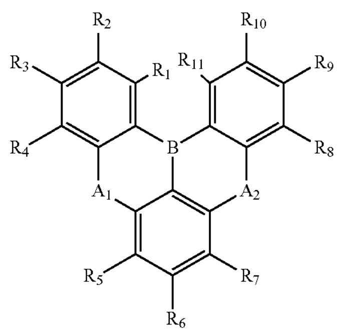

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of neighboring rings to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the emission layer EML may include, as a dopant material, styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

The emission layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. For example, iridium(III) bis(4,6-difluorophenylpyridinato-N,C2')picolinate (FIrpic), bis(2,4-difluorophenylpyridinato)-tetrakis(1-pyrazolyl)borate iridium (III) (Fir6), platinum octaethyl porphyrin (PtOEP), etc. may be used as a phosphorescent dopant. However, embodiments are not limited thereto.

In the organic electroluminescence device ED of an embodiment illustrated in FIGS. 3 to 6, an electron transport region ETR is provided on the emission layer EML. The electron transport region ETR may include at least one of a hole blocking layer HBL, an electron transport layer ETL, and an electron injection layer EIL, but embodiments are not limited thereto.

The electron transport region ETR may have a layer formed of a single material, a layer formed of different materials, or a multilayer structure having layers formed of different materials.

For example, the electron transport region ETR may have a single layer structure of an electron injection layer EIL or an electron transport layer ETL, and may have a single layer structure formed of an electron injection material and an electron transport material. In an embodiment, the electron transport region ETR may have a single layer structure formed of different materials, or may have a structure in which an electron transport layer ETL/an electron injection layer EIL, or a hole blocking layer HBL/an electron transport layer ETL/an electron injection layer EIL are stacked in order from the emission layer EML, but is not limited thereto.

The electron transport region ETR may have a thickness, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below.

[Formula ET-1]

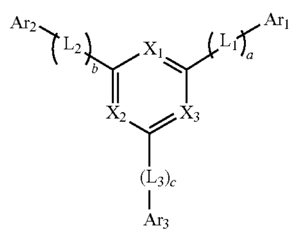

In Formula ET-1, at least one of $X_1$ to $X_3$ may be N and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula ET-1, when a to c are 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

When the electron transport region ETR includes an electron transport layer ETL, the electron transport region ETR may include an anthracene-based compound. However, embodiments are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may include at least one selected from Compounds ET1 to ET36 below.

ET1

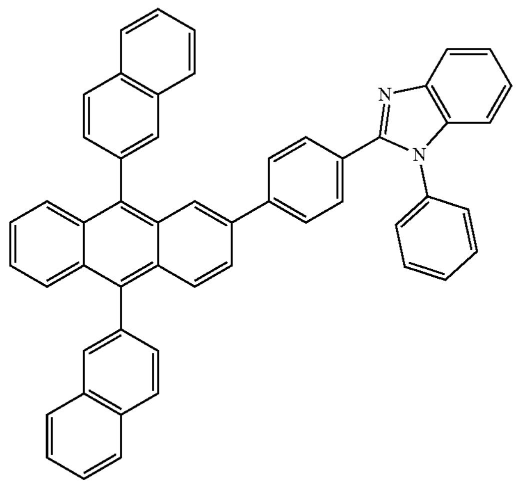

ET2

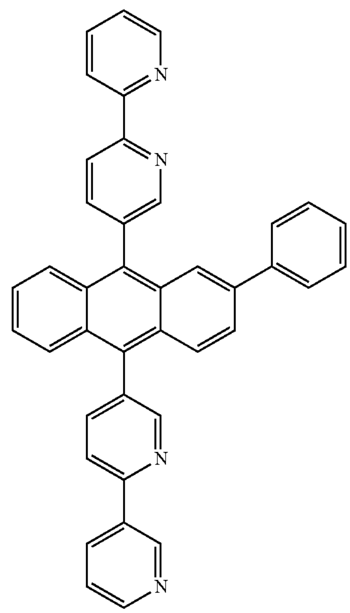

ET3

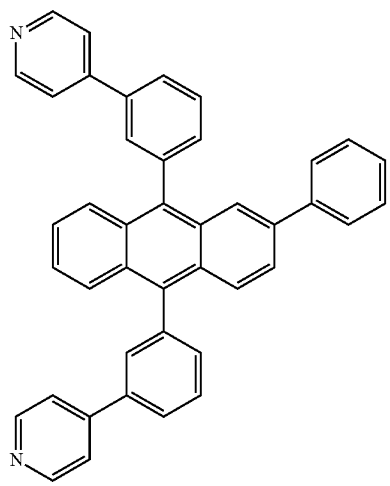

-continued
ET4
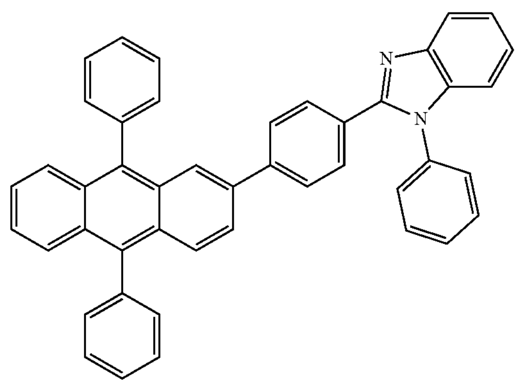
ET5
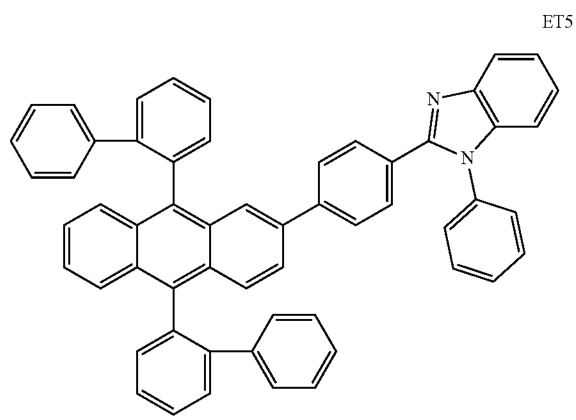
ET6
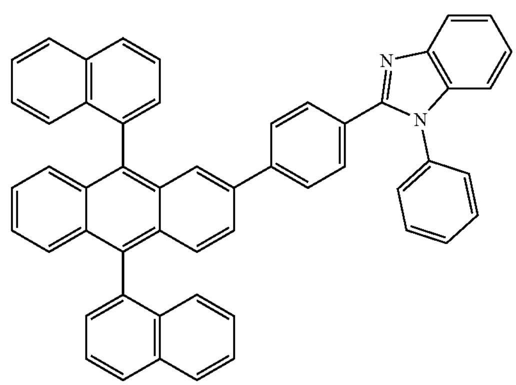
-continued
ET7
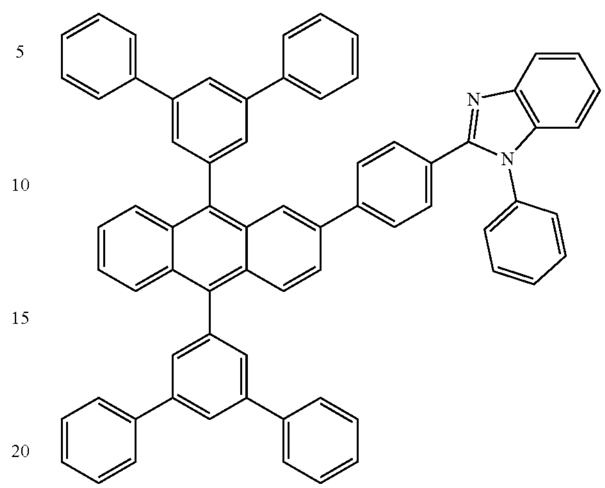
ET8
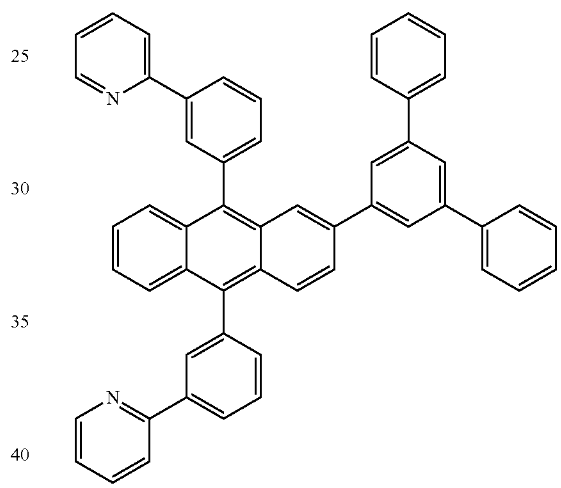
ET9
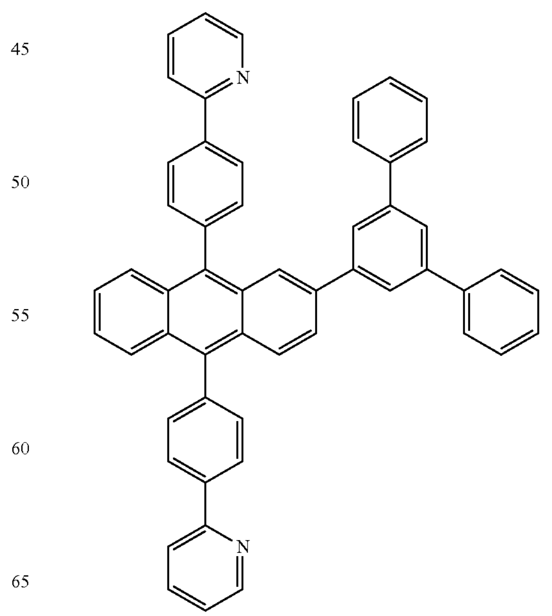

-continued
ET10
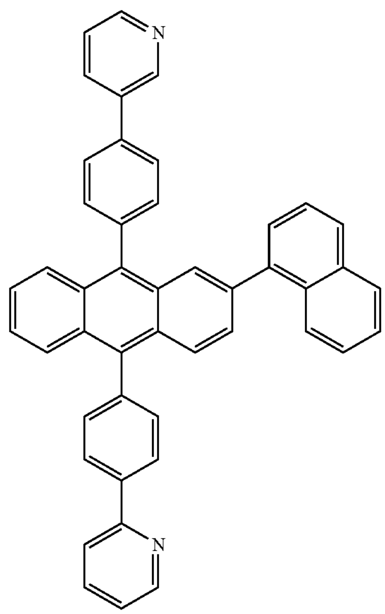
ET11
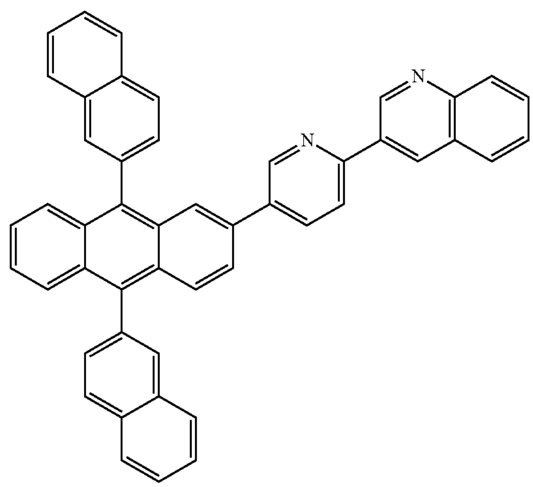
ET12
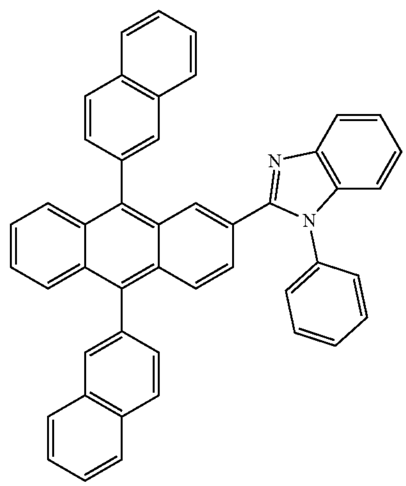
-continued
ET13
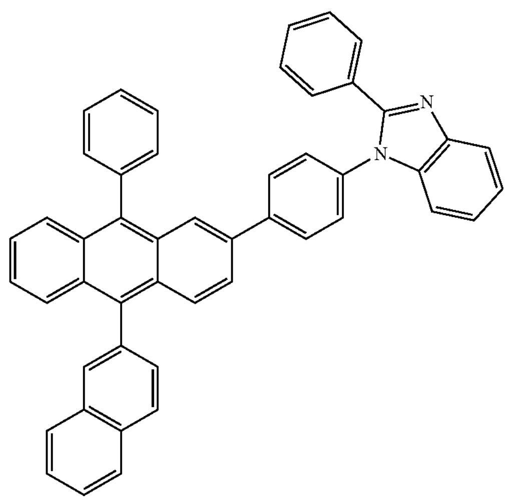
ET14
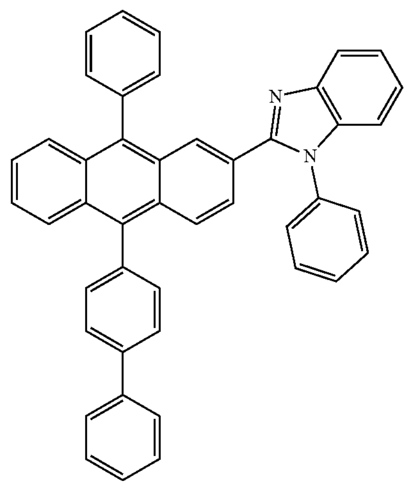
ET15
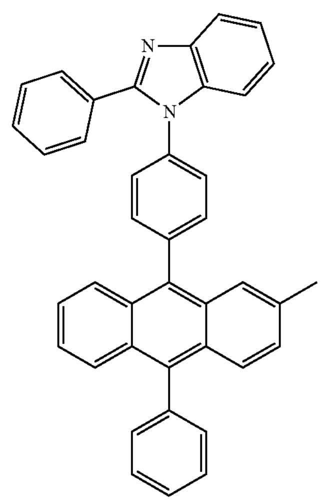

-continued
ET16
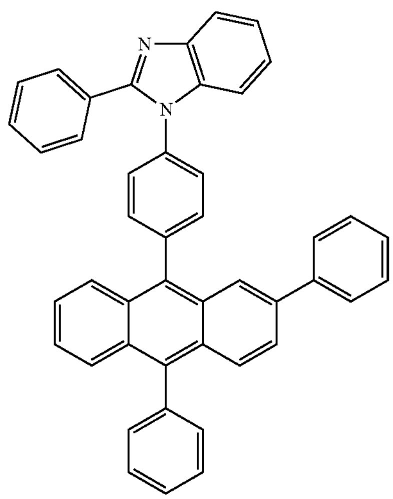
ET17
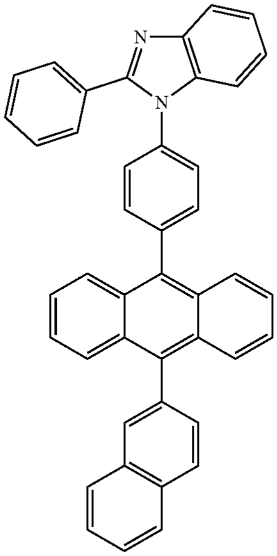
ET18
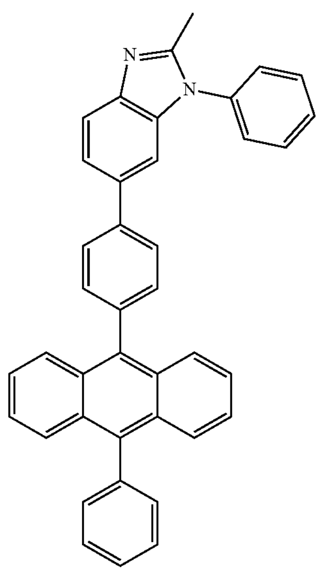
-continued
ET19
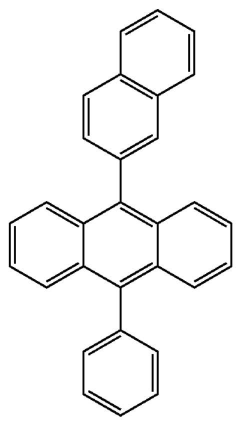
ET20
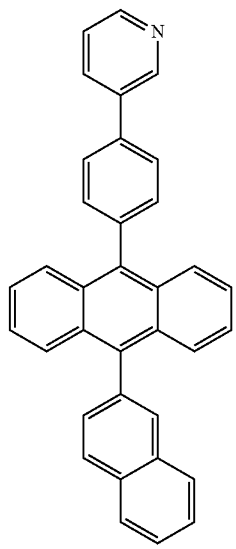
ET21
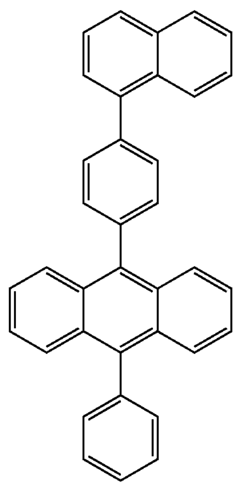

-continued
ET22
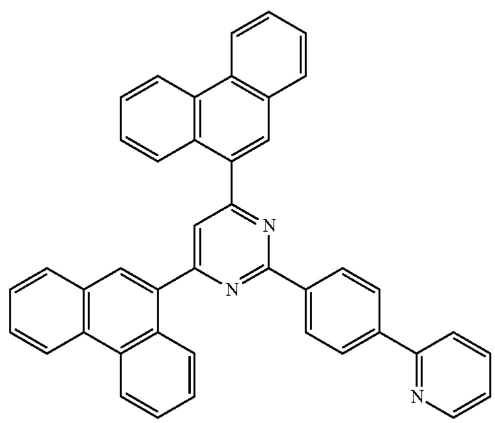
ET23
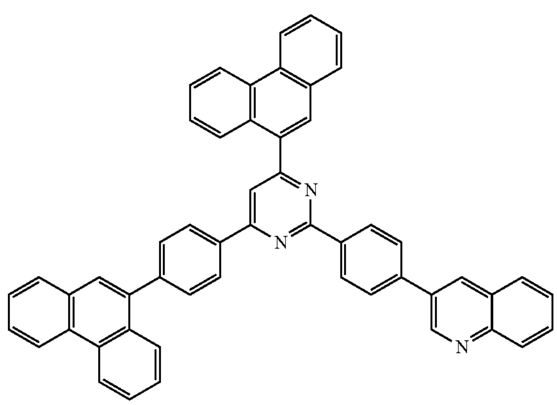
ET24
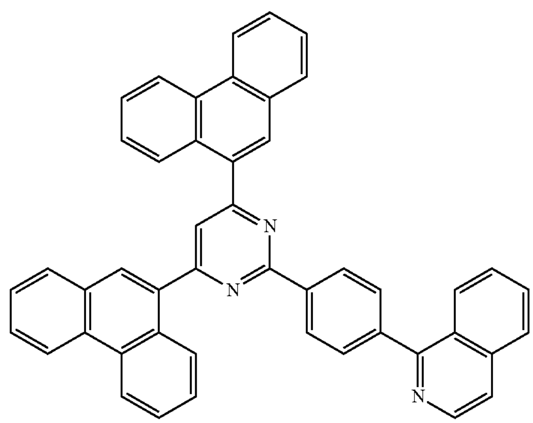
-continued
ET25
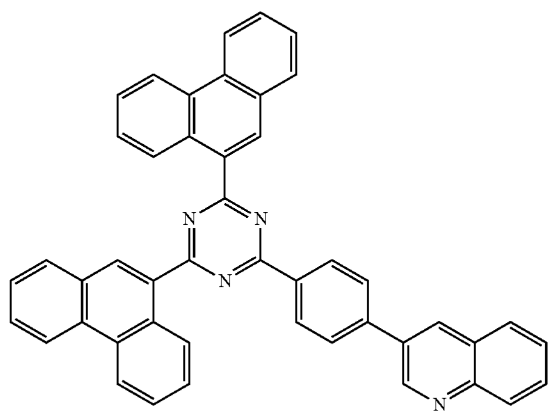
ET26
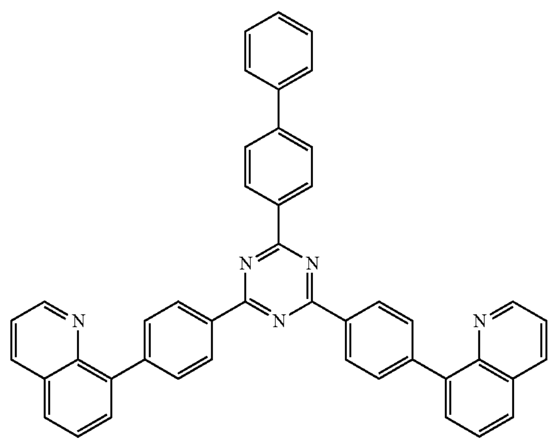
ET27
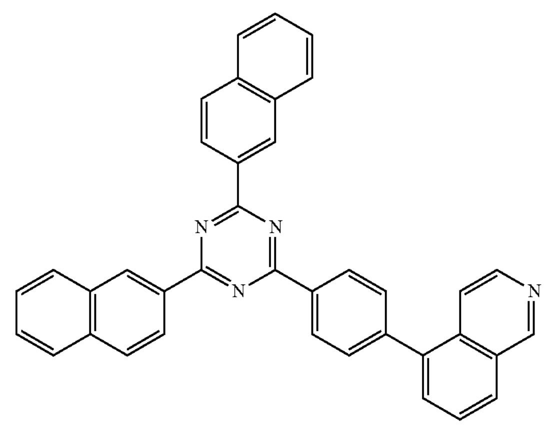

-continued
ET28
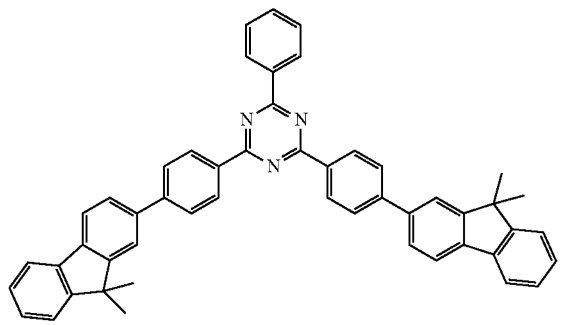
ET29
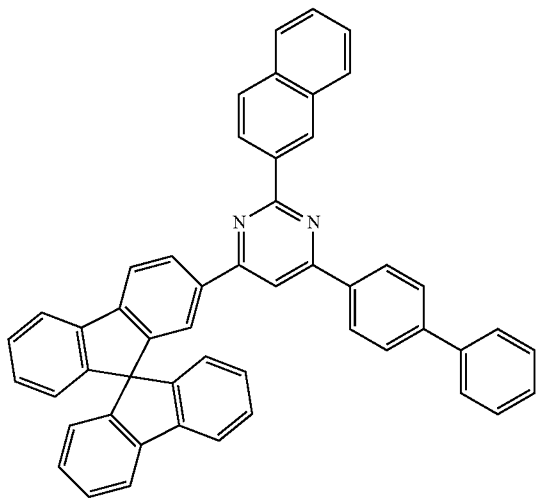
ET30
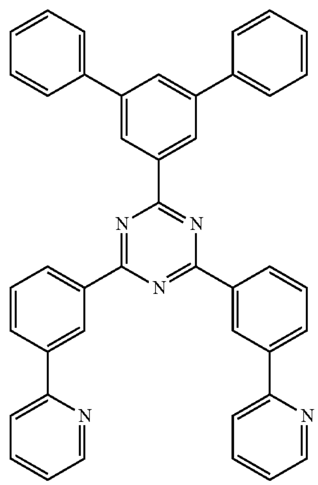
-continued
ET31
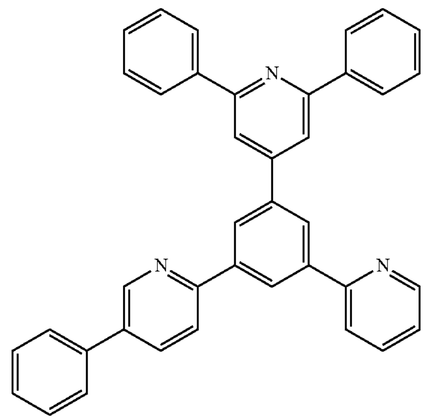
ET32
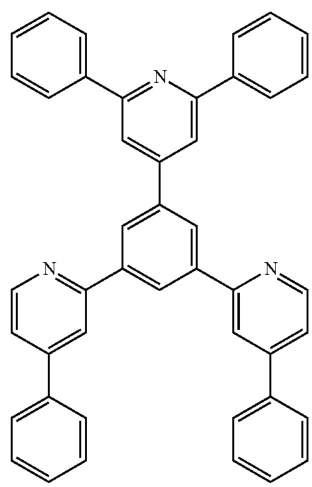
ET33
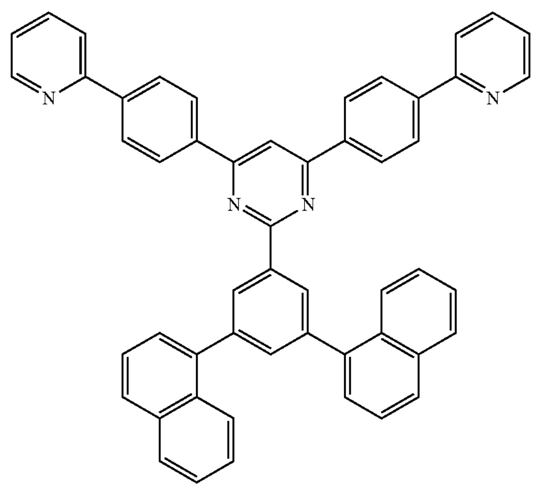

-continued

ET34

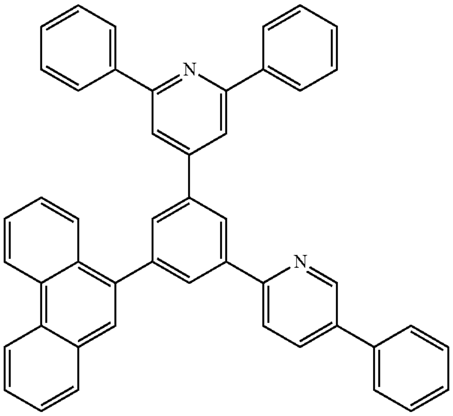

ET35

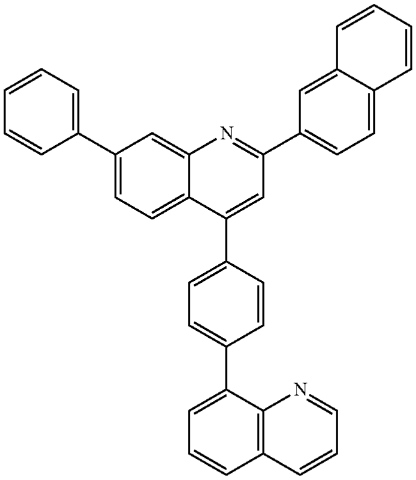

ET36

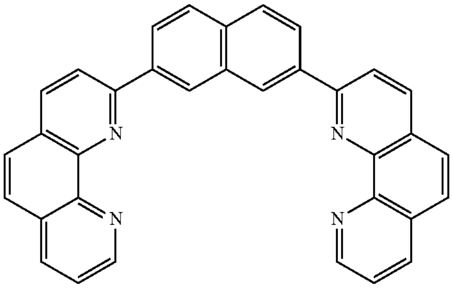

The electron transport region ETR may include halogenated metals such as LiF, NaCl, CsF, RbCl, RbI, CuI, and KI, lanthanide metals such as Yb, or co-deposition materials of a halogenated metal and a lanthanide metal. For example, the electron transport region ETR may include KI:Yb, RbI:Yb, etc. as a co-deposition material. The electron transport region ETR may include a metal oxide such as $Li_2O$ and BaO, or 8-hydroxyl-lithium quinolate (Liq), etc., but embodiments are not limited thereto. The electron transport region ETR may also be formed of a mixture material of an electron transport material and an insulating organo-metal salt. The organo-metal salt may be a material having an energy band gap equal to or greater than about 4 eV. For example, the organo-metal salt may include metal acetates, metal benzoates, metal acetoacetates, metal acetylacetonates, or metal stearates, but the embodiment is not limited thereto.

The electron transport region ETR may include the compounds of the electron transport region described above in at least one of the electron injection layer EIL, the electron transport layer ETL, and the hole blocking layer HBL.

When the electron transport region ETR includes an electron transport layer ETL, the electron transport layer ETL may have a thickness in a range of about 100 Å to about 1,000 Å.

For example, the electron transport layer ETL may have a thickness in a range of about 150 Å to about 500 Å. When the thickness of the electron transport layer ETL satisfies the above-described ranges, satisfactory electron transport properties may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. When the thickness of the electron injection layer EIL satisfies the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In an embodiment, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown in the drawings, the second electrode EL2 may be electrically connected to an auxiliary electrode. When the second electrode EL2 is electrically connected to the auxiliary electrode, the resistance of the second electrode EL2 may decrease.

In an embodiment, the organic electroluminescence device ED may further include a capping layer CPL disposed on the second electrode EL2. The capping layer CPL may include a multilayer or a single layer.

In an embodiment, the capping layer CPL may include an organic layer or an inorganic layer. For example, when the capping layer CPL includes an inorganic material, the inorganic material may include an alkali metal compound such as LiF, an alkaline earth metal compound such as $MgF_2$, SiON, $SiN_X$, SiOy, etc.

For example, when the capping layer CPL includes an organic material, the organic material may include α-NPD, NPB, TPD, m-MTDATA, $Alq_3$ CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., or may include epoxy resins or acrylates such as methacrylates. However, embodiments are not limited thereto, and the capping layer CPL may further include compounds P1 to P5 below.

P1

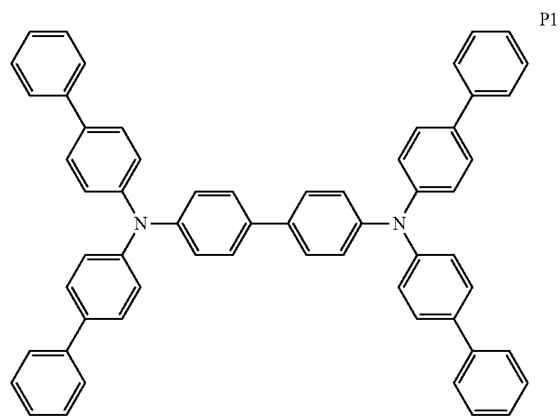

P2

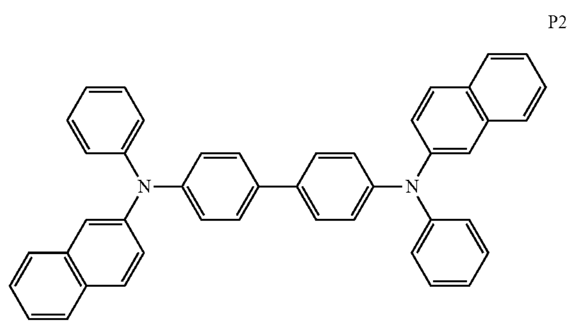

P3

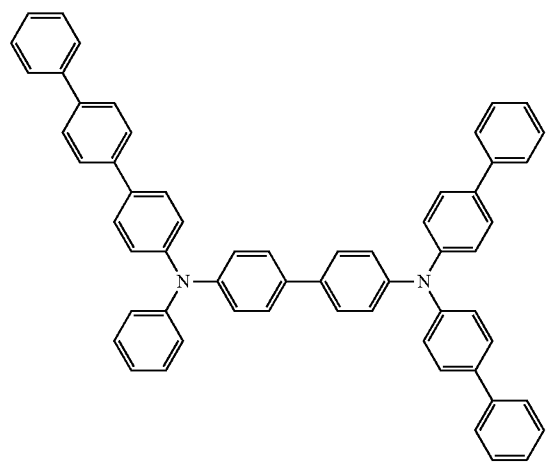

-continued

P4

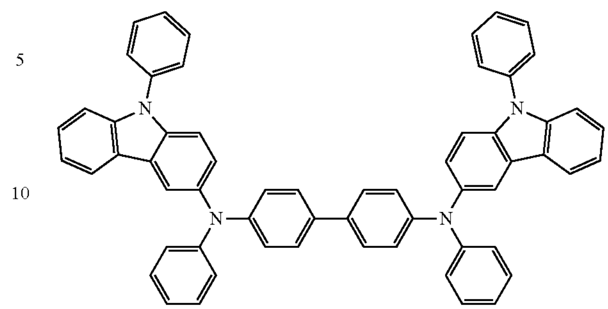

P5

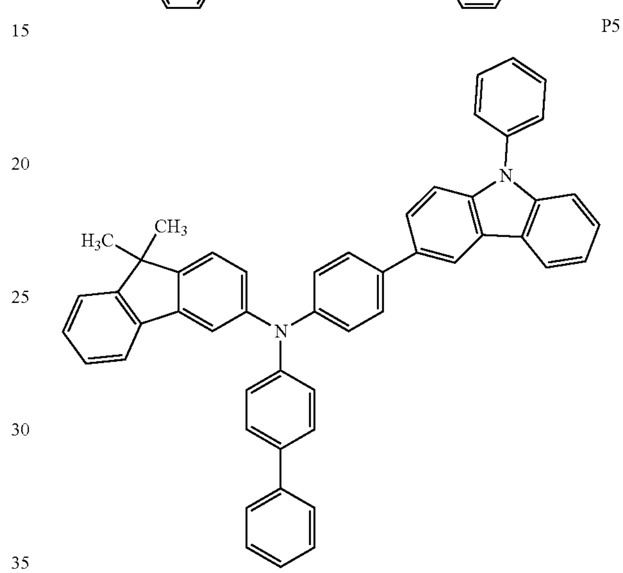

The capping layer CPL may have a refractive index equal to or greater than about 1.6. For example, the capping layer CPL may have a refractive index equal to or greater than about 1.6 in a wavelength range of about 550 nm to about 660 nm.

Figure 7:
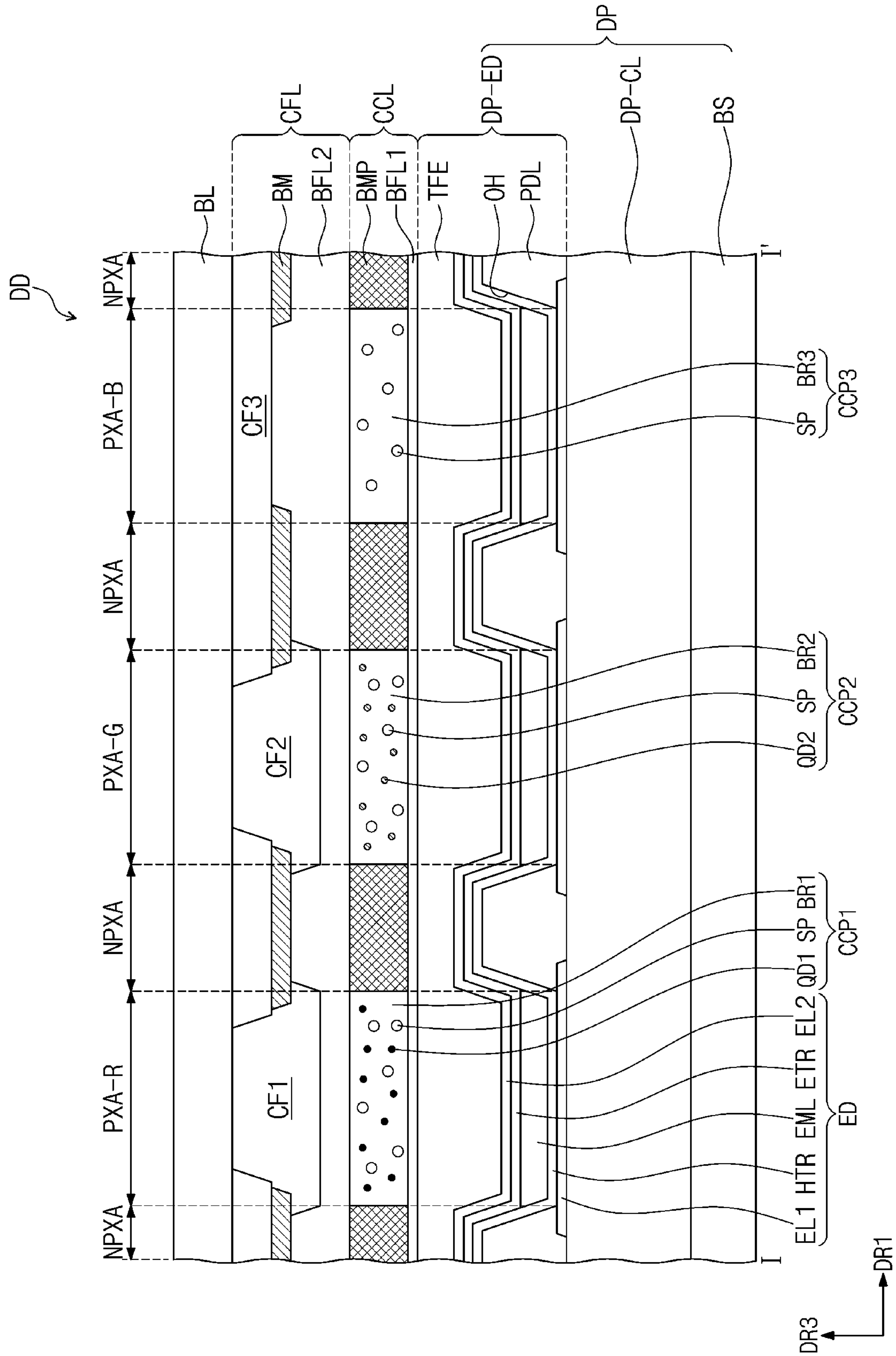
FIG. 7 is a schematic cross-sectional view of a display apparatus according to an embodiment.
Figure 8:
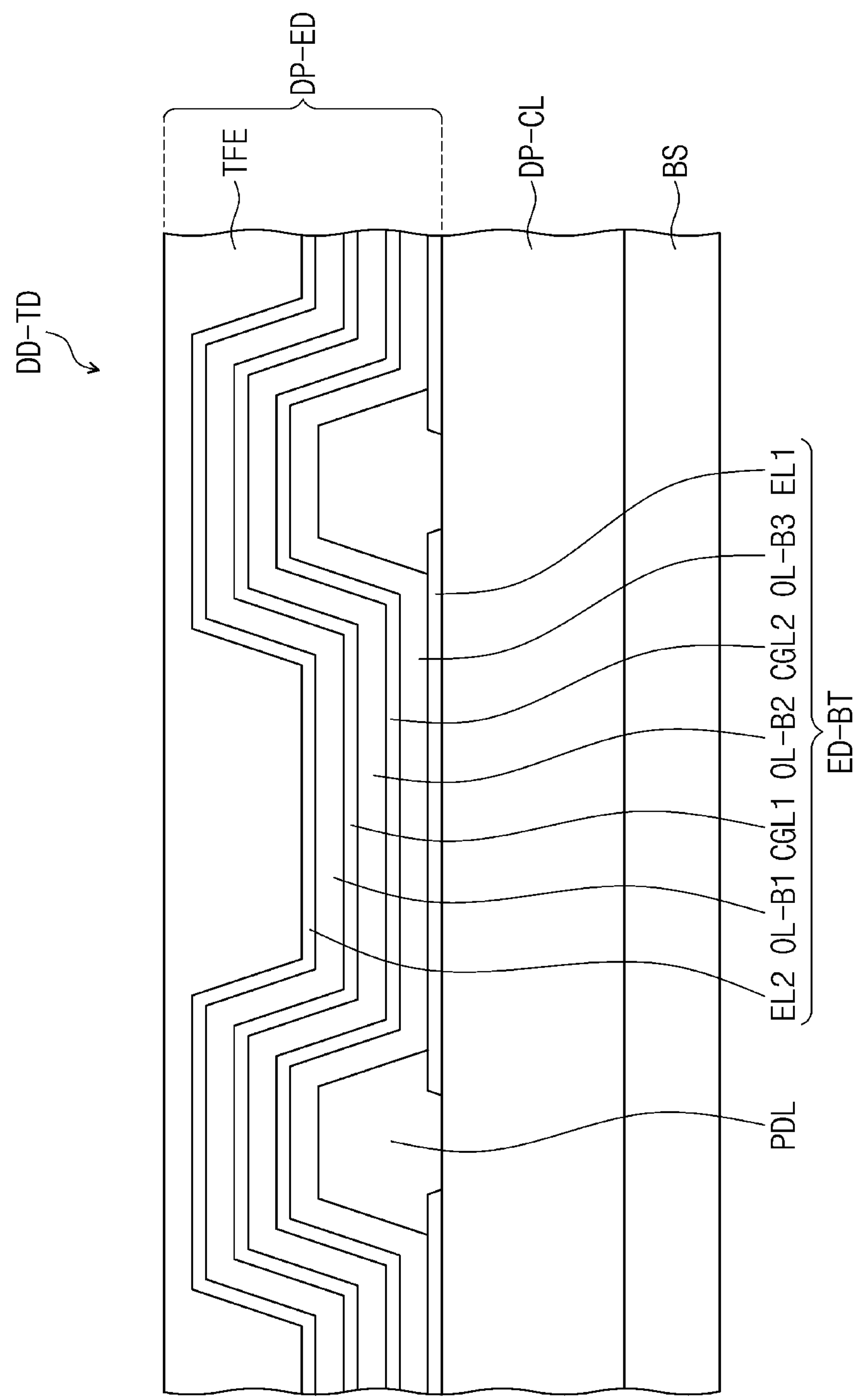
FIG. 8 is a schematic cross-sectional view of a display apparatus according to an embodiment.

FIGS. 7 and 8 are each a schematic cross-sectional view of a display apparatus according to an embodiment. Hereinafter, in the description of the display apparatus according to an embodiment with reference to FIGS. 7 and 8, the descriptions overlapping with what has been described above with reference to FIGS. 1 to 6 will not be described again, and the differences will be described.

Referring to FIG. 7, a display apparatus DD according to an embodiment may include a display panel DP having a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and a display device layer DP-ED, and the display device layer DP-ED may include an organic electroluminescence device ED.

The organic electroluminescent device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the organic electroluminescence device ED illustrated in FIG. 7 may be the same as the structure of the organic electroluminescence device of FIGS. 3 to 6 as described above.

Referring to FIG. 7, the emission layer EML may be disposed in the opening OH defined in the pixel defining film PDL. For example, the emission layer EML separated by the pixel defining film PDL and provided corresponding to each of light emitting areas PXA-R, PXA-G, and PXA-B may emit light in a same wavelength range. In the display apparatus DD of an embodiment, the emission layer EML may emit blue light. Although not shown in the drawings, in an embodiment, the emission layer EML may be provided as a common layer for all light emitting areas PXA-R, PXA-G, and PXA-B.

The light control layer CCL may be disposed on the display panel DP. The light control layer CCL may include a photoconverter. The photoconverter may include a quantum dot or a phosphor. The photoconverter may convert the wavelength of received light, and emit the resulting light. For example, the light control layer CCL may be a layer containing quantum dots or phosphors.

The quantum dot may be selected from a Group II-VI compound, a Group III-VI compound, a Group I-III-VI compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group I-III-VI compound may include a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, or any mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAiP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in particles at a uniform concentration distribution, or may be present in the same particles at a partially different concentration distribution. The quantum dot may have a core/shell structure in which one quantum dot surrounds another quantum dot. The core/shell structure may have a concentration gradient in which the concentration of an element that is present in the shell decreases towards the core.

In embodiments, the quantum dot may have the core/shell structure including a core having nano-crystals, and a shell surrounding the core, which are described above. The shell of the quantum dot may be a protection layer that prevents chemical deformation of the core so as to keep semiconductor properties, and/or may be a charging layer to impart electrophoresis properties to the quantum dot. The shell may be a single layer or multiple layers. Examples of the shell of the quantum dot may be a metal or non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

A quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity and/or color reproducibility may be enhanced in the above ranges. Light emitted through such a quantum dot may be emitted in all directions, and thus a wide viewing angle may be improved.

The form of a quantum dot is not particularly limited and may be a form commonly used in the art. For example, the quantum dot may have a spherical, a pyramidal, a multi-arm, or a cubic shape, or the quantum dot may be in the form of nanoparticles, nanotubes, nanowires, nanofibers, nanoplatelets, etc.

The quantum dot may control the color of emitted light according to a particle size thereof, and thus the quantum dot may have various light emission colors such as blue, red, green, etc.

The light control layer CCL may include light control units CCP1, CCP2, and CCP3. The light control units CCP1, CCP2, and CCP3 may be spaced apart from each other.

Referring to FIG. 7, a division pattern BMP may be disposed between the light control units CCP1, CCP2, and CCP3 spaced apart from each other, but embodiments are not limited thereto. In FIG. 7, the division pattern BMP is shown not to overlap the light control units CCP1, CCP2, and CCP3, but at least a portion of the edges of the light control units CCP1, CCP2, and CCP3 may overlap the division pattern BMP.

The light control layer CCL may include a first light control unit CCP1 including a first quantum dot QD1 that converts first color light provided from the organic electroluminescence device ED into second color light, a second light control unit CCP2 including a second quantum dot QD2 that converts the first color light into third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the organic electroluminescence device ED. For example, the first quantum dot QD1 may be a red quantum dot and the second quantum dot QD2 may be a green quantum dot. The same descriptions provided above with respect to quantum dots may be applied to the quantum dots QD1 and QD2.

The light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The light control layer CCL may include a barrier layer BFL1. The barrier layer BFL1 may prevent permeation of moisture and/or oxygen (hereinafter referred to as "moisture/oxygen"). The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. A barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. The barrier layers BFL1 and BFL2 may further include an organic film. The barrier layers BFL1 and BFL2 may be formed of a single layer or of multiple layers.

In the display apparatus DD of an embodiment, the color filter layer CFL may be disposed on the light control layer CCL. For example, the color filter layer CFL may be directly disposed on the light control layer CCL. In an embodiment, the barrier layer BFL2 may be omitted.

The color filter layer CFL may include a light blocking unit BM and filters CF1, CF2, and CF3. For example, the color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. The filters CF1, CF2, and CF3 each may include a polymer photosensitive resin, a pigment, or a dye. The first filter CF1 may include a red pigment or a red dye, the second filter CF2 may include a green pigment or a green dye, and the third filter CF3 may include a blue pigment or a blue dye. However, embodiments are not limited thereto, and the third filter CF3 may not include a pigment or a dye. The third filter CF3 may include a polymer photosensitive resin, but not include a pigment or a dye. The third filter CF3 may be transparent. The third filter CF3 may be formed of a transparent photosensitive resin.

In an embodiment, the first filter CF1 and the second filter CF2 may be yellow filters. The first filter CF1 and the second filter CF2 may not be separated from each other and may be provided as a single body.

The light blocking unit BM may be a black matrix. The light blocking unit BM may include an organic light blocking material or an inorganic light blocking material, each including a black pigment or a black dye. The light blocking unit BM may prevent light leakage, and may separate boundaries between the adjacent filters CF1, CF2, and CF3. In an embodiment, the light blocking unit BM may be formed of a blue filter.

The first to third filters CF1, CF2, and CF3 may be disposed corresponding to the red light emitting area PXA-R, green light emitting area PXA-G, and blue light emitting area PXA-B, respectively.

A base substrate BL may be disposed on the color filter layer CFL. The base substrate BL may provide a base surface on which the color filter layer CFL and the light control layer CCL are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

FIG. 8 is a schematic cross-sectional view showing a portion of a display apparatus according to an embodiment. FIG. 8 illustrates a schematic cross-sectional view of a portion corresponding to the display panel DP of FIG. 7. In a display apparatus DD-TD of an embodiment, an organic electroluminescence device ED-BT may include light emitting structures OL-B1, OL-B2, and OL-B3. The organic electroluminescence device ED-BT may include the first electrode EL1 and the second electrode EL2 facing each other, and the light emitting structures OL-B1, OL-B2, and OL-B3 provided by being sequentially stacked in a thickness direction between the first electrode EL1 and the second electrode EL2. The light emitting structures OL-B1, OL-B2, and OL-B3 each may include the emission layer EML (FIG. 7), and a hole transport region HTR and an electron transport region ETR, with the emission layer EML (FIG. 7) disposed therebetween.

For example, the organic electroluminescence device ED-BT included in the display apparatus DD-TD according to an embodiment may be an organic electroluminescence device having a tandem structure including multiple emission layers.

In an embodiment illustrated in FIG. 8, light emitted from each of the light emitting structures OL-B1, OL-B2, and OL-B3 may all be blue light. However, embodiments are not limited thereto, and wavelength ranges of light emitted from each of the light emitting structures OL-B1, OL-B2, and OL-B3 may be different from each other. For example, the organic electroluminescence device ED-BT including the light emitting structures OL-B1, OL-B2, and OL-B3 emitting light in different wavelength ranges may emit white light.

Charge generation layers CGL1 and CGL2 may be disposed between neighboring light emitting structures OL-B1, OL-B2, and OL-B3. The charge generation layers CGL1 and CGL2 may each include a p-type charge generation layer and/or an n-type charge generation layer.

Hereinafter, embodiments will be described through the Examples and Comparative Examples. The Examples shown below are illustrated only for the understanding of the disclosure, and the scope thereof is not limited thereto.

Synthesis Examples

Polycyclic compounds according to an embodiment may be synthesized, for example, as follows. However, a process of the synthesizing of polycyclic compounds according to an embodiment is not limited to thereto.

1. Synthesis of Compound 49

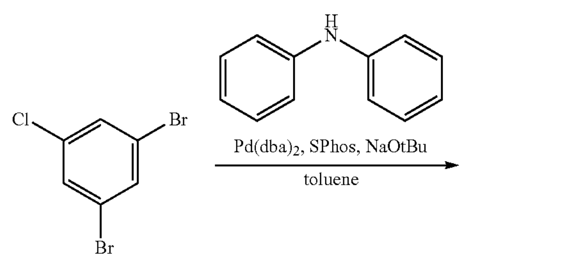

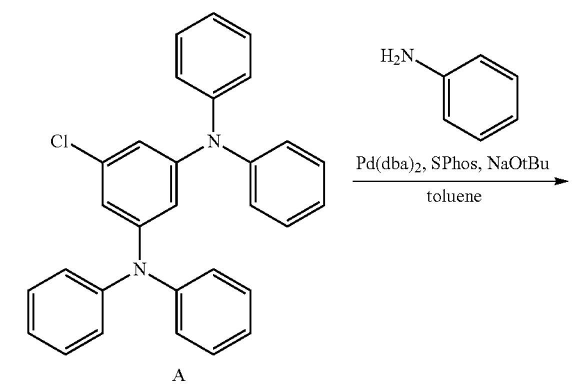

A

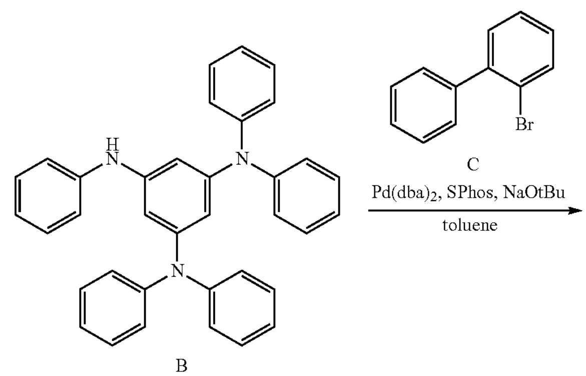

C

B

-continued

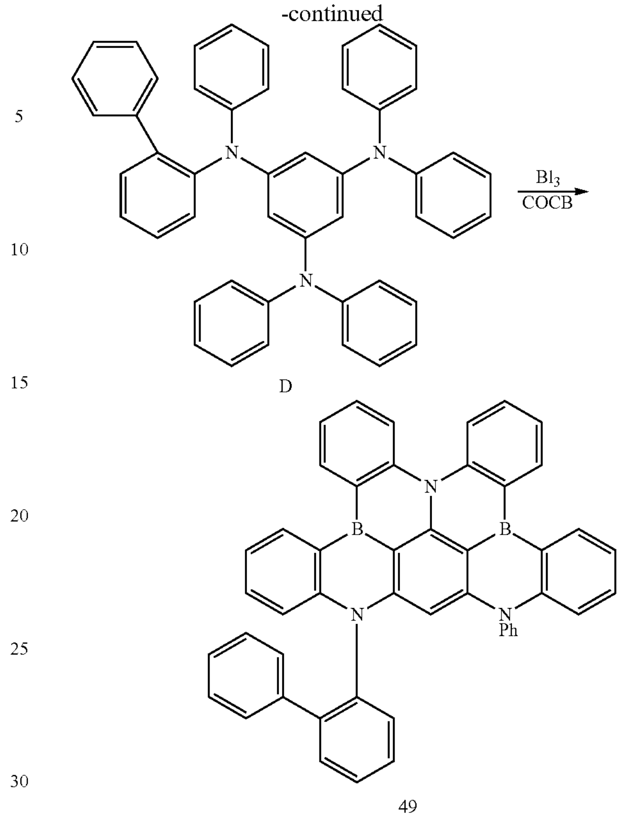

D

49

In an Ar atmosphere, 1,3-dibromo-5-chlorobenzene (50.0 g), diphenylamine (62.6 g), bis(dibenzylideneacetone)palladium(0) ($Pd(dba)_2$, 2.12 g), 2-dicyclohexylphosphino-2',6'-dimethoxybiphenyl (SPhos, 1.56 g), sodium tert-butoxide (NaOtBu, 36.0 g) were added to a three-neck flask (1,000 mL), and the mixture was dissolved in toluene (500 ml) to reflux for 2 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain A (74.4 g, yield: 90%). The mass number of A was 446 as measured by FAB-MS.

In an Ar atmosphere, A (35.0 g), aniline (10.9 g), $Pd(dba)_2$ (0.45 g), SPhos (0.32 g), and NaOtBu (11.3 g) were added to a three-neck flask (500 mL), and the mixture was dissolved in toluene (200 ml) to reflux for one hour. After returning to room temperature, water was added thereto to extract a product using $CH_2Cl_2$, and the product was dried using $MgSO_4$ after an organic layer was added, and the solvent was distilled off under reduced pressure. Ethanol was added to the obtained crude product and the resultant mixture was subjected to ultrasonic cleaning to obtain B (37.1 g, yield: 94%). The mass number of B was 503 as measured by FAB-MS.

In an Ar atmosphere, B (20.0 g), 3-bromobiphenyl C (21.1 g), $Pd(dba)_2$ (0.11 g), SPhos (0.08 g), and NaOtBu (1.91 g) were added to a three-neck flask (1,000 mL), and the mixture was dissolved in toluene (300 ml) to reflux for 3 hours. Water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain D (15.6 g, yield: 60%). The mass number of D was 655 as measured by FAB-MS.

In an Ar atmosphere, D (12.0 g) was added to a three-neck flask (300 mL), dissolved in o-Dichlorobenzene (ODCB, 100 mL), and cooled to 0° C. in an ice bath, and boron triiodide ($BI_3$, 53.0 g) was added thereto, and the resultant mixture was heated and stirred at 180° C. for 18 hours and cooled to 0° C. in an ice bath, and triethylamine (25 mL) was added thereto. After returning to room temperature, the reaction solution was filtered using silica gel, and the filtration solvent was distilled off under reduced pressure. The obtained crude product was purified through recrystallization from toluene to obtain Compound 49 (1.15 g, yield: 5%). The mass number of Compound 49 was 671 as measured by FAB-MS.

2. Synthesis of Compound 50

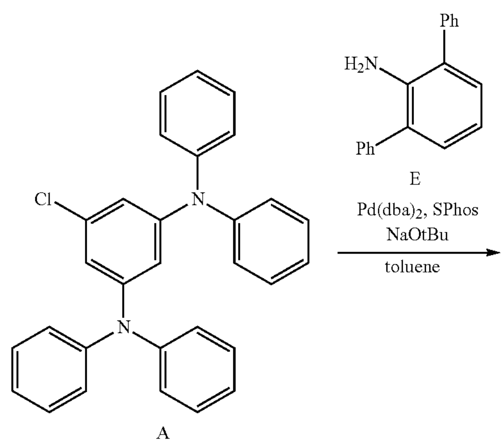

E

A

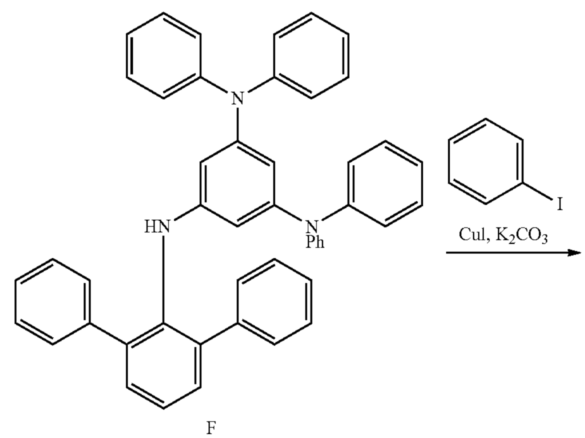

F

-continued

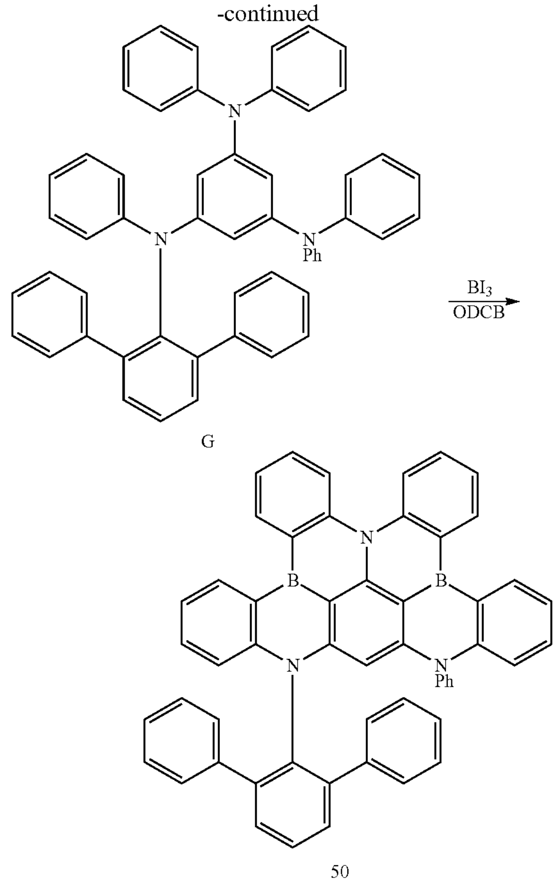

G

50

Amine analogue E was synthesized with reference to a non-patent document (J. Org. Chem., 2017, 82, 18, 9418-9424).

In an Ar atmosphere, A (35.0 g), amine analogue E (28.7 g), $Pd(dba)_2$ (0.45 g), SPhos (0.32 g), and NaOtBu (11.3 g) were added to a three-neck flask (1,000 mL), and the mixture was dissolved in toluene (200 ml) to reflux for 4 hours. After returning to room temperature, water was added thereto to extract a product using $CH_2Cl_2$, and the product was dried using $MgSO_4$ after an organic layer was added, and the solvent was distilled off under reduced pressure. Ethanol was added to the obtained crude product and the resultant mixture was subjected to ultrasonic cleaning to obtain F (30.1 g, yield: 59%). The mass number of F was 655 as measured by FAB-MS.

In an Ar atmosphere, F (28.0 g), Ph-I (44 g), CuI (12.2 g), and $K_2CO_3$ (17.9 g) were added to a three-neck flask (300 mL), and the mixture was heated and stirred at 190° C. for 72 hours After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain G(19.2 g, yield: 61%). The mass number of G was 731 as measured by FAB-MS.

In an Ar atmosphere, G (17.0 g) was added to a three-neck flask (300 mL), dissolved in ODCB (100 mL), and cooled to 0° C. in an ice bath, and boron triiodide ($BI_3$, 36 g) was added thereto, and the resultant mixture was heated and stirred at 170° C. for 18 hours and cooled to 0° C. in an ice bath, and triethylamine (25 mL) was added thereto. After returning to room temperature, the reaction solution was filtered using silica gel, and the filtration solvent was distilled off under reduced pressure. The obtained crude product was purified through recrystallization from ODCB to obtain Compound 50 (1.31 g, yield: 8%). The mass number of Compound 50 was 747 as measured by FAB-MS.

3. Synthesis of Compounds 2 and 35

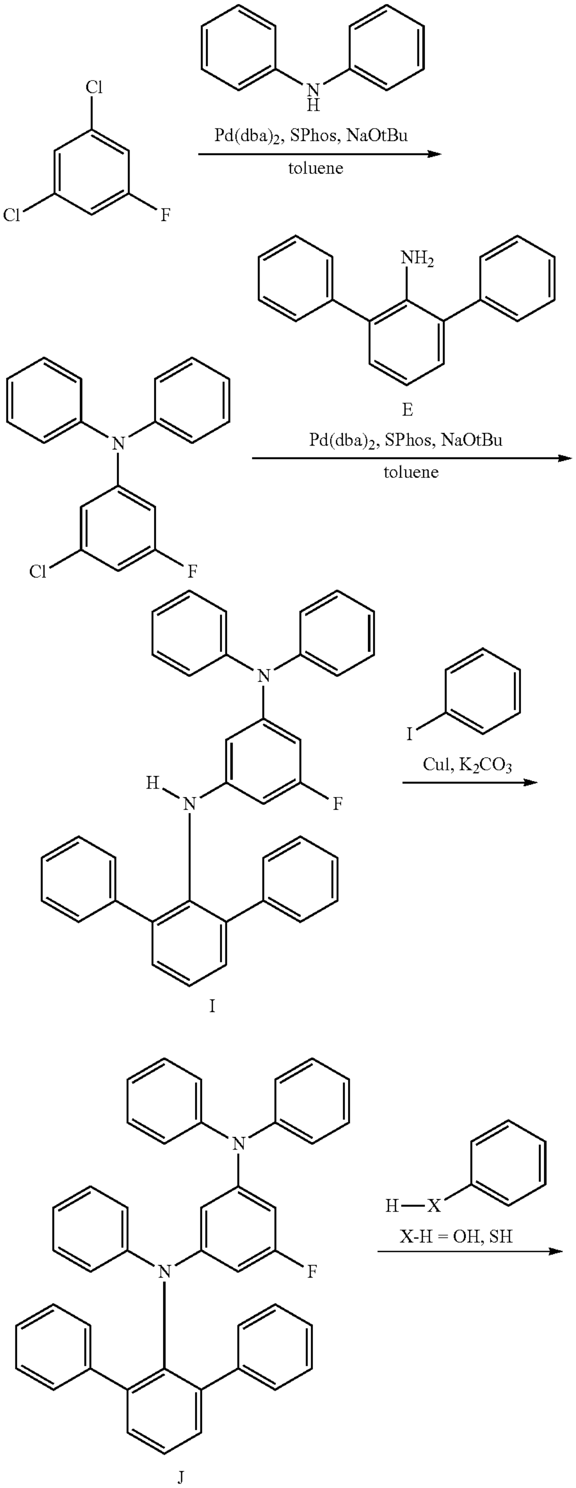

-continued

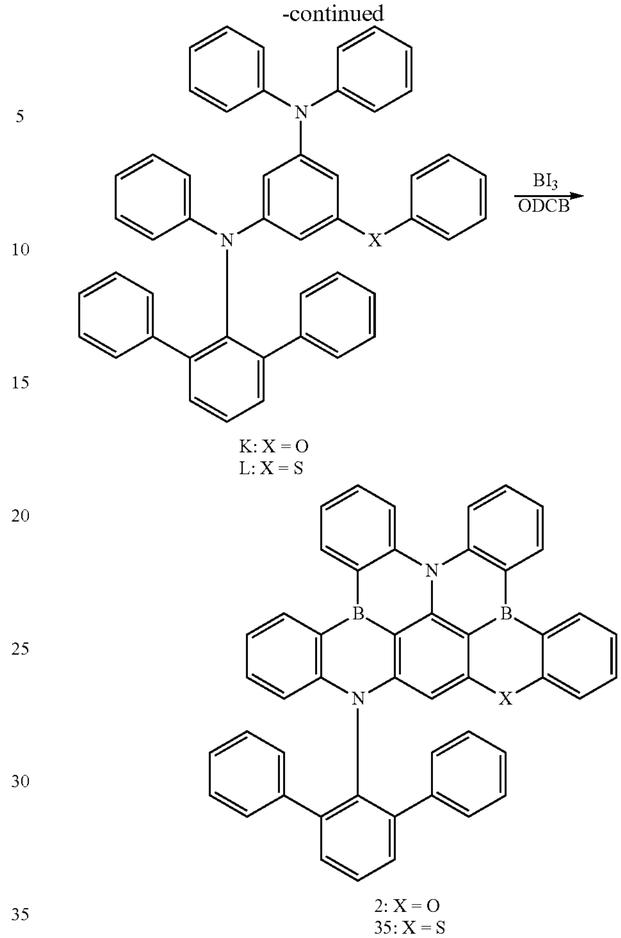

In an Ar atmosphere, 1,3-dichloro-5-fluorobenzene (100.0 g), diphenylamine (102 g), Pd(dba)$_2$ (2.1 g), SPhos (1.6 g), and NaOtBu (74.0 g) were added to a three-neck flask (2,000 mL), and the mixture was dissolved in toluene (1,100 ml) to reflux for 2 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain $C_6H_3$-1-Cl-3-F-5-$NPh_2$ (117 g, yield: 65%). The mass number of $C_6H_3$-1-Cl-3-F-5-$NPh_2$ was 297 as measured by FAB-MS.

In an Ar atmosphere, $C_6H_3$-1-Cl-3-F-5-$NPh_2$ (89 g), amine analogue E (8.5 g), Pd(dba)$_2$ (0.9 g), SPhos (0.64 g), and NaOtBu (6.0 g) were added to a three-neck flask (2,000 mL), and the mixture was dissolved in toluene (700 ml) to reflux for 5 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain I (132 g, yield: 87%). The mass number of I was 506 as measured by FAB-MS.

In an Ar atmosphere, I (101 g), Ph-I (282 g), and $K_2CO_3$ (90 g) were added to a three-neck flask (1,000 mL), and the mixture was heated and stirred at 190° C. for 72 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain J (82 g, yield: 70%). The mass number of J was 582 as measured by FAB-MS.

In an Ar atmosphere, J (66 g), phenol (220 g), and $Cs_2CO_3$ (98 g) were added to a three-neck flask (1,000 mL), and the mixture was heated and stirred at 170° C. for 24 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain K (29 g, yield: 44%). The mass number of K was 656 as measured by FAB-MS.

L was synthesized in the same manner as the synthesis of K, using thiophenol instead of phenol, to obtain L (13 g, yield: 19%). The mass number of L was 672 as measured by FAB-MS.

In an Ar atmosphere, K (13.4 g) was added to a three-neck flask (300 mL), dissolved in ODCB (150 mL), and cooled to 0° C. in an ice bath, and boron triiodide ($BI_3$, 32 g) was added thereto, and the resultant mixture was heated and stirred at 160° C. for 12 hours and cooled to 0° C. in an ice bath, and triethylamine (34 mL) was added thereto. After returning to room temperature, the reaction solution was filtered using silica gel, and the filtration solvent was distilled off under reduced pressure. The obtained crude product was purified through recrystallization from toluene to obtain Compound 2 (2.9 g, yield: 22%). The mass number of Compound 2 was 672 as measured by FAB-MS.

Compound 35 was synthesized in the same manner as the synthesis of Compound 2, using L instead of K, to obtain Compound 35 (1.1 g, yield: 8%). The mass number of Compound 35 was 688 as measured by FAB-MS.

4. Synthesis of Compound 26

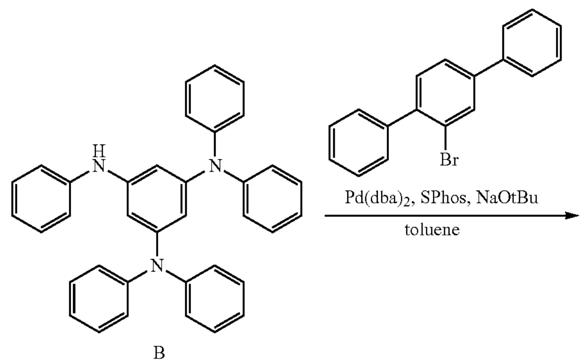

B

-continued

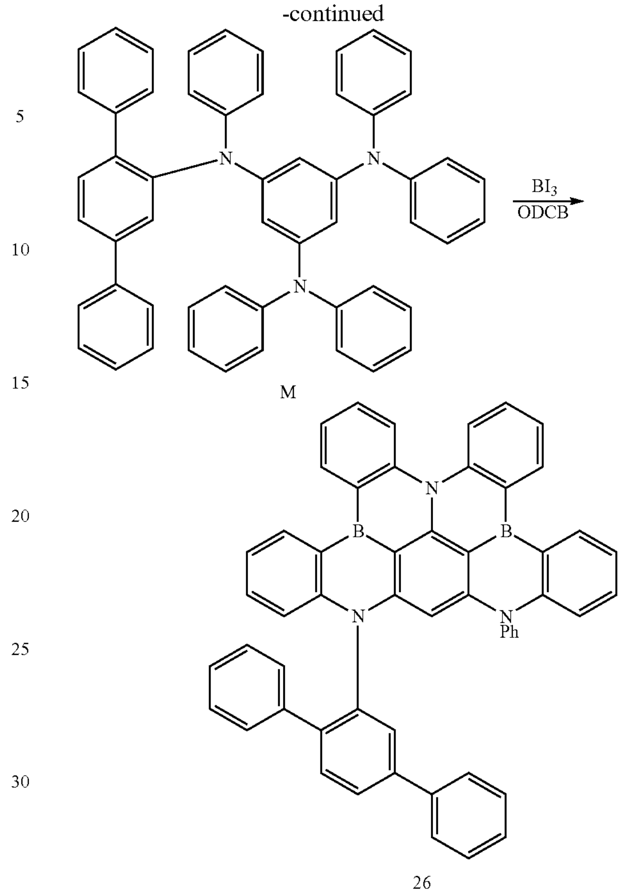

M

26

2'-bromo-p-terphenyl was synthesized through a method described in a non-patent document (Bull. Chem. Soc. Jpn., 1962, 35, 1783).

In an Ar atmosphere, B (20.0 g), 2'-bromo-p-terphenyl (28.1 g), $Pd(dba)_2$ (0.11 g), SPhos (0.08 g), and NaOtBu (3.82 g) were added to a three-neck flask (1,000 mL), and the mixture was dissolved in toluene (500 ml) to reflux for 6 hours. Water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain M (12.1 g, yield: 42%). The mass number of M was 731 as measured by FAB-MS.

In an Ar atmosphere, M (10.3 g) was added to a three-neck flask (300 mL), dissolved in ODCB (100 mL), and cooled to 0° C. in an ice bath, and boron triiodide ($BI_3$, 22 g) was added thereto, and the resultant mixture was heated and stirred at 180° C. for 18 hours and cooled to 0° C. in an ice bath, and triethylamine (25 mL) was added thereto. After returning to room temperature, the reaction solution was filtered using silica gel, and the filtration solvent was distilled off under reduced pressure. The obtained crude product was purified through recrystallization from toluene to obtain Compound 26 (1.41 g, yield: 13%). The mass number of Compound 26 was 747 as measured by FAB-MS.

5. Synthesis of Compound 87

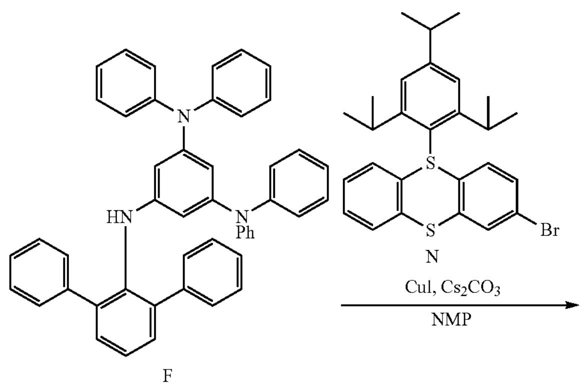

F

N

-continued

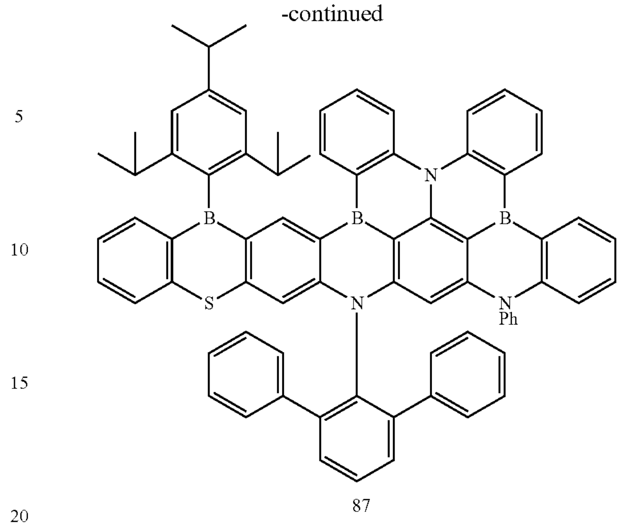

87

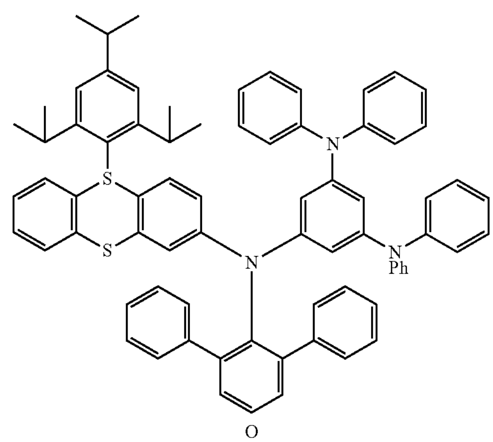

O

Thiaborinine analogue N was synthesized with reference to a non-patent document (Adv. Funct. Mater., 2018, 28, 1802031).

In an Ar atmosphere, F (26.2 g), N (95.1 g), CuI (38 g), and $Cs_2CO_3$ (64 g) were added to a three-neck flask (500 mL), the mixture was suspended in DMF (70 mL), and heated and stirred at 190° C. for 3 days, and CuI (19 g), $Cs_2CO_3$ (32 g), and DMF (25 mL) were further added thereto and the resultant mixture was heated and stirred at 190° C. for 3 days. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain O (8.2 g, yield: 20%). The mass number of O was 1052 as measured by FAB-MS.

In an Ar atmosphere, O (8.0 g) was added to a three-neck flask (300 mL), dissolved in ODCB (100 mL), and cooled to 0° C., in an ice bath, and boron triiodide ($BI_3$, 11.9 g) was added thereto, and the resultant mixture was heated and stirred at 160° C. for 15 hours and cooled to 0° C. in an ice bath, and triethylamine (20 mL) was added thereto. After returning to room temperature, the reaction solution was filtered using silica gel, and the filtration solvent was distilled off under reduced pressure. The obtained crude product was purified through recrystallization from ODCB to obtain Compound 87 (0.84 g, yield: 10%). The mass number of Compound 87 was 1067 as measured by FAB-MS.

6. Synthesis of Compound 89

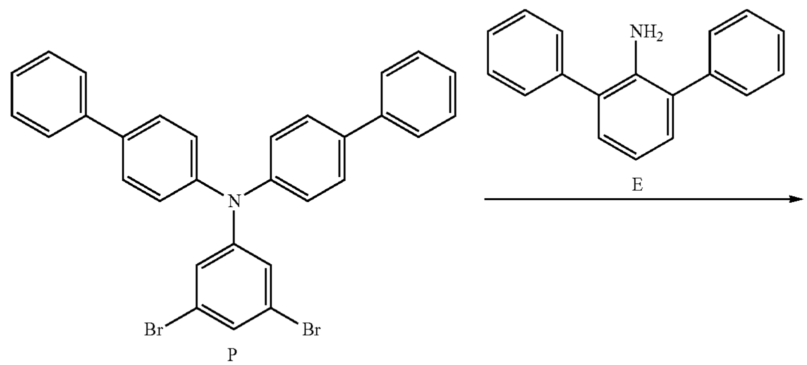

E

P

-continued
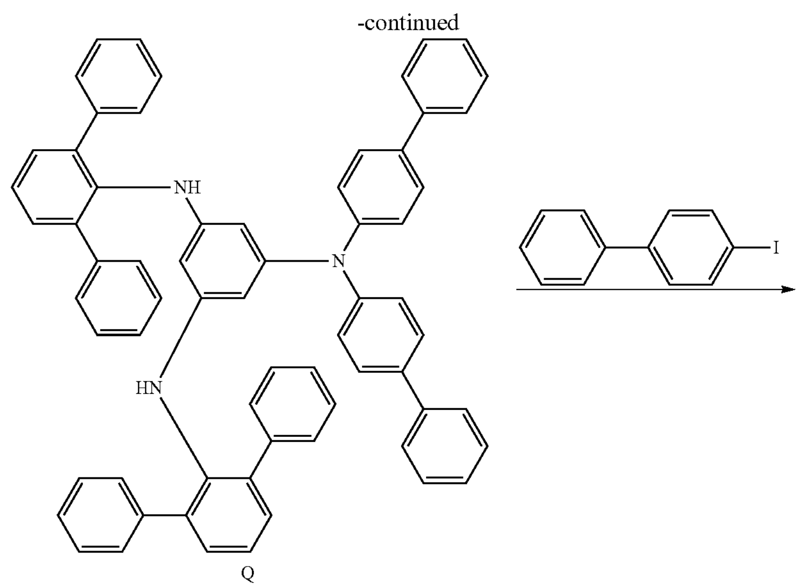
Q
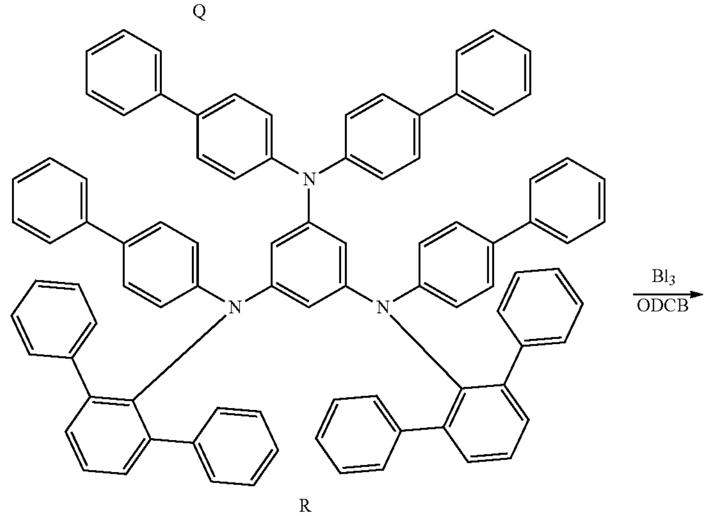
R
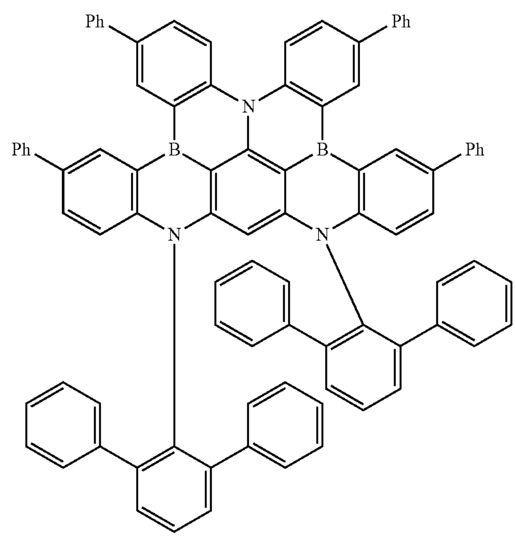
89

$C_6H_3$-1-N($C_6H_4$-4-Ph)$_2$-3,5-$Br_2$ (P) was synthesized with reference to a patent document (CN109836339 Å).

In an Ar atmosphere, P (111 g), amine analogue E (125 g), $Pd(dba)_2$ (1.8 g), SPhos (1.28 g), and NaOtBu (58 g) were added to a three-neck flask (2,000 mL), and the mixture was dissolved in toluene (1,100 ml) to reflux for 8 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain Q (117 g, yield: 66%). The mass number of Q was 1203 as measured by FAB-MS.

In an Ar atmosphere, Q (60 g), Ph-$C_6H_4$-4-I (282 g), CuI (60 g), and $K_2CO_3$ (90 g) were added to a three-neck flask (1,000 mL), and the mixture was heated and stirred at 190° C. for 80 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain R (23 g, yield: 70%). The mass number of R was 1188 as measured by FAB-MS.

In an Ar atmosphere, R (11.9 g) was added to a three-neck flask (300 mL), dissolved in ODCB (200 mL), and cooled to 0° C. in an ice bath, and boron triiodide ($BI_3$, 15.7 g) was added thereto, and the resultant mixture was heated and stirred at 170° C. for 16 hours and cooled to 0° C. in an ice bath, and triethylamine (20 mL) was added thereto. After returning to room temperature, the reaction solution was filtered using silica gel, and the filtration solvent was distilled off under reduced pressure. The obtained crude product was purified through recrystallization from ODCB to obtain Compound 89 (1.1 g, yield: 9%). The mass number of Compound 89 was 1203 as measured by FAB-MS.

7. Synthesis of Compound 2-1

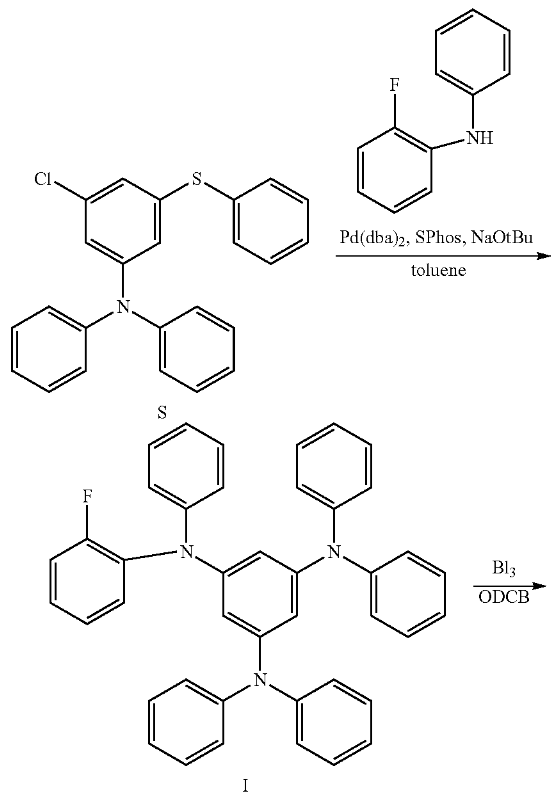

S

I

-continued

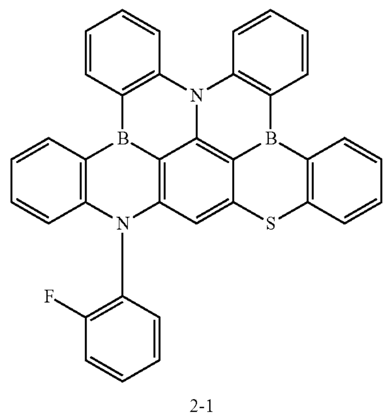

2-1

Compound S was synthesized through a method described in a patent document (CN105859569A).

In an Ar atmosphere, S (38.0 g), 2-fluoro-N-phenylbenzenamine (19.1 g), $Pd(dba)_2$ (0.22 g), SPhos (0.16 g), and NaOtBu (9.8 g) were added to a three-neck flask (1,000 mL), and the mixture was dissolved in toluene (800 ml) to reflux for 6 hours. Water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain T (37.1 g, yield: 62%). The mass number of T was 597 as measured by FAB-MS.

In an Ar atmosphere, T (29.7 g) was added to a three-neck flask (300 mL), dissolved in ODCB (110 mL), and cooled to 0° C. in an ice bath, and boron triiodide ($BI_3$, 32 g) was added thereto, and the resultant mixture was heated and stirred at 190° C. for 22 hours and cooled to 0° C. in an ice bath, and triethylamine (25 mL) was added thereto. After returning to room temperature, the reaction solution was filtered using silica gel, and the filtration solvent was distilled off under reduced pressure. The obtained crude product was purified through recrystallization from toluene to obtain Compound 2-1 (1.25 g, yield: 5%). The mass number of Compound 2-1 was 554 as measured by FAB-MS.

8. Synthesis of Compounds 40, 43, 73, and 105

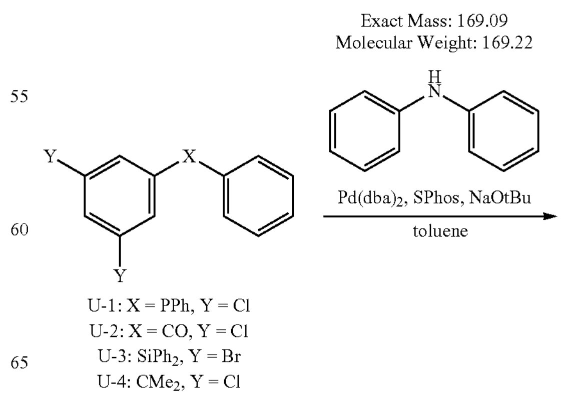

U-1: X = PPh, Y = Cl
U-2: X = CO, Y = Cl
U-3: SiPh$_2$, Y = Br
U-4: CMe$_2$, Y = Cl

-continued

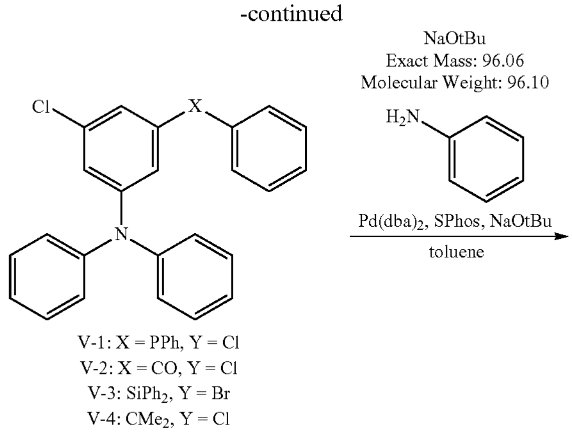

V-1: X = PPh, Y = Cl
V-2: X = CO, Y = Cl
V-3: $SiPh_2$, Y = Br
V-4: $CMe_2$, Y = Cl

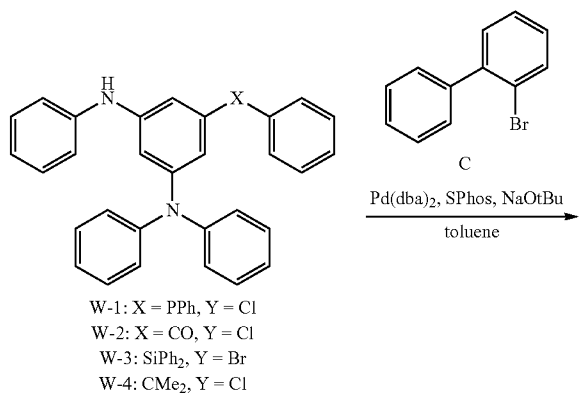

W-1: X = PPh, Y = Cl
W-2: X = CO, Y = Cl
W-3: $SiPh_2$, Y = Br
W-4: $CMe_2$, Y = Cl

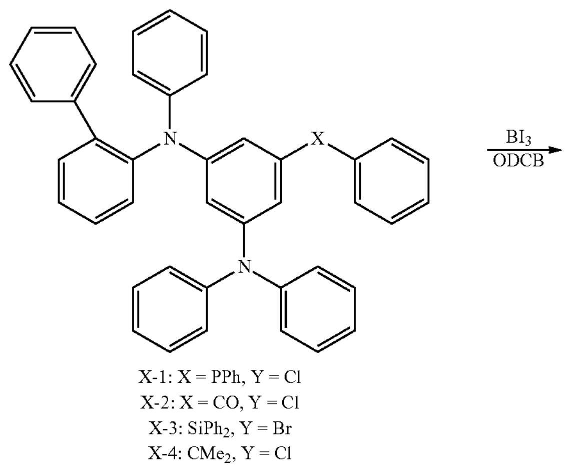

X-1: X = PPh, Y = Cl
X-2: X = CO, Y = Cl
X-3: $SiPh_2$, Y = Br
X-4: $CMe_2$, Y = Cl

-continued

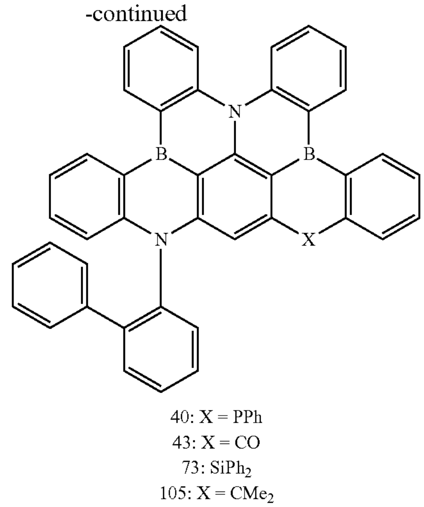

40: X = PPh
43: X = CO
73: $SiPh_2$
105: X = $CMe_2$ (1) Compounds U-1 (Organometallics 2020, 39, 2682), U-3 (JP02290883 A and ACS Catalysis 2017, 7, 8113), U-4 (Mendeleev Communications, 1998, 8, 195.) were synthesized through methods described in documents.

(2) In an Ar atmosphere, Compound U-1 (33.1 g), diphenylamine (16.9 g), $Pd(dba)_2$ (2.1 g), SPhos (1.6 g), and NaOtBu (19.2 g) were added to a three-neck flask (2,000 mL), and the mixture was dissolved in toluene (600 ml) and subjected to reaction at 70° C. for 2 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain Compound V-1 (41.0 g, yield: 89%). The mass number of Compound V-1 was 463 as measured by FAB-MS.

(3) Compound V-2 was synthesized in the same manner as the synthesis of V-1, using Compound U-2 instead of Compound U-1 to obtain Compound V-2 (31.1 g, yield: 81%). The mass number of Compound V-2 was 383 as measured by FAB-MS.

Compound V-3 was synthesized in the same manner as the synthesis of Compound V-1, using Compound U-3 instead of Compound U-1 to obtain Compound V-3 (34.5 g, yield: 87%). The mass number of Compound V-3 was 397 as measured by FAB-MS.

Compound V-4 was synthesized in the same manner as the synthesis of Compound V-1, using Compound U-4 instead of Compound U-1 to obtain Compound V-4 (47.3 g, yield: 88%). The mass number of Compound V-4 was 527 as measured by FAB-MS.

(4) In an Ar atmosphere, V-1 (23.1 g), aniline (45.3 g), $Pd(dba)_2$ (2.1 g), SPhos (1.6 g), and NaOtBu (19.2 g) were added to a three-neck flask (2,000 mL), and the mixture was dissolved in toluene (600 ml) to reflux for 2 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain Compound W-1 (23.7 g, yield: 91%). The mass number of Compound W-1 was 520 as measured by FAB-MS.

Compound W-2 was synthesized in the same manner as the synthesis of Compound W-1, using Compound V-2 instead of Compound V-1 to obtain Compound W-2 (19.1 g, yield: 87%). The mass number of Compound W-2 was 440 as measured by FAB-MS.

Compound W-3 was synthesized in the same manner as the synthesis of Compound W-1, using Compound V-3 instead of Compound V-1 to obtain Compound W-3 (18.3 g, yield: 81%). The mass number of Compound W-3 was 454 as measured by FAB-MS.

Compound W-4 was synthesized in the same manner as the synthesis of Compound W-1, using Compound V-4 instead of Compound V-1 to obtain Compound W-4 (45.9 g, yield: 84%). The mass number of Compound W-4 was 594 as measured by FAB-MS.

(5) In an Ar atmosphere, Compound W-1 (11.3 g), Compound C (5.8 g), $Pd(dba)_2$ (1.1 g), SPhos (0.8 g), and NaOtBu (9.6 g) were added to a three-neck flask (2,000 mL), and the mixture was dissolved in toluene (450 ml) to reflux for 2 hours. After returning to room temperature, water was added thereto to extract a product using $CH_2Cl_2$, and the product was dried using $MgSO_4$ after an organic layer was added, and the solvent was distilled off under reduced pressure. The obtained crude product was purified using silica gel column chromatography to obtain Compound X-1 (11.9 g, yield: 71%). The mass number of Compound X-1 was 672 as measured by FAB-MS.

Compound X-2 was synthesized in the same manner as the synthesis of Compound X-1, using Compound W-2 instead of Compound W-1 to obtain Compound X-2 (10.2 g, yield: 69%). The mass number of Compound X-2 was 592 as measured by FAB-MS.

Compound X-3 was synthesized in the same manner as the synthesis of Compound X-1, using Compound W-3 instead of Compound W-1 to obtain Compound X-3 (10.1 g, yield: 67%). The mass number of Compound X-3 was 606 as measured by FAB-MS.

Compound X-4 was synthesized in the same manner as the synthesis of Compound X-1, using Compound W-4 instead of Compound W-1 to obtain Compound X-4 (14.0 g, yield: 75%). The mass number of Compound X-4 was 746 as measured by FAB-MS.

(6) In an Ar atmosphere, Compound X-1 (6.7 g) was added to a three-neck flask (300 mL), dissolved in ODCB (150 mL), and cooled to 0° C. in an ice bath, and boron triiodide ($BI_3$, 32 g) was added thereto, and the resultant mixture was heated and stirred at 190° C. for 12 hours and cooled to 0° C. in an ice bath, and triethylamine (34 mL) was added thereto. After returning to room temperature, the reaction solution was filtered using silica gel, and the filtration solvent was distilled off under reduced pressure. The obtained crude product was purified through recrystallization from toluene to obtain Compound 40 (0.67 g, yield: 10%). The mass number of Compound 40 was 688 as measured by FAB-MS.

Compound 43 was synthesized in the same manner as the synthesis of Compound 40, using Compound X-2 instead of Compound X-1 to obtain Compound 43 (0.73 g, yield: 11%). The mass number of Compound 43 was 608 as measured by FAB-MS.

Compound 73 was synthesized in the same manner as the synthesis of Compound 40, using Compound X-3 instead of Compound X-1 to obtain Compound 73 (0.81 g, yield: 13%). The mass number of Compound 73 was 622 as measured by FAB-MS.

Compound 105 was synthesized in the same manner as the synthesis of Compound 40, using Compound X-4 instead of Compound X-1 to obtain Compound 105 (0.69 g, yield: 9%). The mass number of Compound 105 was 762 as measured by FAB-MS.

Example of Manufacturing Devices

An organic electroluminescence device was manufactured using compounds of Examples and Comparative Examples below as a material for an emission layer.

Example Compounds

49

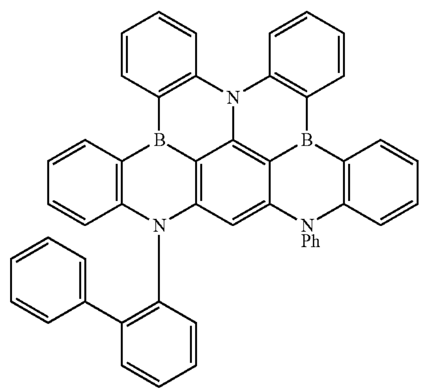

50

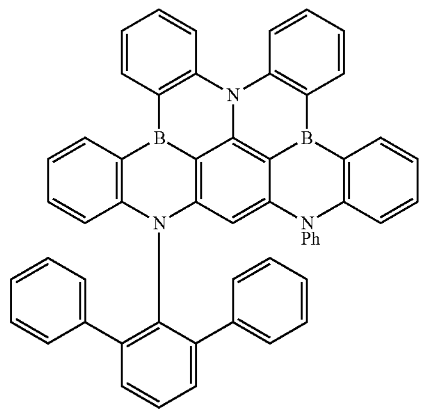

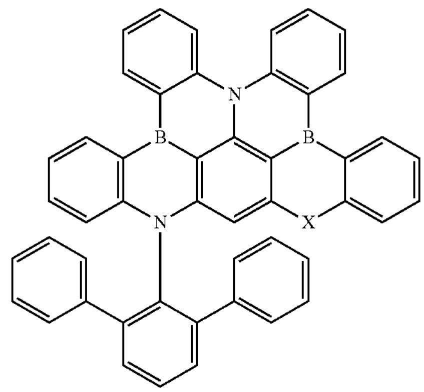

2: X = O
35: X = S

-continued
26
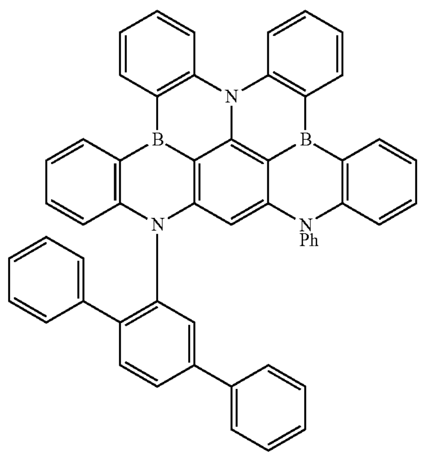
87
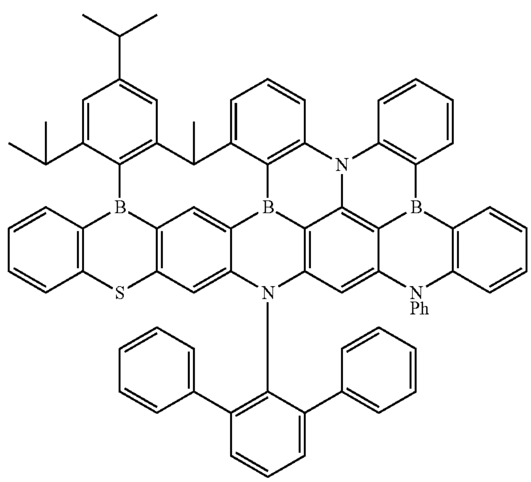
89
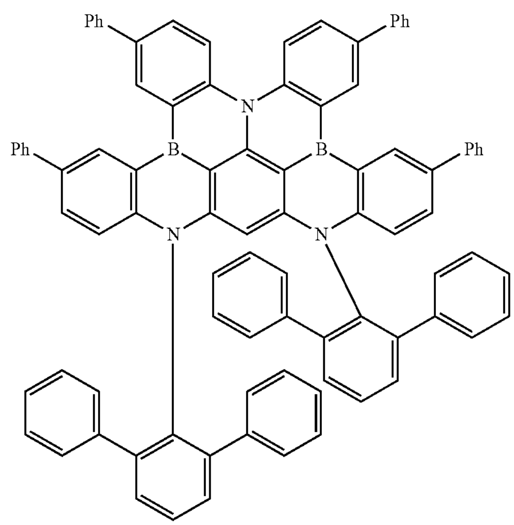
-continued
2-1
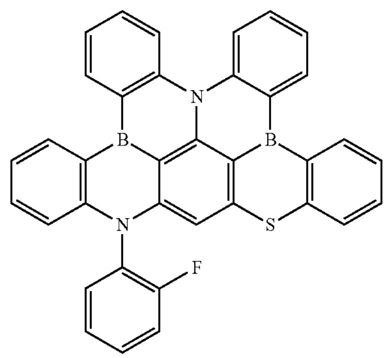
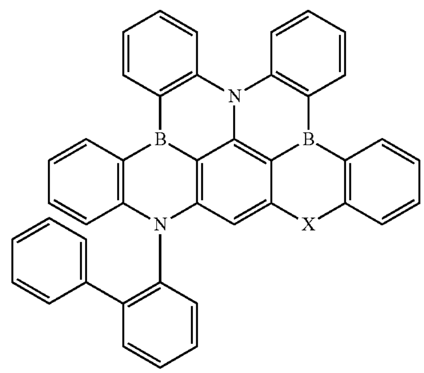
40: X = PPh
43: X = CO
73: $SiPh_2$
105: X = $CMe_2$
Comparative Example Compounds
X-1
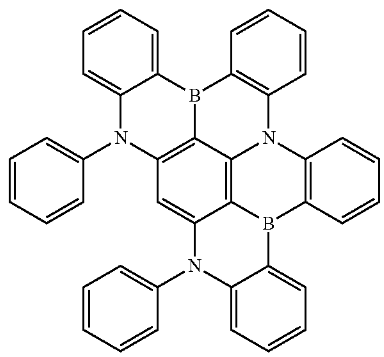

-continued

X-2

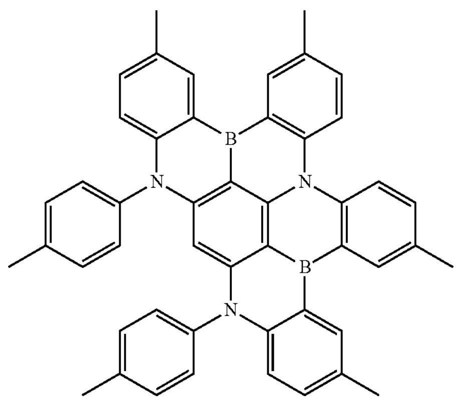

X-3

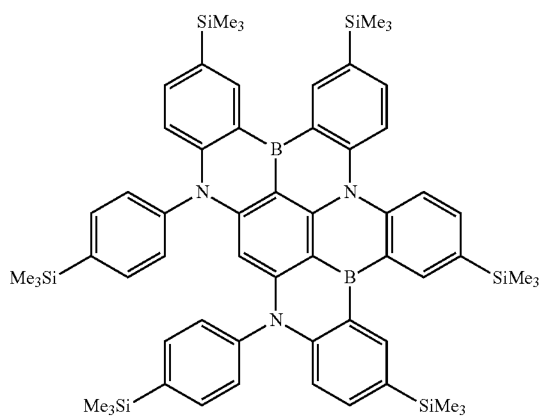

X-4

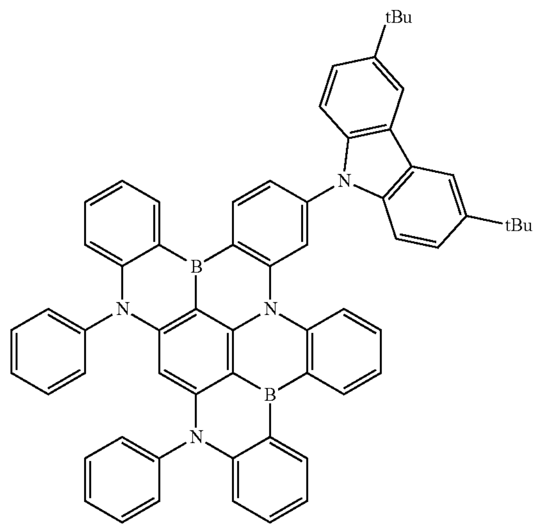

-continued

X-5

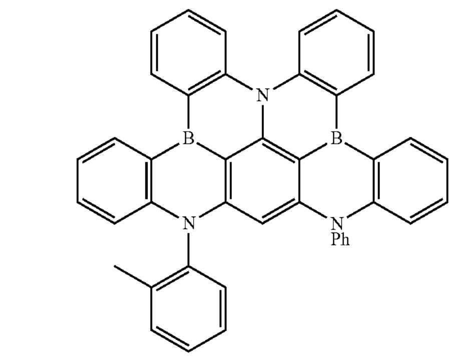

X-6

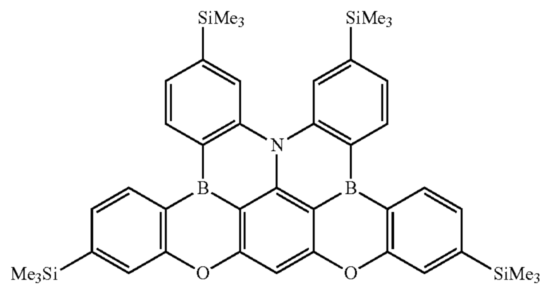

An ITO having a thickness of 1,500 Å was patterned on a glass substrate, washed with ultrapure water, and UV ozone-treated for 10 minutes. HAT-CN was deposited to a thickness of 100 Å, α-NPD was deposited to a thickness of 800 Å, and mCP was deposited to a thickness of 50 Å to form a hole transport region.

When an emission layer is formed, a nitrogen-containing compound of Example or a compound of Comparative Example and mCBP were co-deposited at 1.99 to form a layer having a thickness of 200 Å.

TPBi was used to form a 300 Å-thick layer and LiF was used to form a 5 Å-thick layer on the emission layer to form an electron transport region. Aluminum (Al) was used to form a second electrode having a thickness of 1,000 Å. Compound P4 was used to form a capping layer having a thickness of 600 Å on the second electrode.

The measured values according to Examples 1 to 12 and Comparative Examples 1 to 6 are shown in Table 1 below. Luminous efficiency is expressed with a value measured at 10 mA/cm$^2$, and half-life is expressed with luminance half-life from initial luminance 1,000 cd/cm$^2$.

TABLE 1

| | Emission layer | Emission wavelength (nm) | Luminous efficiency (%) | Lifespan LT50 (h) |
|---|---|---|---|---|
| Example 1 | Example Compound 49 | 461 | 12 | 3.5 |
| Example 2 | Example Compound 50 | 461 | 13 | 5.1 |
| Example 3 | Example Compound 2 | 452 | 13 | 3.1 |
| Example 4 | Example Compound 35 | 468 | 13 | 7.2 |
| Example 5 | Example Compound 26 | 462 | 12 | 3.6 |
| Example 6 | Example Compound 87 | 472 | 14 | 6.9 |
| Example 7 | Example Compound 89 | 460 | 15 | 8.9 |
| Example 8 | Example Compound 2-1 | 459 | 12 | 3.7 |
| Example 9 | Example Compound 40 | 462 | 12 | 3.3 |
| Example 10 | Example Compound 43 | 474 | 14 | 4.2 |
| Example 11 | Example Compound 73 | 464 | 12 | 3.1 |
| Example 12 | Example Compound 105 | 461 | 12 | 2.9 |

TABLE 1-continued

| | Emission layer | Emission wavelength (nm) | Luminous efficiency (%) | Lifespan LT50 (h) |
|---|---|---|---|---|
| Comparative Example 1 | Comparative Example Compound X-1 | 460 | 11 | 1.3 |
| Comparative Example 2 | Comparative Example Compound X-2 | 461 | 10 | 1.5 |
| Comparative Example 3 | Comparative Example Compound X-3 | 461 | 4 | 1.1 |
| Comparative Example 4 | Comparative Example Compound X-4 | 462 | 3 | 0.9 |
| Comparative Example 5 | Comparative Example Compound X-5 | 460 | 10 | 1.2 |
| Comparative Example 6 | Comparative Example Compound X-6 | 451 | 10 | 0.1 |

Referring to Table 1 above, it can be seen that all of Examples 1 to 12 achieve both long life and high efficiency compared to Comparative Examples 1 to 6.

The polycyclic compound according to an embodiment contains a sterically bulky substituent such as a phenyl group at an ortho-position or a fluorine substituent. Accordingly, the polycyclic compound may protect a boron portion in a molecular structure from reactions with water molecules and oxygen molecules which may be present in devices in trace amounts, and achieve both long device life and high device efficiency. The polycyclic compound according to an embodiment may include a sterically bulky substituent at a specific position to protect the boron portion, or may include a fluorine substituent to protect the boron portion through electrostatic repulsion and hydrophobic effects.

It may be seen that Comparative Examples 1 and 5 are similar in luminous efficiency and device life. It is seen that even when Comparative Example 5 has a substituent at the ortho-position, the steric effect is not shown in terms of an alkyl group. It may be seen that Comparative Example 6 is equal to Comparative Example 1 in luminous efficiency, but has reduced device life. This is believed to be due to the fact that the steric protection hardly works with oxygen atoms alone.

The polycyclic compound according to an embodiment may be included in an emission layer to contribute to low driving voltage, high efficiency, and long life of the organic electroluminescence device.

An organic electroluminescence device according to an embodiment has excellent efficiency.

A polycyclic compound according to an embodiment may be used as a material for an emission layer of an organic electroluminescence device, and using the polycyclic compound, the organic electroluminescence device may have improved efficiency.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

The invention claimed is:

1. An organic electroluminescence device comprising:

a first electrode;

a hole transport region disposed on the first electrode;

an emission layer disposed on the hole transport region;

an electron transport region disposed on the emission layer; and a second electrode disposed on the electron transport region, wherein the emission layer includes a polycyclic compound represented by Formula 8:

[Formula 8]

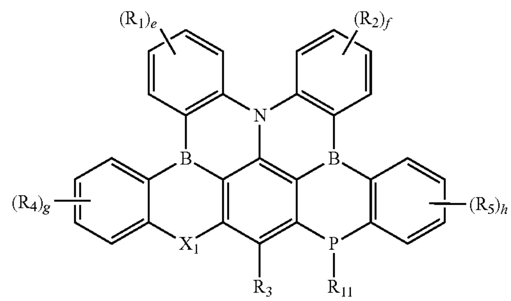

wherein in Formula 8, $R_1$ to $R_5$ are each independently a hydrogen atom, a deuterium atom, a halogen atom, a nitro group, a cyano group, a substituted or unsubstituted amine group, a substituted or unsubstituted thio group, a substituted or unsubstituted silyl group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, e to h are each independently an integer from 0 to 4, $R_{11}$ is a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $X_1$ is a group represented by Formula 3-2:

[Formula 3-2]

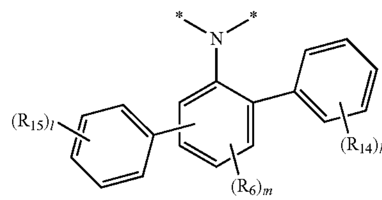

wherein in Formula 3-2, $R_6$ is a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, a phenyl group that includes $R_{15}$ is bonded at a meta-position or an ortho-position to the nitrogen atom in Formula 3-2, $R_{14}$ and $R_{15}$ are each independently a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, k and l are each independently an integer from 0 to 5, m is an integer from 0 to 3, and —* represents a binding site to a neighboring atom.

2. The organic electroluminescence device of claim 1, wherein the emission layer emits delayed fluorescence.

3. The organic electroluminescence device of claim 1, wherein the emission layer is a delayed fluorescence emission layer including a first compound and a second compound, and the first compound includes the polycyclic compound.

4. The organic electroluminescence device of claim 1, further comprising a capping layer disposed on the second electrode, wherein the capping layer has a refractive index equal to or greater than about 1.6.

5. The organic electroluminescence device of claim 1, wherein the polycyclic compound represented by Formula 8 is one selected from Compound Group 1:

41

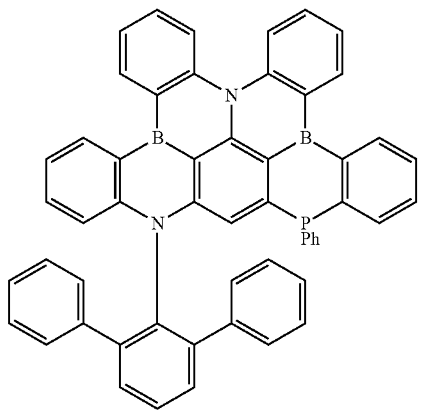

-continued

42

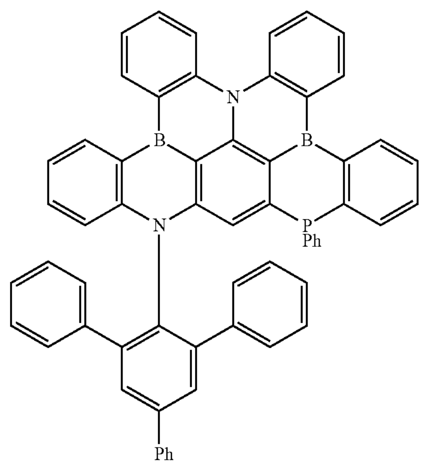

79

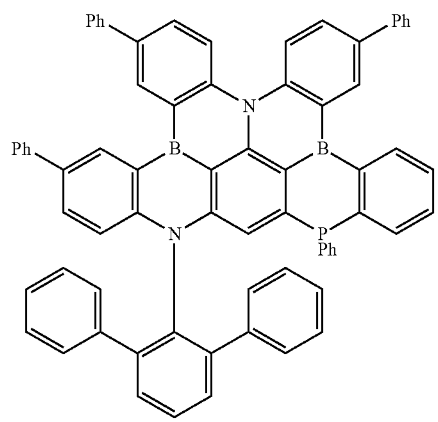

81

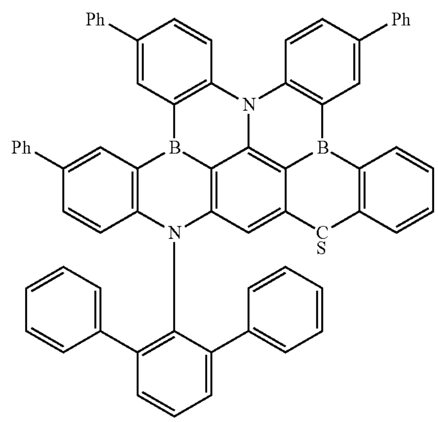

6. A polycyclic compound represented by Formula 1:

[Formula 1]

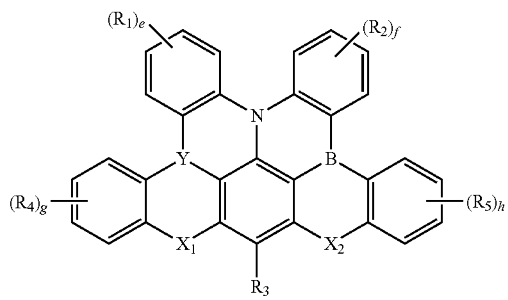

wherein in Formula 1,

Y is N, or P, $R_1$ to $R_5$ are each independently a hydrogen atom, a deuterium atom, a halogen atom, a nitro group, a cyano group, a substituted or unsubstituted amine group, a substituted or unsubstituted thio group, a substituted or unsubstituted silyl group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, e to h are each independently an integer from 0 to 4, $X_2$ is $(R_{11})$ or $N(R_{12})$, $R_{12}$ is a hydrogen atom, a deuterium atom, a halogen atom, a nitro group, a cyano group, a hydroxy group, a substituted or unsubstituted amine group, a substituted or unsubstituted thio group, or is bonded to an adjacent group to form a ring, $R_{11}$ is a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and $X_1$ is a group represented by Formula 3-2:

[Formula 3-2]

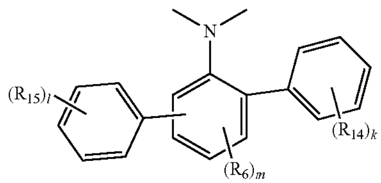

wherein in Formula 3-2, $R_6$ is a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, a phenyl group that includes $R_{15}$ is bonded at a meta-position or an ortho position to the nitrogen atom in Formula 3-2, $R_{14}$ and $R_{15}$ are each independently a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, k and l are each independently an integer from 0 to 5, m is an integer from 0 to 3, and —— * represents a binding site to a neighboring atom.

7. A display apparatus comprising:

an organic electroluminescence device comprising:

a first electrode;

a hole transport region disposed on the hole transport region;

an emission layer disposed on the hole transport region;

an electron transport region disposed on the emission layer; and a second electrode disposed on the electron transport region, wherein the emission layer includes a polycyclic compund represented by Formula 8:

[Formula 8]

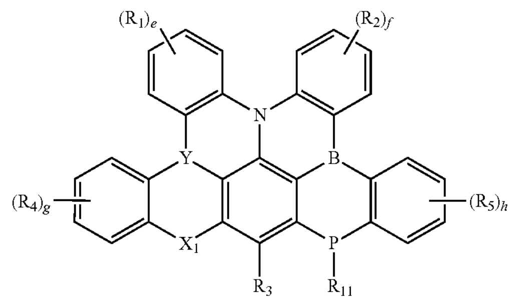

wherein in Formula 8, $R_1$ to $R_5$ are each independently a hydrogen atom, a deuterium atom, a halogen atom, a nitro group, a cyano group, a substituted or unsubstituted amine group, a substituted or unsubstituted thio group, a substituted or unsubstituted silyl group, a substituted or unsubstituted oxy group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, e to h are each independently an integer from 0 to 4, $R_{11}$ is a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $X_1$ is a group represented by Formula 3-2:

[Formula 3-2]

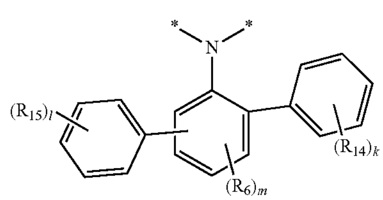

wherein in Formula 3-2, $R_6$ is a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, a phenyl group that includes $R_{15}$ is bonded at a meta-position or an ortho position to the nitrogen atom in Formula 3-2, $R_{14}$ and $R_{15}$ are each independently a hydrogen atom, a deuterium atom, a halogen atom, a nitro group, a cyano group, a hydroxy group, a substituted or unsubstituted amine group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, P1 k and l are each independently an integer from 0 to 5, m is an integer from 0 to 3, and $\sim\sim *$ represents a binding site to a neighboring atom.

* * * * *